United States Patent
Yada et al.

(10) Patent No.: US 10,381,450 B1
(45) Date of Patent: Aug. 13, 2019

(54) THREE-DIMENSIONAL MEMORY DEVICE WITH SELF-ALIGNED DRAIN SELECT LEVEL ISOLATION STRUCTURES AND METHOD OF MAKING THEREOF

(71) Applicant: SANDISK TECHNOLOGIES LLC, Plano, TX (US)

(72) Inventors: Shinsuke Yada, Yokkaichi (JP); Xiaolong Hu, Yokkaichi (JP); Junichi Ariyoshi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/906,109

(22) Filed: Feb. 27, 2018

(51) Int. Cl.
*H01L 29/423* (2006.01)
*H01L 27/11524* (2017.01)
(Continued)

(52) U.S. Cl.
CPC .. *H01L 29/42344* (2013.01); *H01L 21/28273* (2013.01); *H01L 21/28282* (2013.01); *H01L 27/1157* (2013.01); *H01L 27/11519* (2013.01); *H01L 27/11524* (2013.01); *H01L 27/11529* (2013.01); *H01L 27/11556* (2013.01);
(Continued)

(58) Field of Classification Search
CPC ......... H01L 29/42344; H01L 21/28282; H01L 29/42328; H01L 27/11565; H01L 27/11573; H01L 27/1157; H01L 21/28273; H01L 27/11519; H01L 27/11529; H01L 27/11556; H01L 27/11524; H01L 27/11582; H01L 27/11551–11556; H01L 27/11526–11548; H01L 2924/1451; H01L 27/115–11597; G11C 16/00–349
See application file for complete search history.

(56) References Cited

U.S. PATENT DOCUMENTS 5,915,167 A    6/1999 Leedy
7,701,058 B2 * 4/2010 Anderson ......... H01L 21/28052
                                                        257/754

(Continued)

OTHER PUBLICATIONS

U.S. Appl. No. 15/354,067, filed Nov. 17, 2016, Sandisk Technologies LLC.

(Continued)

*Primary Examiner* — Jarrett J Stark
(74) *Attorney, Agent, or Firm* — The Marbury Law Group PLLC

(57) ABSTRACT

A three-dimensional memory device includes an alternating stack of insulating layers and electrically conductive layers located over a substrate. An insulating fill material layer and drain select gate electrodes are located over the alternating stack. A group of memory stack structures extends through the alternating stack, and is arranged as rows of memory stack structures. Each memory stack structure is entirely encircled laterally by a respective one of the drain select gate electrodes. The insulating fill material layer includes a drain select level isolation structure extending between neighboring rows of memory stack structures and including a pair of sidewalls containing a respective laterally alternating sequence of planar vertical sidewall portions and concave vertical sidewall portions, and a drain select level field portion adjoined to the drain select level isolation portion.

9 Claims, 45 Drawing Sheets

(51) Int. Cl.
*H01L 27/11556* (2017.01)
*H01L 27/11529* (2017.01)
*H01L 27/11519* (2017.01)
*H01L 21/28* (2006.01)
*H01L 27/11582* (2017.01)
*H01L 27/11573* (2017.01)
*H01L 27/11565* (2017.01)
*H01L 27/1157* (2017.01)

(52) U.S. Cl.
CPC .. *H01L 27/11565* (2013.01); *H01L 27/11573* (2013.01); *H01L 27/11582* (2013.01); *H01L 29/42328* (2013.01)

(56) References Cited

U.S. PATENT DOCUMENTS

| | | | | |
|---|---|---|---|---|
| 2013/0248977 | A1* | 9/2013 | Mori | H01L 29/7926 257/326 |
| 2014/0003148 | A1* | 1/2014 | Sun | H01L 29/7889 365/185.17 |
| 2014/0264525 | A1* | 9/2014 | Takahashi | H01L 27/115 257/314 |
| 2015/0263024 | A1* | 9/2015 | Hishida | H01L 21/823437 257/329 |
| 2016/0118391 | A1 | 4/2016 | Zhao et al. | |
| 2018/0261613 | A1* | 9/2018 | Ariyoshi | H01L 23/5226 |
| 2019/0027489 | A1* | 1/2019 | Orimoto | H01L 23/5226 |
| 2019/0035803 | A1* | 1/2019 | Zhang | H01L 29/66833 |

OTHER PUBLICATIONS

U.S. Appl. No. 15/496,359, filed Apr. 25, 2017, Sandisk Technologies LLC.
U.S. Appl. No. 15/611,220, filed Jun. 1, 2017, Sandisk Technologies LLC.
U.S. Appl. No. 15/628,495, filed Jun. 20, 2017, Sandisk Technologies LLC.
U.S. Appl. No. 15/685,254, filed Aug. 24, 2017, Sandisk Technologies LLC.
U.S. Appl. No. 15/704,286, filed Sep. 14, 2017, Sandisk Technologies LLC.
U.S. Appl. No. 15/818,061, filed Nov. 20, 2017, Sandisk Technologies LLC.
U.S. Appl. No. 15/818,146, filed Nov. 20, 2017, Sandisk Technologies LLC.
U.S. Appl. No. 15/850,073, filed Dec. 21, 2017, Sandisk Technologies LLC.
U.S. Appl. No. 15/865,892, filed Jan. 9, 2018, Sandisk Technologies LLC.
U.S. Appl. No. 15/888,714, filed Feb. 5, 2018, Sandisk Technologies LLC.
Endoh et al., "Novel Ultra High Density Memory with a Stacked-Surrounding Gate Transistor (S-SGT) Structured Cell," IEDM Proc., (2001), 33-36.

* cited by examiner

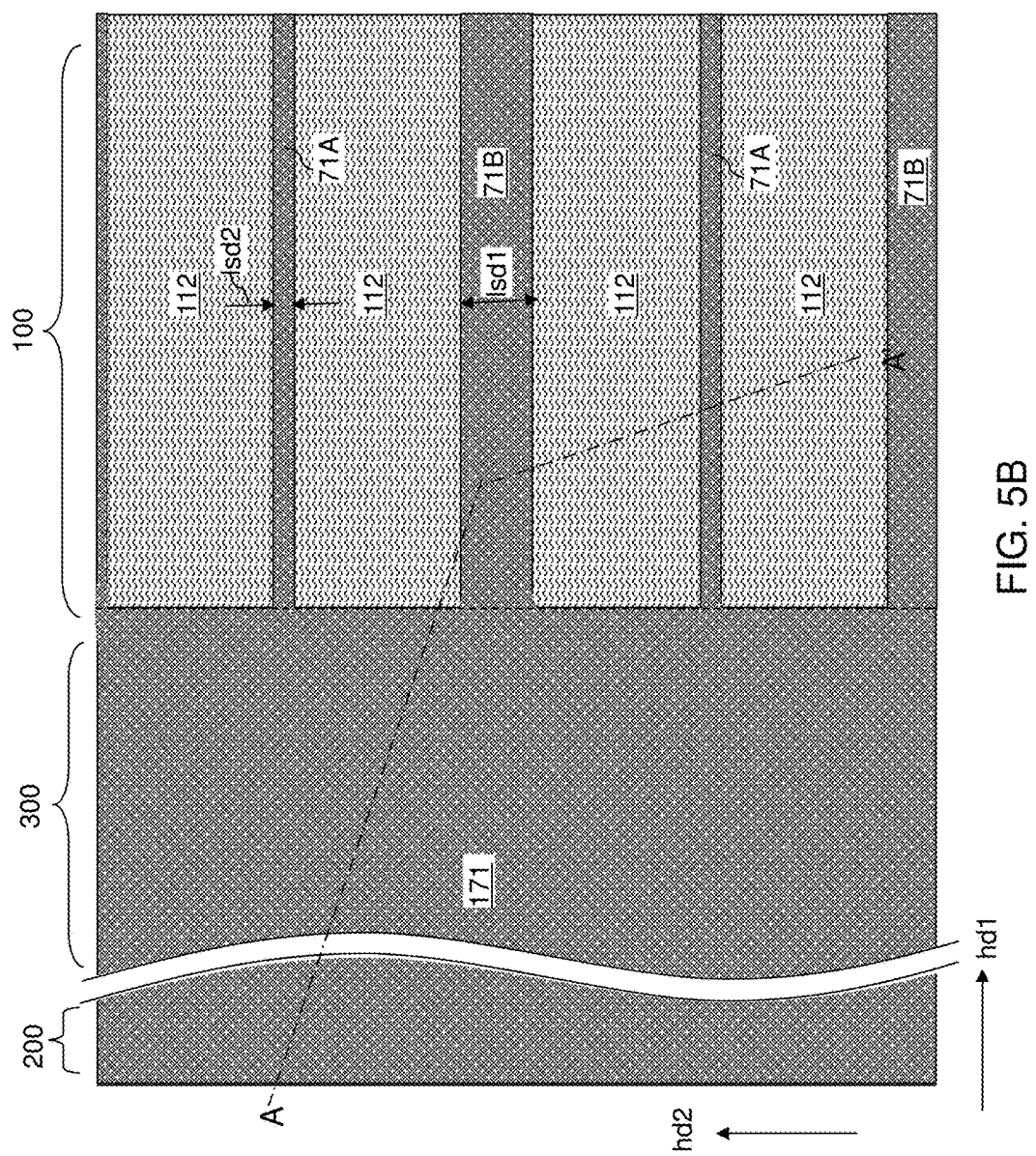

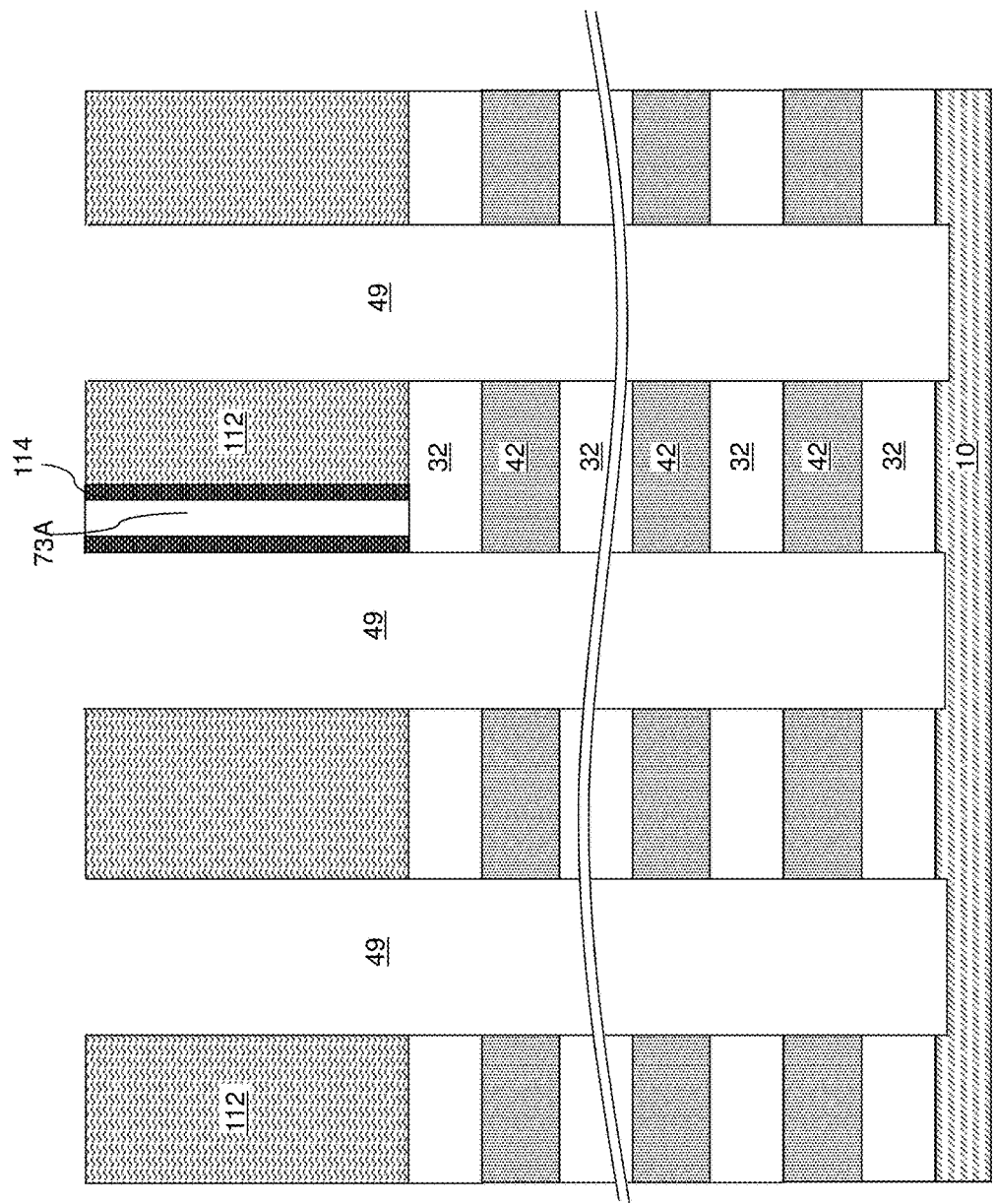

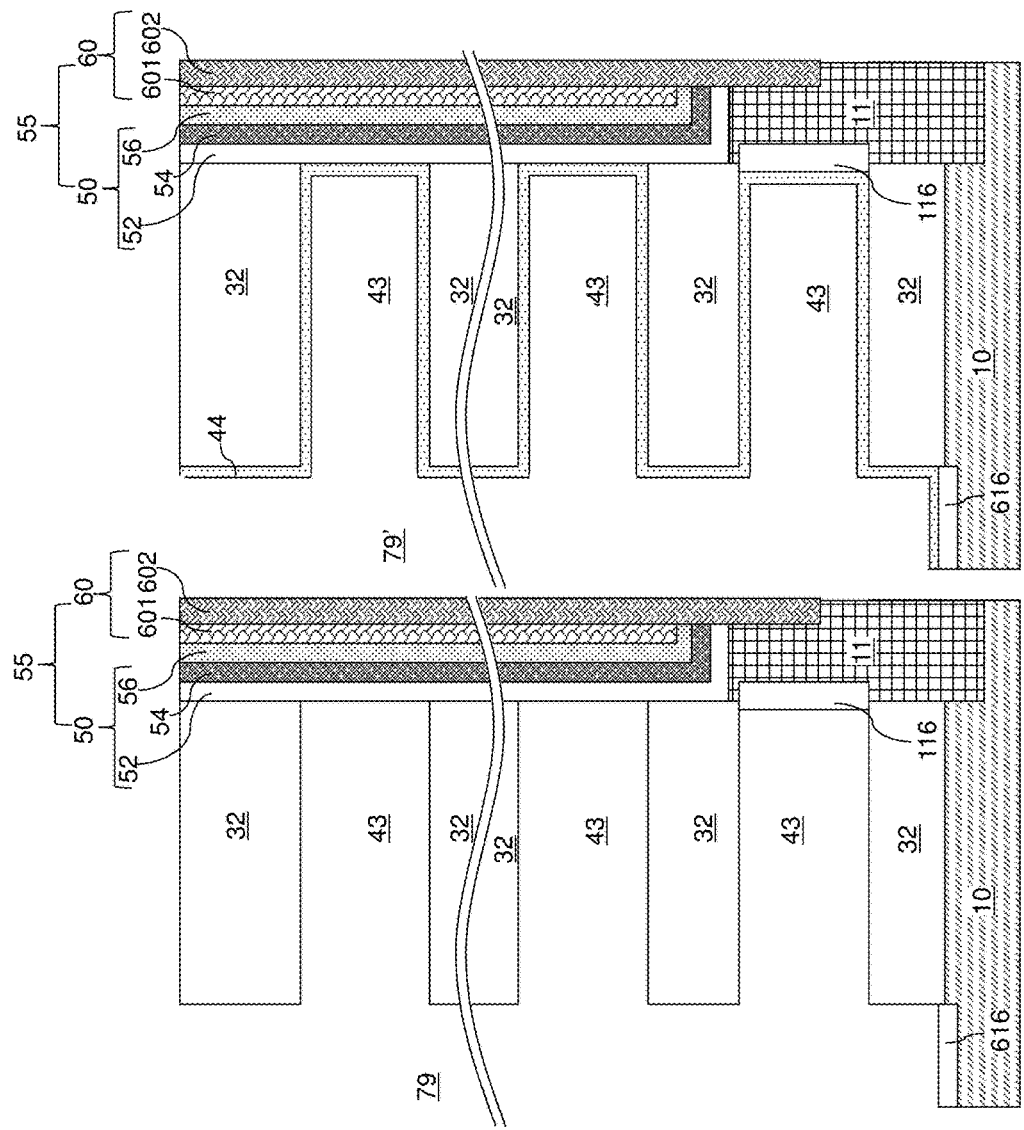

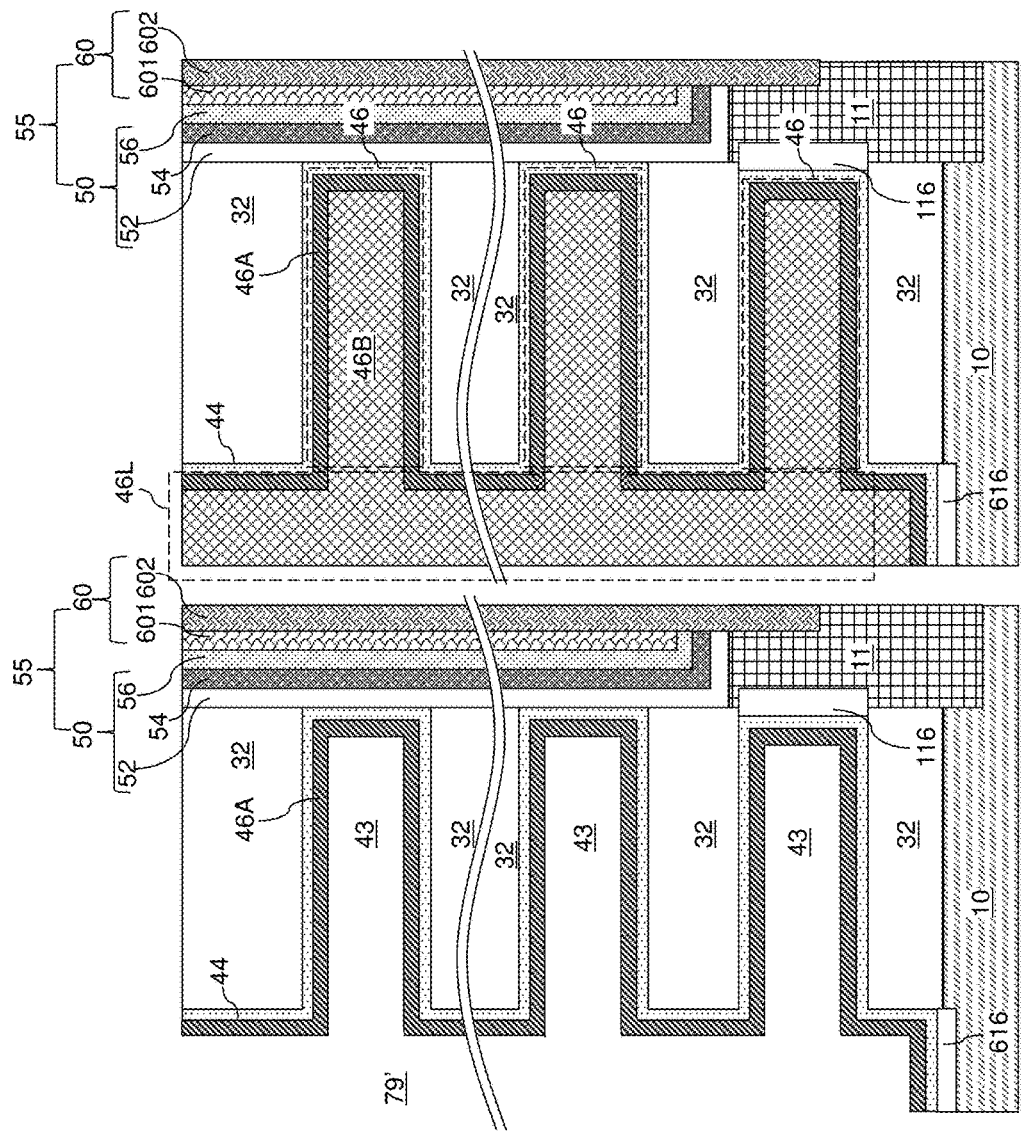

THREE-DIMENSIONAL MEMORY DEVICE WITH SELF-ALIGNED DRAIN SELECT LEVEL ISOLATION STRUCTURES AND METHOD OF MAKING THEREOF

FIELD

The present disclosure relates generally to the field of semiconductor devices, and particular to a three-dimensional memory device including self-aligned drain select level isolation structures and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; an insulating fill material layer and drain select gate electrodes located over the alternating stack; and a group of memory stack structures extending through the alternating stack and arranged as rows of memory stack structures, wherein each of the memory stack structures comprises a memory film and a vertical semiconductor channel contacting an inner sidewall of the memory film. Each drain select gate electrode is laterally surrounded by the insulating fill material layer. The insulating fill material layer comprises: a drain select level isolation structure located between neighboring rows of memory stack structures within the group of memory stack structures, generally extending along a first horizontal direction, and including a pair of sidewalls containing a respective laterally alternating sequence of planar vertical sidewall portions and concave vertical sidewall portions that contact convex vertical sidewalls of the memory stack structures; and a drain select level field dielectric portion adjoined to the drain select level isolation portion and contacting sidewalls of the drain select gate electrodes that generally extend along a second horizontal direction that is perpendicular to the first horizontal direction.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming semiconductor matrices and a sacrificial fill material layer over the alternating stack; forming sacrificial memory opening fill structures through the semiconductor matrices, the sacrificial fill material layer, and the alternating stack, wherein the sacrificial memory opening fill structures are arranged as rows that extend along a first horizontal direction and a strip of the sacrificial fill material layer laterally extends between a neighboring pair of rows of the sacrificial memory opening fill structures; removing the sacrificial fill material layer selective to the insulating layers, the sacrificial memory opening fill structures, and the semiconductor matrices; forming doped semiconductor liners on sidewalls of the semiconductor matrices and the sacrificial memory opening fill structures, wherein a laterally meandering cavity is present within a portion of a volume from which the strip of the sacrificial fill material layer is removed; forming an insulating fill material layer around the semiconductor matrices and the doped semiconductor liners and within the laterally meandering cavity; and replacing the sacrificial memory opening fill structures with memory opening fill structures comprising memory stack structures, wherein each of the memory stack structures comprises a memory film and a vertical semiconductor channel contacting an inner sidewall of the memory film.

BRIEF DESCRIPTION OF THE DRAWINGS

FIG. 5B is a top-down view of the first exemplary structure of FIG. 5A. The vertical plane A-A' is the plane of the cross-section for FIG. 5A.

FIGS. 13A-13I are sequential schematic vertical cross-sectional views of a memory opening within the first exemplary structure during formation of a memory stack structure, an optional dielectric core, a drain region, and a dielectric pillar structure therein according to an embodiment of the present disclosure.

FIGS. 21A-21D are sequential vertical cross-sectional views of a region of the first exemplary structure during formation of electrically conductive layers according to an embodiment of the present disclosure.

DETAILED DESCRIPTION

Figure 1:
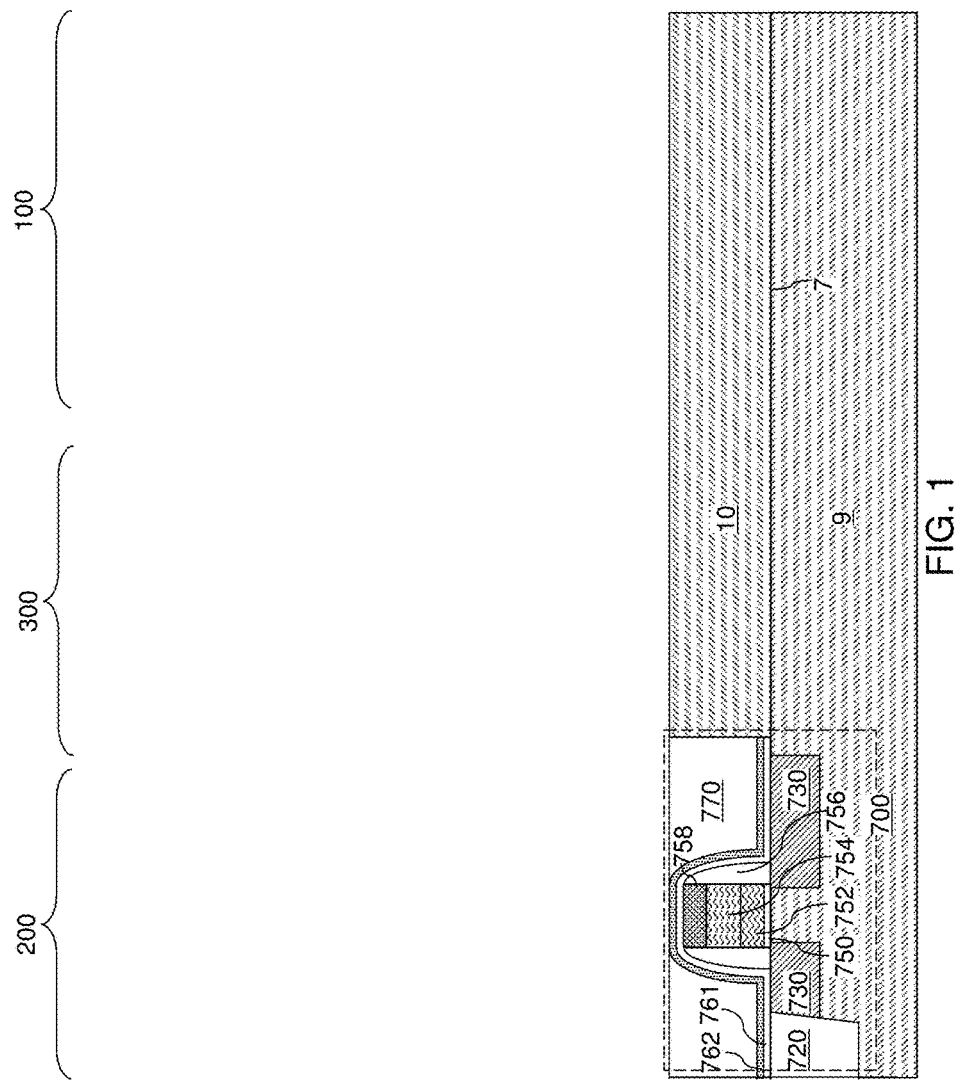
FIG. 1 is a schematic vertical cross-sectional view of a first exemplary structure after formation of at least one peripheral device, a semiconductor material layer, and a gate dielectric layer according to an embodiment of the present disclosure.

As discussed above, the present disclosure is directed to a three-dimensional memory device including self-aligned drain select level isolation structures and methods of manufacturing the same, the various aspects of which are described below. The self-aligned drain select level isolation structures provide a more compact device layout and reduce chip size, as well as provide a simpler self aligned fabrication process. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first", "second", and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
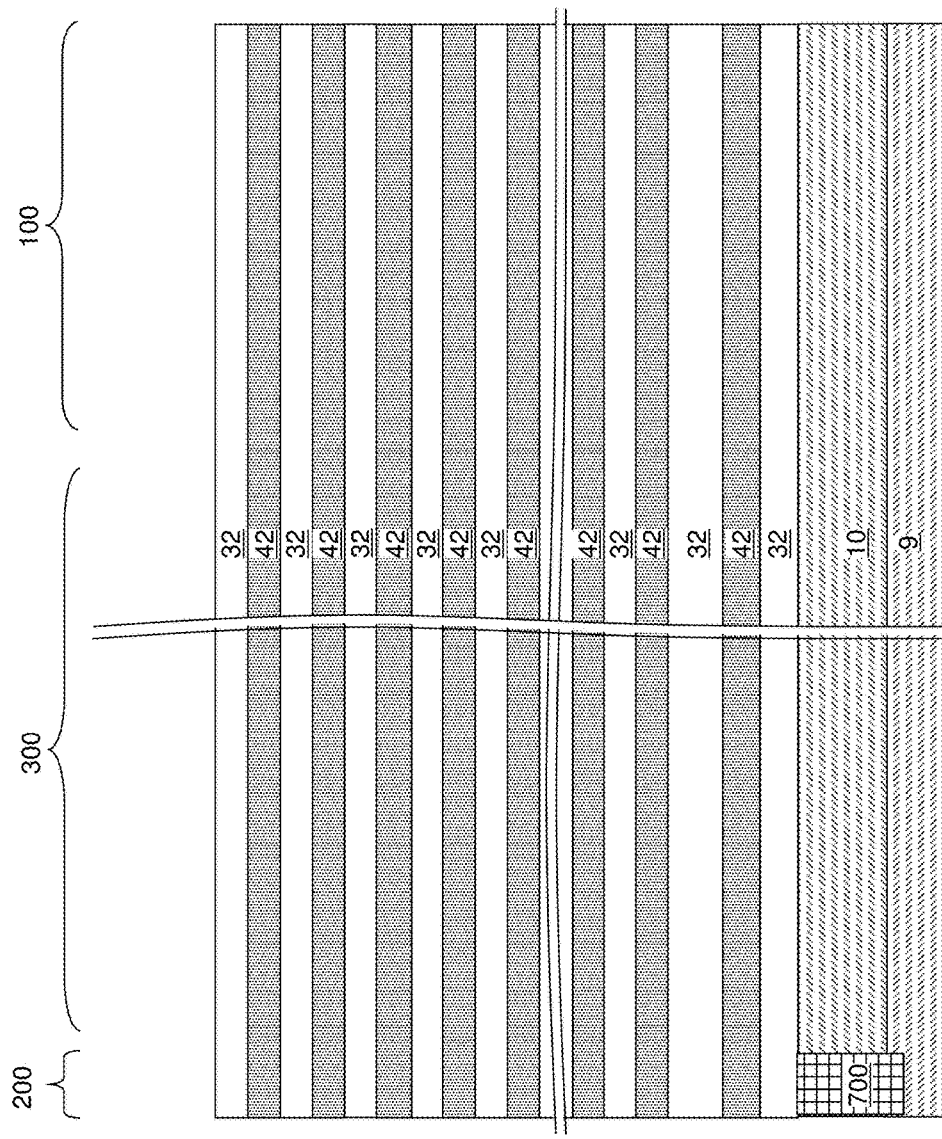
FIG. 2 is a schematic vertical cross-sectional view of the first exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Figure 3:
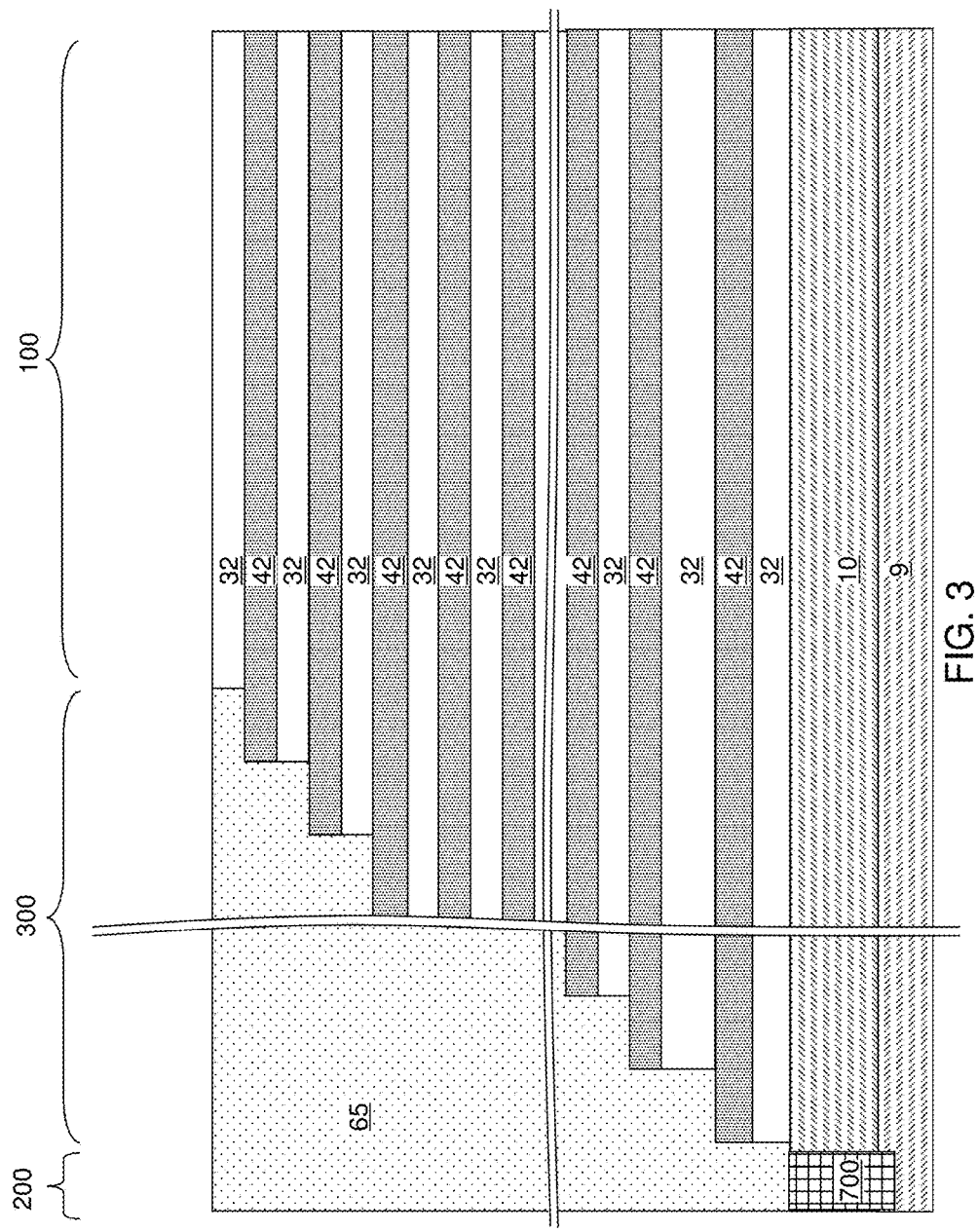
FIG. 3 is a schematic vertical cross-sectional view of the first exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Stepped surfaces are formed at a peripheral portion of the alternating stack (32, 42) through formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the topmost surface of the alternating stack (32, 42), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4:
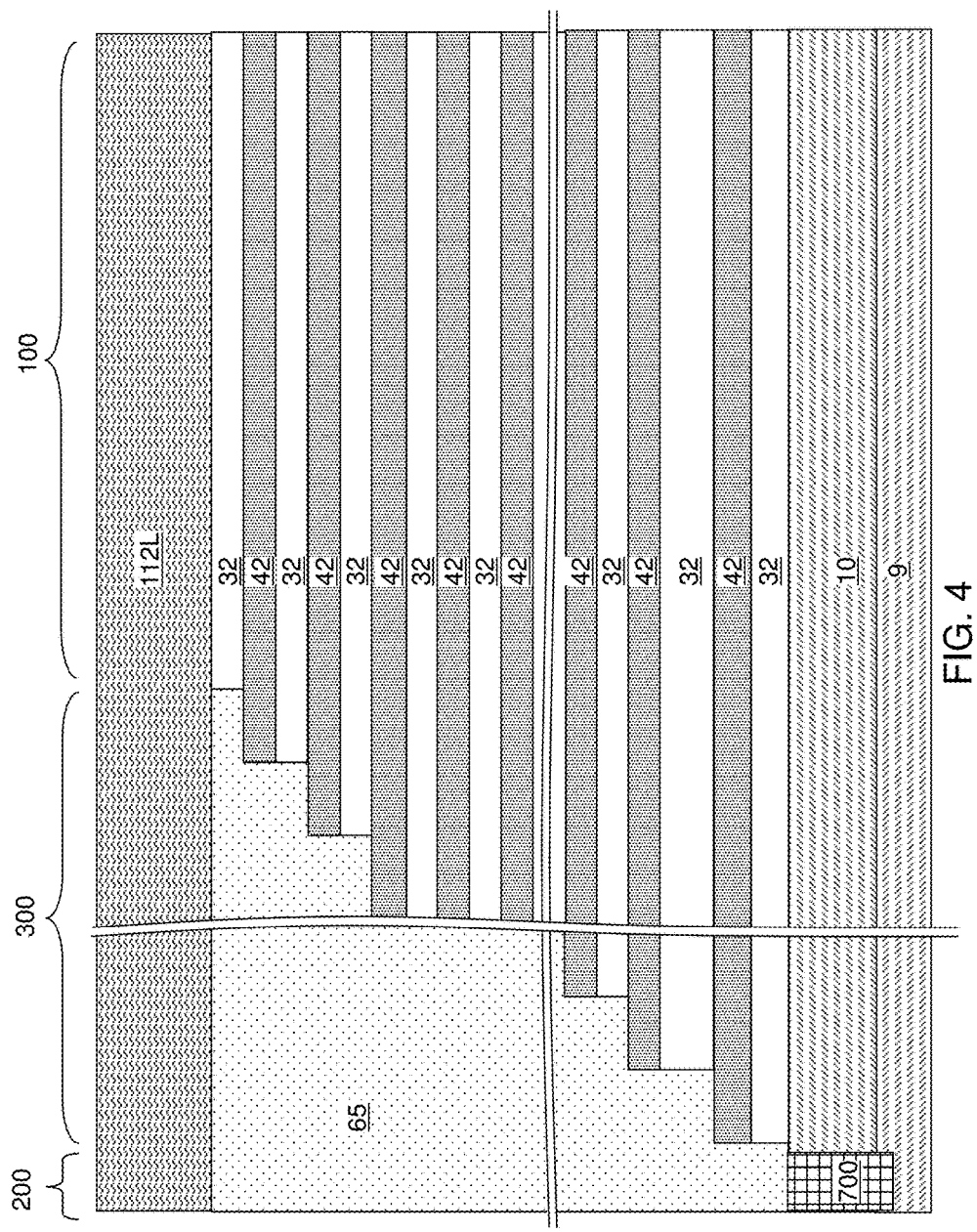
FIG. 4 is a schematic vertical cross-sectional view of the first exemplary structure after formation of a blanket semiconductor material layer according to an embodiment of the present disclosure.

Referring to FIG. 4, a blanket semiconductor material layer 112L including a doped semiconductor material can be formed over the alternating stack (32, 42) and the retro-stepped dielectric material portion 65. The blanket semiconductor material layer 112L can be an unpatterned material layer that covers the entire area of the alternating stack (32, 42) and the retro-stepped dielectric material portion. In one embodiment, the blanket semiconductor material layer 112L can include boron-doped amorphous silicon or boron-doped polysilicon. The thickness of the blanket semiconductor material layer 112L can be in a range from 60 nm to 300 nm, although lesser and greater thicknesses can also be employed.

Figure 5A:
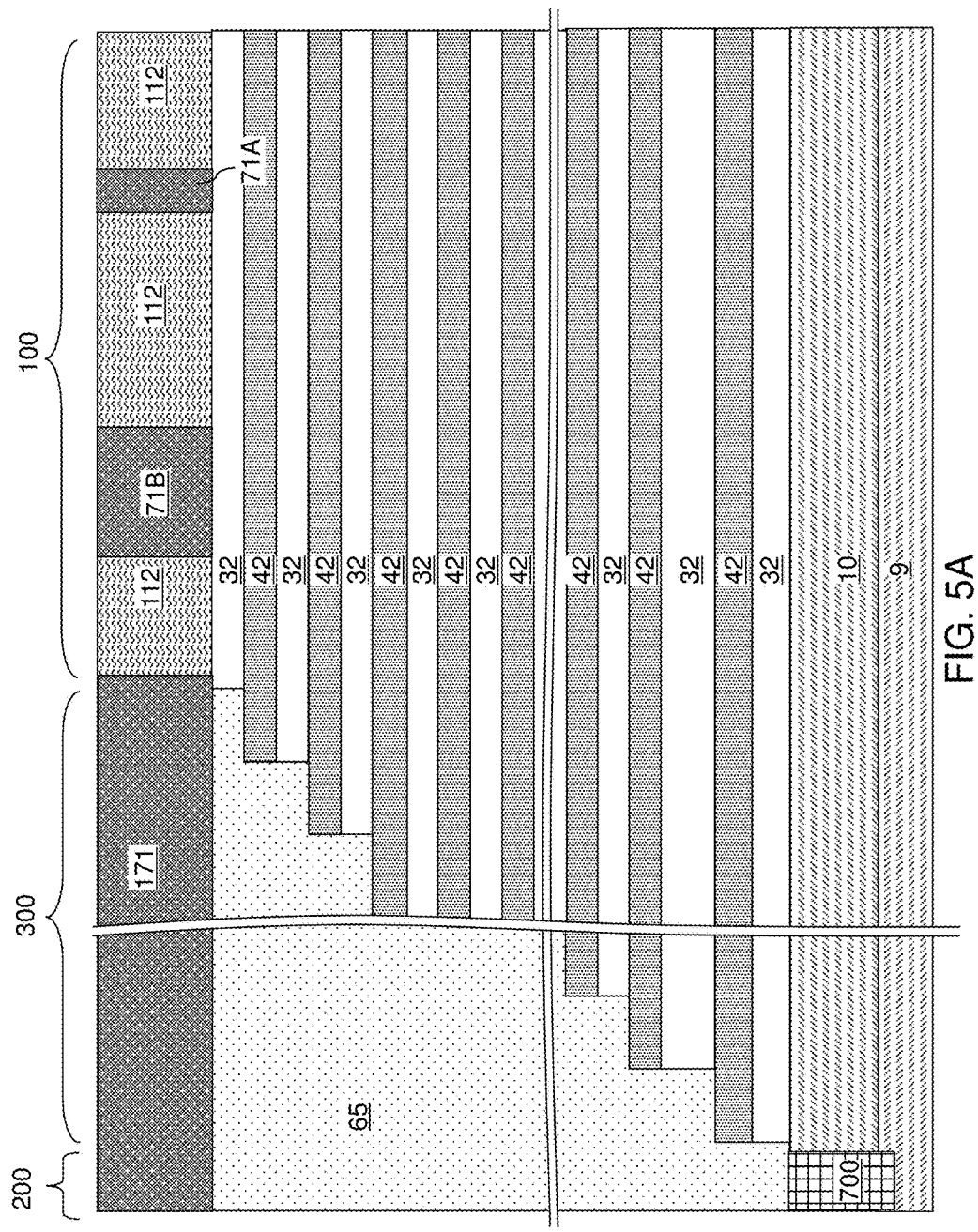
FIG. 5A is a schematic vertical cross-sectional view of the first exemplary structure after patterning the blanket semiconductor material layer into semiconductor matrices and formation of a sacrificial fill material layer according to an embodiment of the present disclosure.

Referring to FIGS. 5A and 5B, the blanket semiconductor material layer 112L can be patterned into semiconductor matrices 112. For example, a photoresist layer (not shown) can be applied and patterned over the top surface of the blanket semiconductor material layer 112L to cover discrete areas in the memory array region 100. In one embodiment, each of the discrete covered areas can have lengthwise edges that extend along a first horizontal direction hd1. In one embodiment, the covered areas can have rectangular shapes such that each rectangular shape has a pair of lengthwise edges that are parallel to the first horizontal direction hd1 (e.g., word line direction) and a pair of widthwise edges that are parallel to a second horizontal direction hd2 (e.g., bit line direction) that is perpendicular to the first horizontal direction hd1. In one embodiment, multiple set of neighboring rectangular areas can be laterally spaced among one another by a first lateral separation distance lsd1 along the second horizontal direction hd2, and each rectangular area within a set of at least two rectangular areas can be laterally spaced among one another by a second lateral separation distance lsd2 along the second horizontal direction hd2 that is less than the first lateral separation distance lsd1.

An anisotropic etch can be performed to etch uncovered portions of the blanket semiconductor material layer 112L. Each remaining portion of the blanket semiconductor material layer 112L constitutes a semiconductor matrix 112 that duplicates the shape of an overlying patterned photoresist material portion. In one embodiment, the semiconductor matrices 112 can have rectangular shapes in a plan view, i.e., a view from above along a downward vertical direction. The photoresist layer can be subsequently removed, for example, by ashing. In one embodiment, the semiconductor matrices 112 can include a doped semiconductor material (such as doped amorphous silicon or doped polysilicon), and thus, can be doped semiconductor matrices.

A sacrificial fill material can be deposited in the volumes from which the material of the blanket semiconductor material layer 112L is removed. The sacrificial fill material is different from the materials of the insulating layers 32 and the retro-stepped dielectric material portion. In one embodiment, the sacrificial fill material can include silicon nitride, a dielectric metal oxide material, amorphous carbon, diamond-like carbon (DLC), or an inorganic polymer such as a silicon-based polymer. In one embodiment, the sacrificial fill material can include silicon nitride. Excess portions of the sacrificial fill material can be removed from above the horizontal plane including top surfaces of the semiconductor matrices 112 by a planarization process such as chemical mechanical planarization (CMP). Remaining portions of the sacrificial fill material can be continuously connected among one another to form a sacrificial fill material layer (71A, 71B, 17I).

The sacrificial fill material layer (71A, 71B, 17I) can include narrower sacrificial material strip portions 71A located between a neighboring pair of semiconductor matrices 112 separated by the second lateral separation distance lsd2, wider sacrificial material strip portions 71B located between a neighboring pair of semiconductor matrices 112 separated by the first lateral separation distance lsd1, and a field sacrificial material portion 171 continuously extending in the contact region 300 and the peripheral device region 200. The locations of the narrower sacrificial material strip portions 71A correspond to the locations of drain select level isolations structures to be formed in subsequent steps, while the locations of the wider sacrificial material strip portions 71B correspond to the locations of the backside trenches to be formed in subsequent steps, which separate adjacent memory strings and can contain source contain via structures.

Figure 6A:
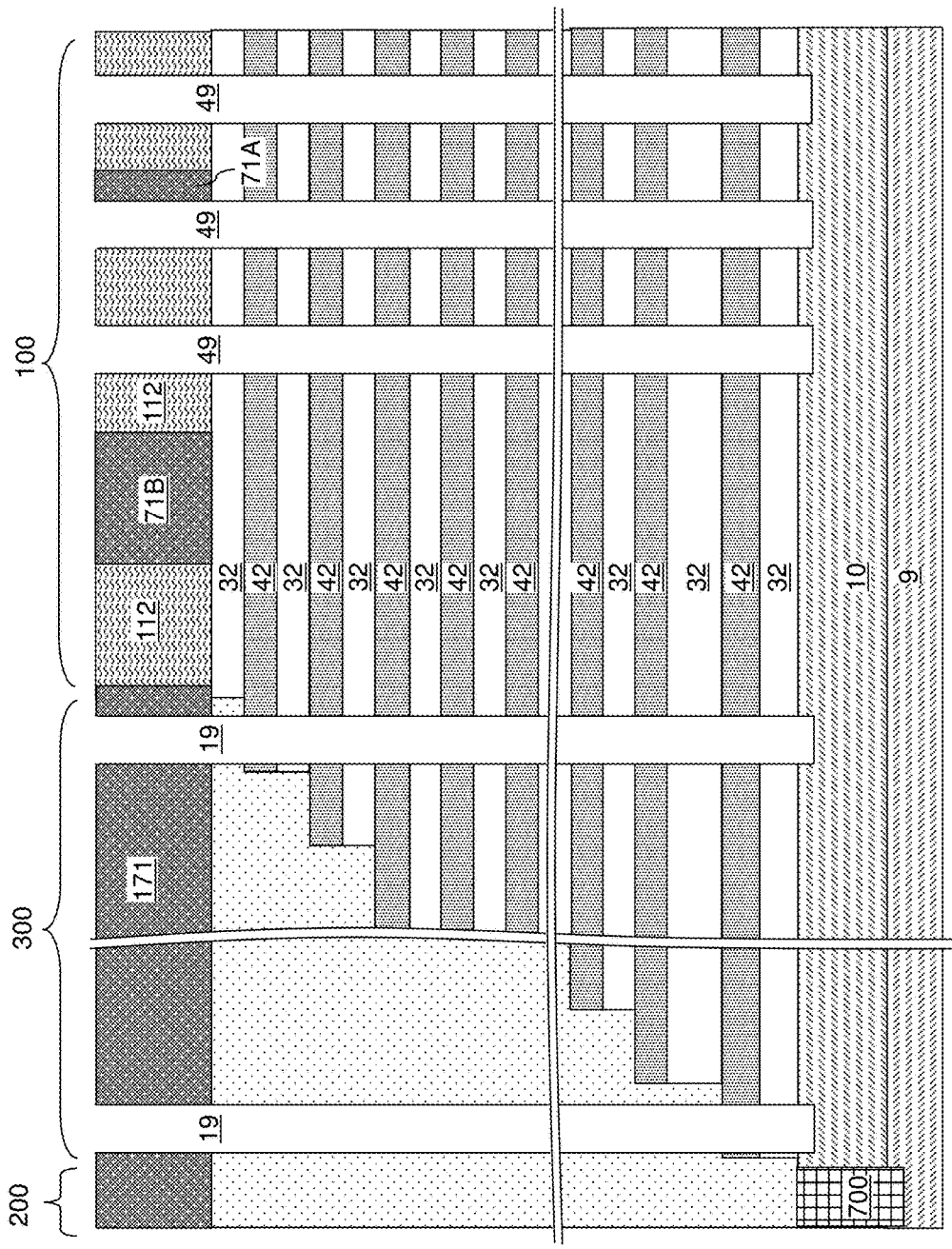
FIG. 6A is a schematic vertical cross-sectional view of the first exemplary structure after formation of memory openings and support openings according to an embodiment of the present disclosure.
Figure 6B:
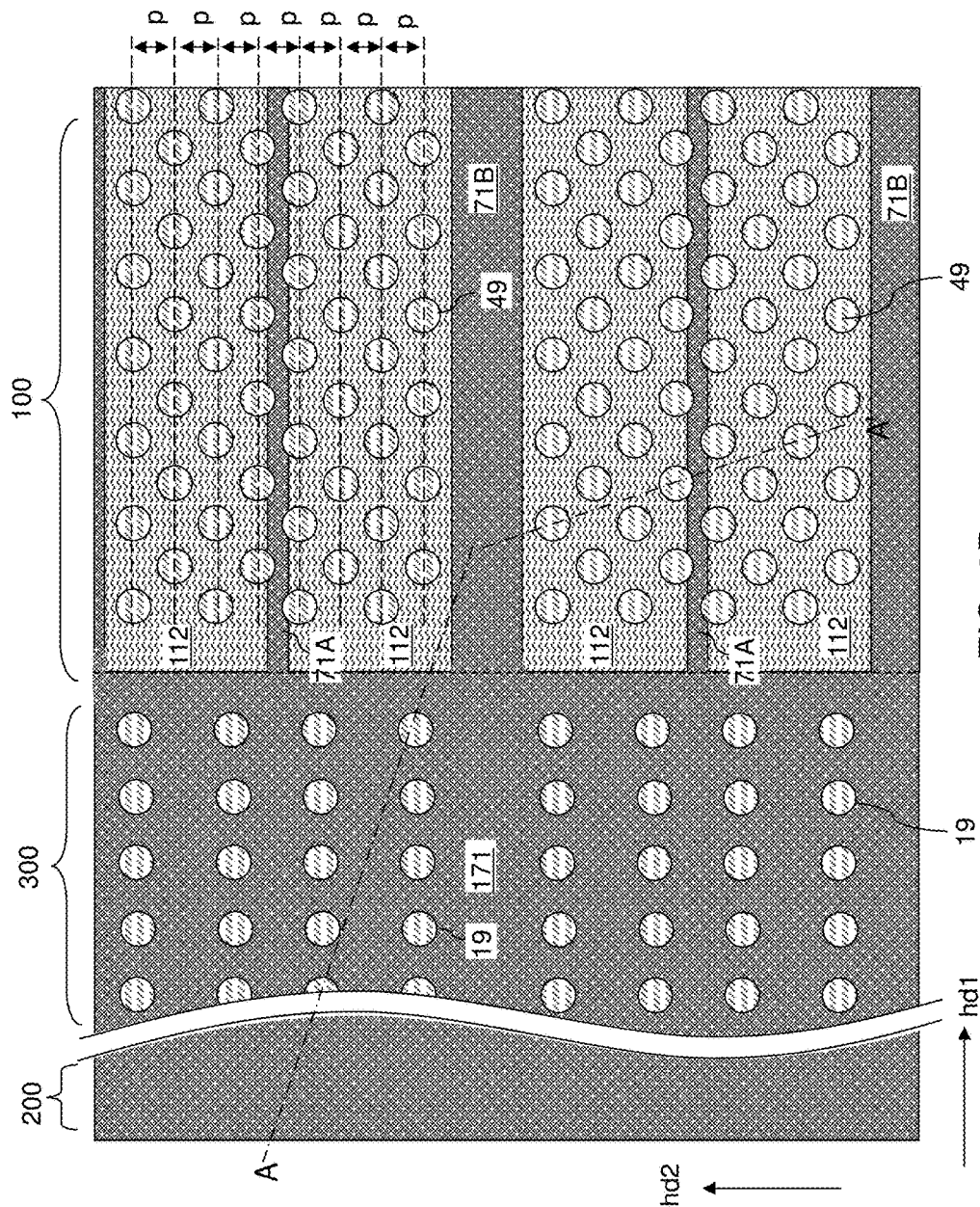
FIG. 6B is a top-down view of the first exemplary structure of FIG. 6A. The vertical plane A-A' is the plane of the cross-section for FIG. 6A.

Referring to FIGS. 6A and 6B, a lithographic material stack (not shown) including at least a photoresist layer can be formed over the combination of the sacrificial fill material layer (71A, 71B, 17I) and the semiconductor matrices 112, and can be lithographically patterned to form openings therein. The openings include a first set of openings formed over the memory array region 100 and a second set of openings formed over the contact region 300. The pattern in the lithographic material stack can be transferred through the combination of the sacrificial fill material layer (71A, 71B, 17I) and the semiconductor matrices 112, the alternating stack (32, 42), and the retro-stepped dielectric material portion 65 by at least one anisotropic etch that employs the patterned lithographic material stack as an etch mask.

Portions of the combination of the sacrificial fill material layer (71A, 71B, 17I) and the semiconductor matrices 112 and the alternating stack (32, 42) underlying the openings in the patterned lithographic material stack within the memory array region 100 are etched to form memory openings 49. Portions of the field sacrificial material portion 171, the alternating stack (32, 42), and the retro-stepped dielectric material portion 65 underlying the openings in the patterned lithographic material stack within the contact region 300 are etched to form support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the combination of the narrower sacrificial material strip portions 71A of the sacrificial fill material layer (71A, 71B, 17I) and the semiconductor matrices 112 and through each layer in the alternating stack (32, 42) in the memory array region 100. The support openings 19 are formed through the field sacrificial material portion 171, the retro-stepped dielectric material portion 65, and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surfaces of the combination of the sacrificial fill material layers (71A, 71B, 17I) and the semiconductor matrices 112 to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

The memory openings 49 can be arranged as rows that extend along the first horizontal direction hd1. Each lengthwise sidewalls of a narrower sacrificial material strip portion 71A can be etched through by a respective row of memory openings 49. Thus, two rows of memory openings 49 can extend through two straight lengthwise sidewalls of each narrower sacrificial material strip portion 71A. After formation of the memory openings 49, each narrower sacrificial material strip portion 71A can have a laterally alternating sequence of concave vertical sidewall portions and planar vertical sidewall portions that laterally alternate along the first horizontal direction hd1. The narrower sacrificial material strip portion 71A is a strip of the sacrificial fill material layer (71A, 71B, 17I) having a pair of laterally undulating sidewalls laterally extends between each neighboring pair of semiconductor matrices 112.

The memory openings 49 can be arranged in groups such that each group includes a plurality of rows of memory openings 49. Within each group, the memory openings 49 can be arranged in multiple rows that are spaced apart along the second horizontal direction hd2 that is perpendicular to the first horizontal direction hd1 with a uniform inter-row pitch p for an entirety of the group of memory openings 49. Each neighboring group of memory openings 49 can be laterally spaced part along the second horizontal direction by a respective wider sacrificial material strip portion 71B.

Figure 7:
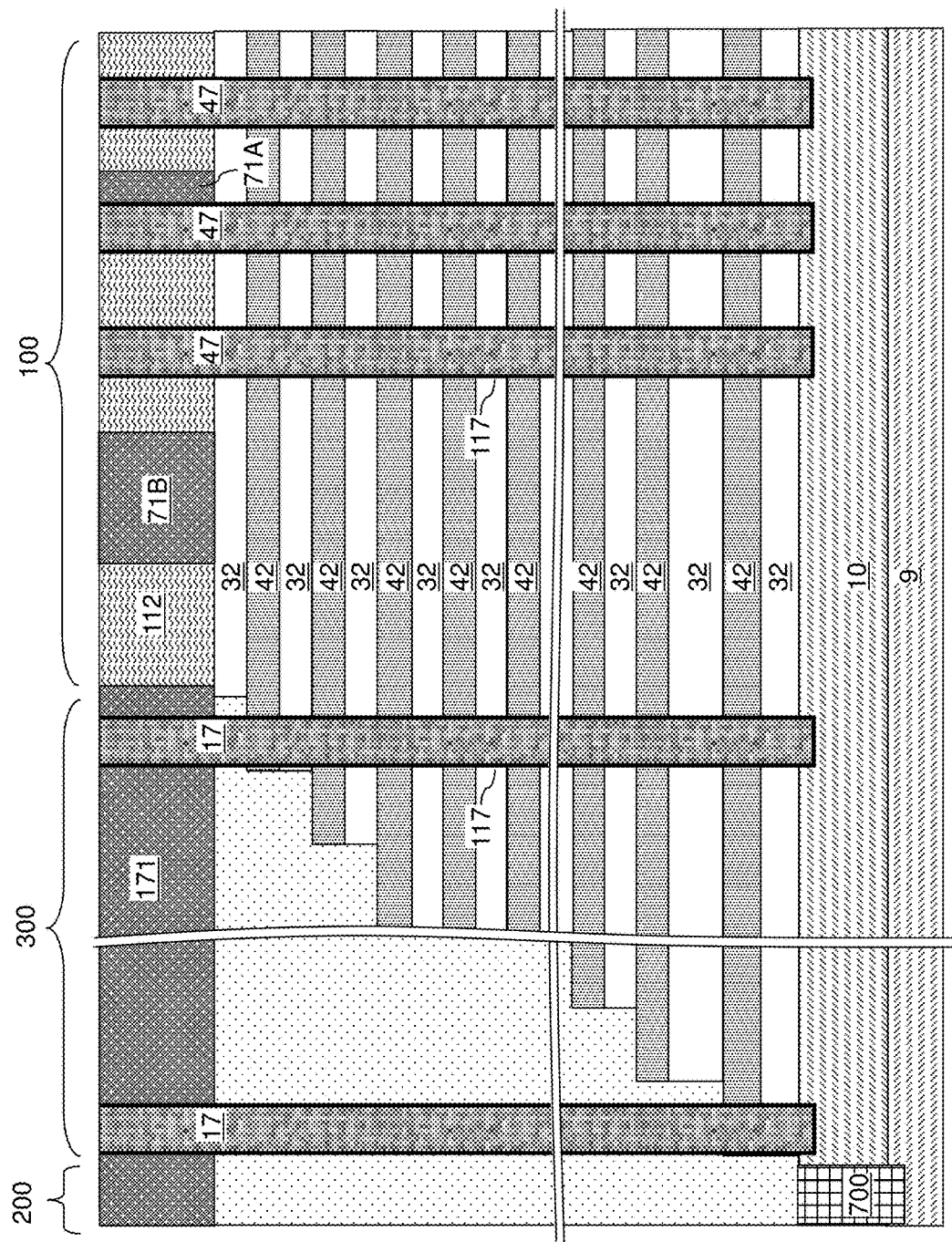
FIG. 7 is a schematic vertical cross-sectional view of the first exemplary structure after formation of sacrificial memory opening fill structures and sacrificial support opening fill structures according to an embodiment of the present disclosure.

Referring to FIG. 7, a sacrificial liner 117 can be optionally deposited on surfaces of the memory openings 49 and the support openings 19. The sacrificial liner 117, if present, includes a thin sacrificial material such as silicon oxide. For example, the sacrificial silicon liner 117 can be a silicon oxide layer having a thickness in a range from 1 nm to 5 nm. A sacrificial fill material can be deposited in remaining volumes of the memory openings 49 and the support openings 19. The sacrificial fill material is different in composition from the materials of the sacrificial fill material layer (71A, 71B, 17I) and the semiconductor matrices 112. For example, the sacrificial fill material can be a semiconductor material such as amorphous or polycrystalline silicon having a different doping than the semiconductor matrices 112 or a silicon-germanium alloy. In one embodiment, the sacrificial fill material can include undoped amorphous or polycrystalline silicon. In this case, the total dopant concentration (including any p-type dopants and n-type dopants) in the sacrificial fill material can be less than $1.0 \times 10^{16}/cm^3$, and may be less than $1.0 \times 10^{15}/cm^3$ and/or $1.0 \times 10^{14}/cm^3$.

Excess portions of the sacrificial fill material can be removed from above the horizontal plane including the top surfaces of the sacrificial fill material layer (71A, 71B, 17I) and the semiconductor matrices 112 by a planarization process, which can include a recess etch and/or chemical mechanical planarization. Each remaining portion of the sacrificial fill material within a memory opening 49 constitutes a sacrificial memory opening fill material portion 47. Each remaining portion of the sacrificial fill material within a support opening 19 constitutes a sacrificial support opening fill material portion 17. A sacrificial memory opening fill material potion 47 and an optional sacrificial liner 117 within a memory opening 49 constitutes a sacrificial memory opening fill structure (47, 117). A sacrificial support opening fill material potion 17 and an optional sacrificial liner 117 within a support opening 19 constitutes a sacrificial support opening fill structure (17, 117).

The sacrificial memory opening fill structures (47, 117) are formed through the semiconductor matrices 112, the narrower sacrificial material strip portions 71A of the sacrificial fill material layer (71A, 71B, 17I), and the alternating stack (32, 42). The sacrificial memory opening fill structures (47, 117) are arranged as rows that extend along the first horizontal direction hd1. A strip of the sacrificial fill material layer (71A, 71B, 17I) which comprises the narrower sacrificial material strip portion 71A contacts, and laterally extends between, a neighboring pair of rows of the sacrificial memory opening fill structures (47, 117).

The sacrificial memory opening fill material potions 47 can include a sacrificial semiconductor material that is different in composition from materials of the semiconductor matrices 112 (which can be doped semiconductor matrices including a doped semiconductor material such as boron-doped polysilicon or boron-doped amorphous silicon), and may include an undoped semiconductor material such as undoped amorphous silicon or undoped polysilicon. The sacrificial memory opening fill structures (47, 117) can be arranged in groups that are spaced apart by wider sacrificial material strip portions 71B. Within each group of sacrificial memory opening fill structures (47, 117), the sacrificial memory opening fill structures (47, 117) can be arranged in multiple rows that are spaced apart along the second horizontal direction hd2 with a uniform inter-row pitch p for an entirety of the group of sacrificial memory opening fill structures (47, 117).

Figure 8:
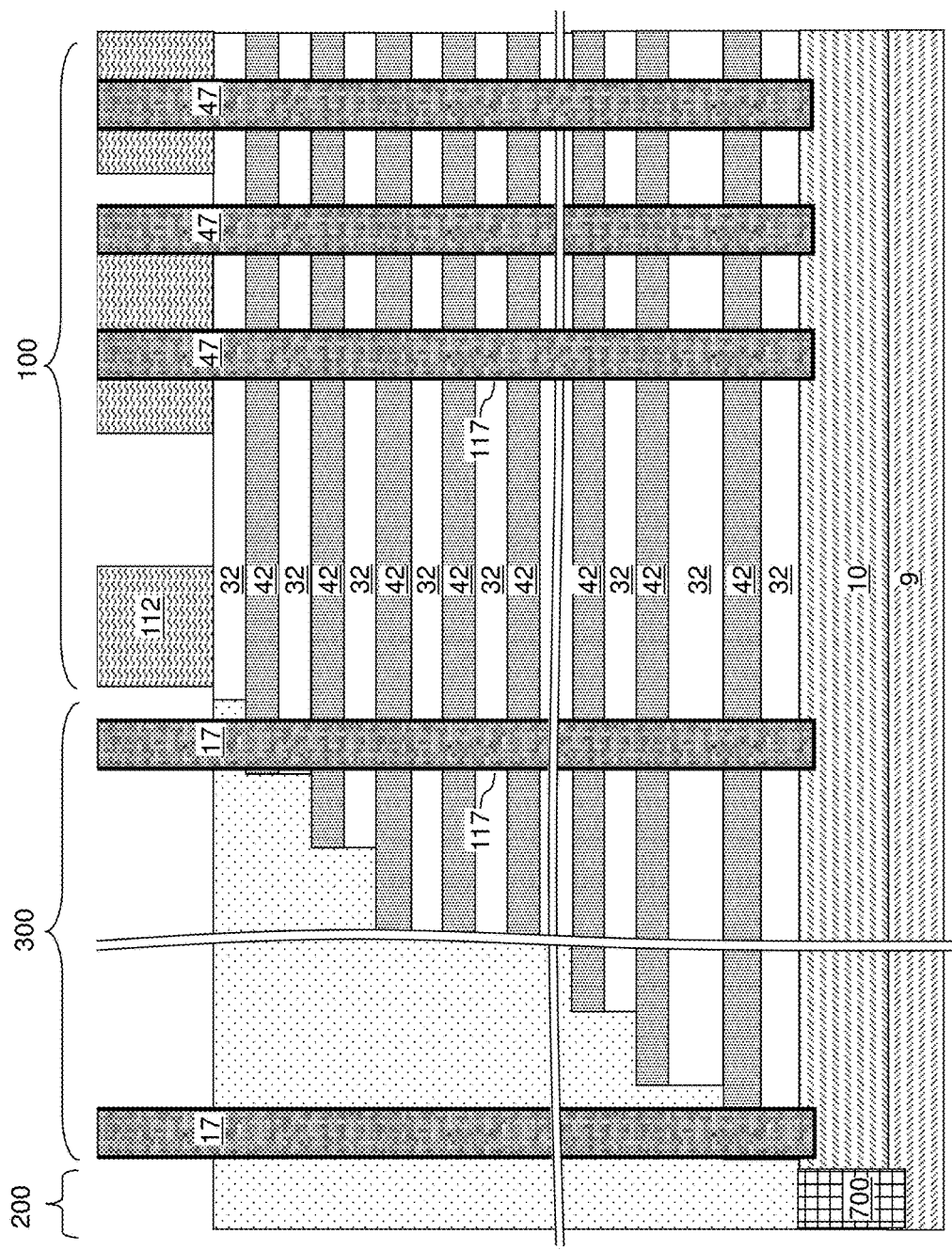
FIG. 8 is a schematic vertical cross-sectional view of the first exemplary structure after removal of the sacrificial fill material layer selective to the semiconductor matrices, sacrificial memory opening fill structures, and sacrificial support opening fill structures according to an embodiment of the present disclosure.

Referring to FIG. 8, the sacrificial fill material layer (71A, 71B, 17I) can be removed selective to the semiconductor matrices 112, the sacrificial memory opening fill structures (47, 117), the sacrificial support opening fill structures (17, 117), the insulating layers 32, and the retro-stepped dielectric material portion 65. In one embodiment, the sacrificial fill material layer (71A, 71B, 17I) can consist essentially of silicon nitride, the insulating layers 32 and the retro-stepped dielectric material portion 65 can include silicon oxide materials, the semiconductor matrices 112 can include boron-doped silicon, the sacrificial memory opening fill material potions 47 and the sacrificial support opening fill material portions 17 can include undoped silicon, and the sacrificial fill material layer (71A, 71B, 17I) can be removed by a wet etch process employing hot phosphoric acid.

Figure 9:
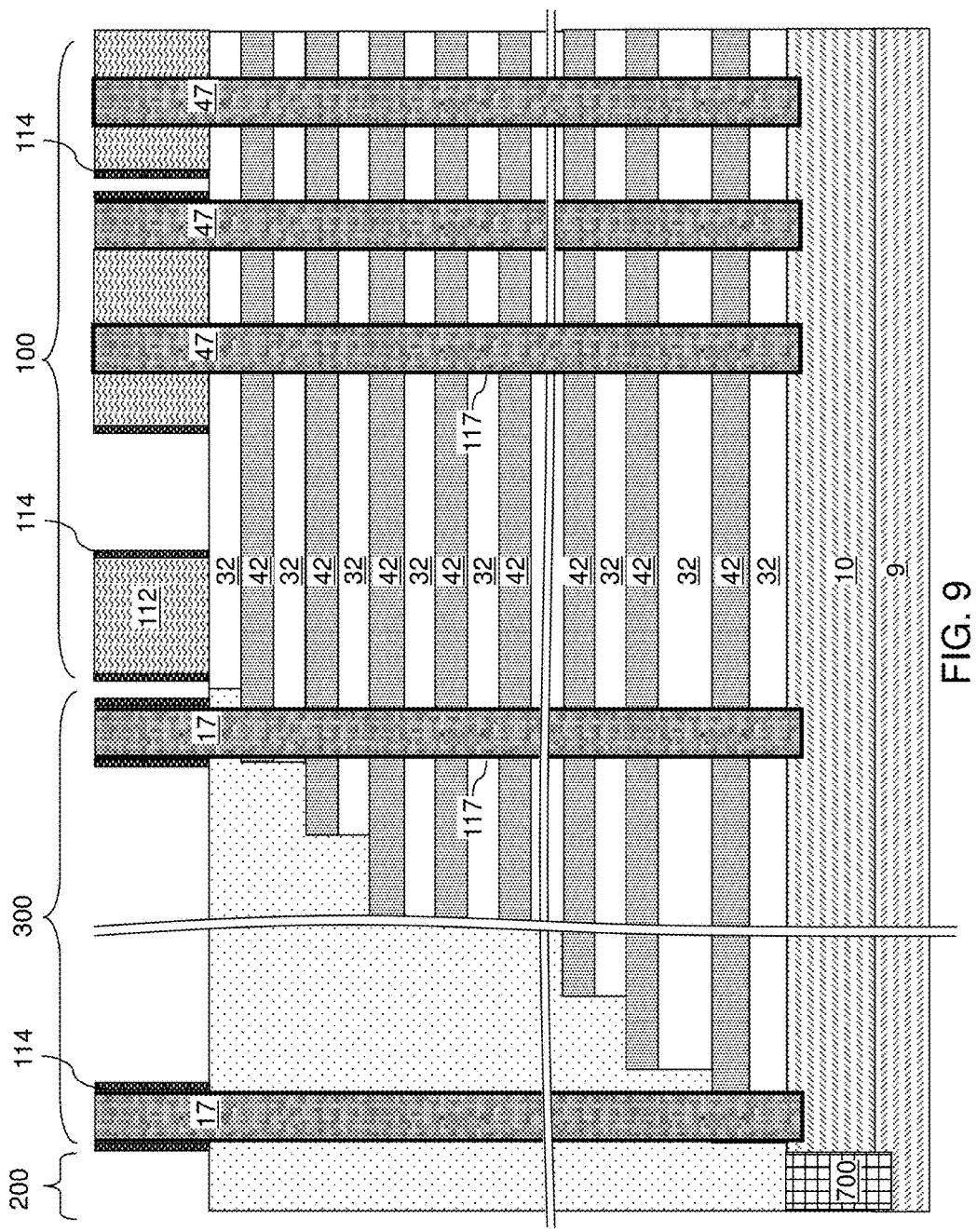
FIG. 9 is a schematic vertical cross-sectional view of the first exemplary structure after formation of doped semiconductor liners on sidewalls of the semiconductor matrices, sacrificial memory opening fill structures, and sacrificial support opening fill structures according to an embodiment of the present disclosure.

Referring to FIG. 9, doped semiconductor liners 114 (e.g., sidewall spacers) are formed on sidewalls of the semiconductor matrices 112, sacrificial memory opening fill structures (47, 117), and sacrificial support opening fill structures (17, 117). The doped semiconductor liners 114 and the semiconductor matrices 112 can have a doping of a same conductivity type at a same dopant concentration or at different dopant concentrations. The doped semiconductor liners 114 can be formed by conformal deposition of a doped semiconductor material layer, and by a subsequently anisotropic etch process that etches the horizontal portions of the doped semiconductor material layer. As a conformal material layer, the doped semiconductor material layer can have a uniform thickness throughout. The thickness of the doped semiconductor material layer is less than one half of the width of the narrowest portion of a laterally meandering gap between within each region from which a narrower sacrificial material strip portion 71A is removed in the processing steps of FIG. 8. Thus, a laterally meandering cavity is present within a portion of a volume of each narrower sacrificial material strip portion 71A, which is within the volume from which the strip of the sacrificial fill material layer (71A, 71B, 17I) is removed. In one embodiment, the thickness of the doped semiconductor liners 114 can be in a range from 1 nm to 20 nm, such as from 2 nm to 10 nm and/or from 3 nm to 6 nm, although lesser and greater thicknesses can also be employed.

In one embodiment, the semiconductor matrices 112 and the doped semiconductor liners 114 can include, or can consist essentially of, boron-doped silicon. In this case, the boron concentration in the semiconductor matrices 112 can be in a range from $1.0 \times 10^{19}/cm^3$ to $1.0 \times 10^{21}/cm^3$, such as from $5.0 \times 10^{19}/cm^3$ to $5.0 \times 10^{20}/cm^3$, although lesser and greater boron concentrations can also be employed. The boron concentration in the doped semiconductor liners 114 can be in a range from $1.0 \times 10^{19}/cm^3$ to $1.0 \times 10^{21}/cm^3$, such as from $5.0 \times 10^{19}/cm^3$ to $5.0 \times 10^{20}/cm^3$, although lesser and greater boron concentrations can also be employed. The boron concentration in the semiconductor matrices 112 and the boron concentration in the doped semiconductor liners 114 may be the same, or may be different.

Figure 10:
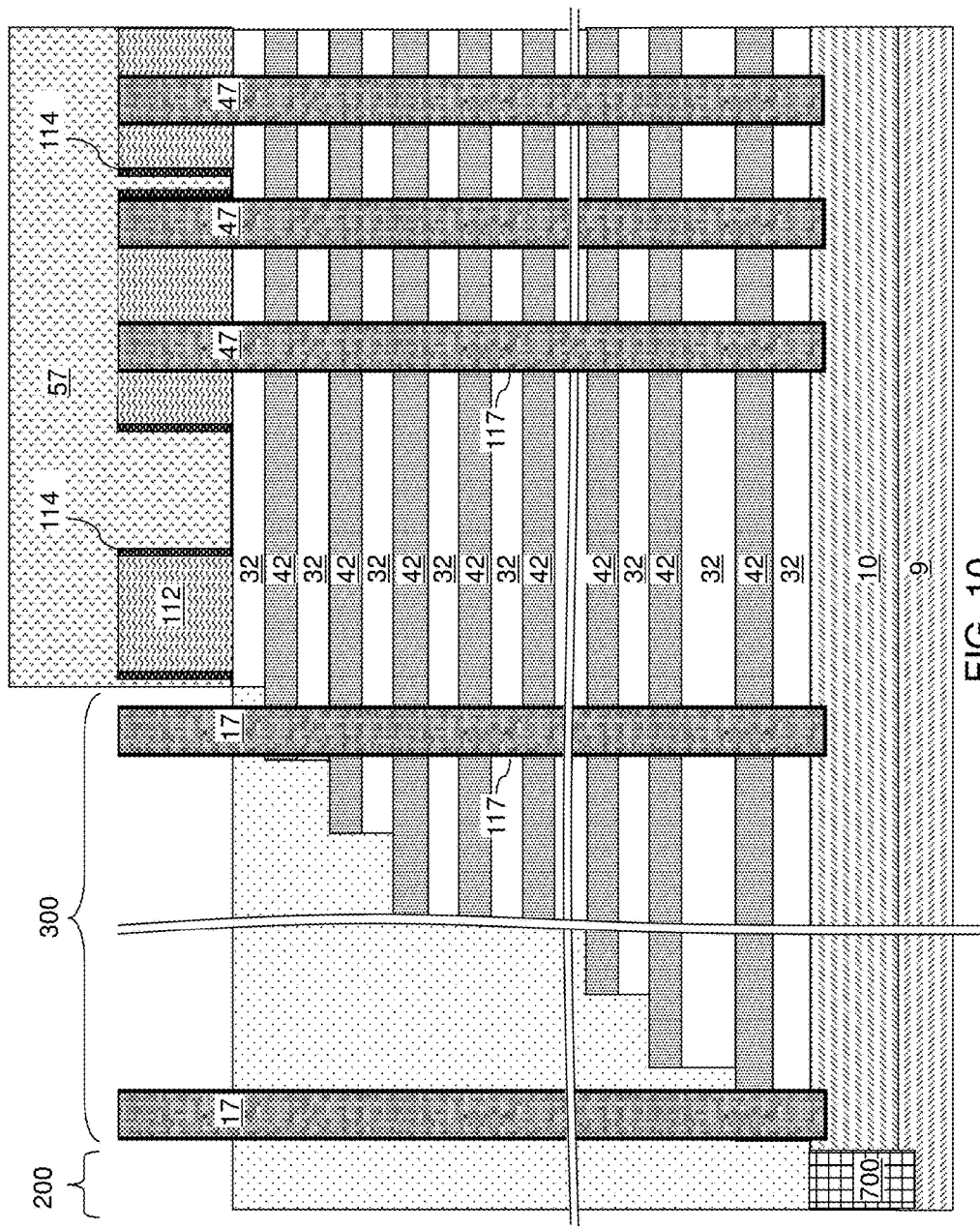
FIG. 10 is a schematic vertical cross-sectional view of the first exemplary structure after removal of doped semiconductor liners from sidewalls of the sacrificial support opening fill structures according to an embodiment of the present disclosure.

Referring to FIG. 10, a photoresist layer 57 can be optionally applied and patterned to cover the semiconductor matrices 112 and doped semiconductor liners 114 contacting the semiconductor matrices 112. The doped semiconductor liners 114 located on the sacrificial support opening fill structures (17, 117) are not covered by the patterned photoresist layer 57. A recess etch process can be employed to remove the doped semiconductor liners 114 from around the sacrificial support opening fill structures (17, 117). A wet etch or an isotropic dry etch (such as chemical dry etch) may be employed to remove the doped semiconductor liners 114 from around the sacrificial support opening fill structures (17, 117). The photoresist layer 57 can be subsequently removed, for example, by ashing.

Figure 11A:
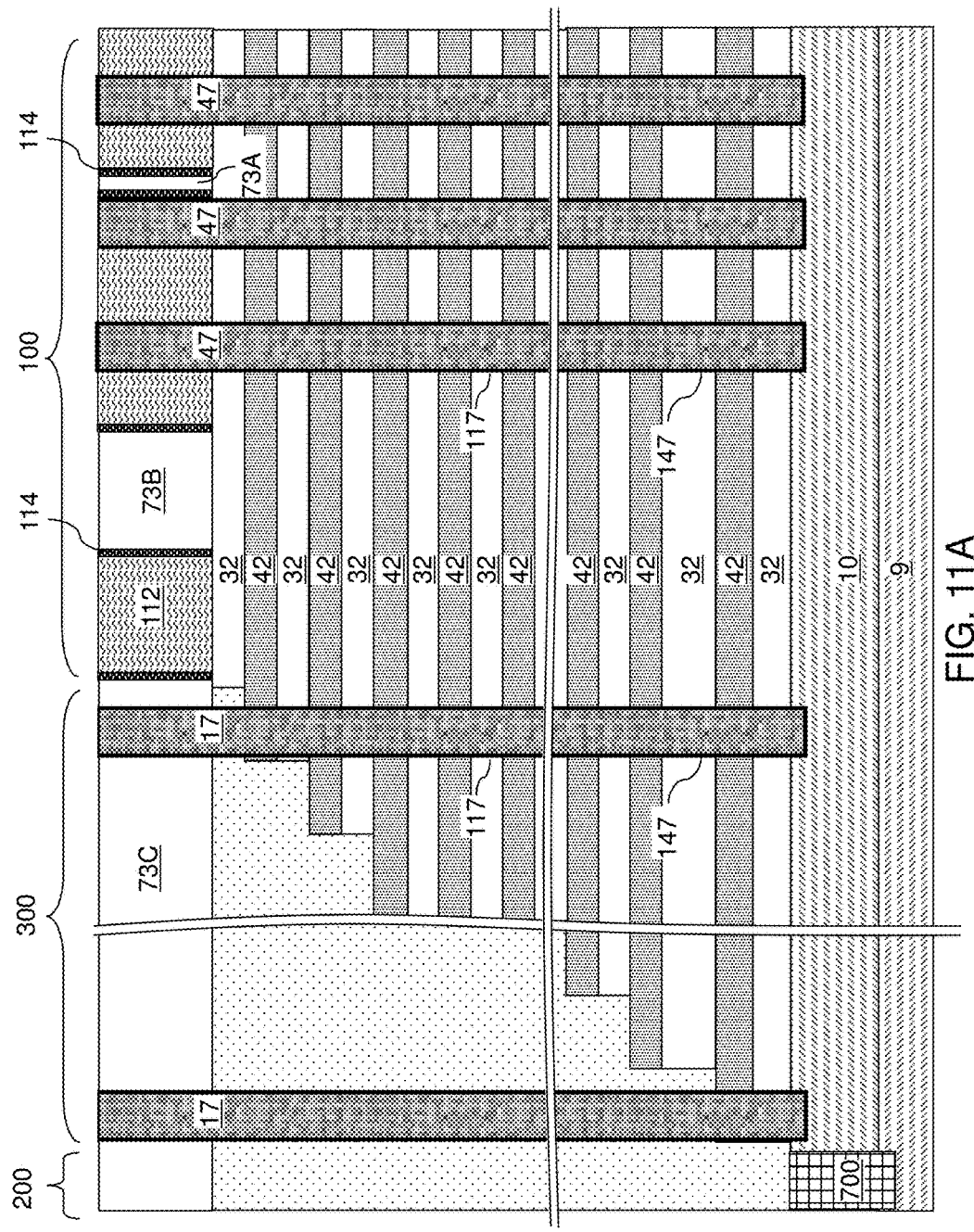
FIG. 11A is a schematic vertical cross-sectional view of the first exemplary structure after formation of an insulating fill material layer according to an embodiment of the present disclosure.
Figure 11B:
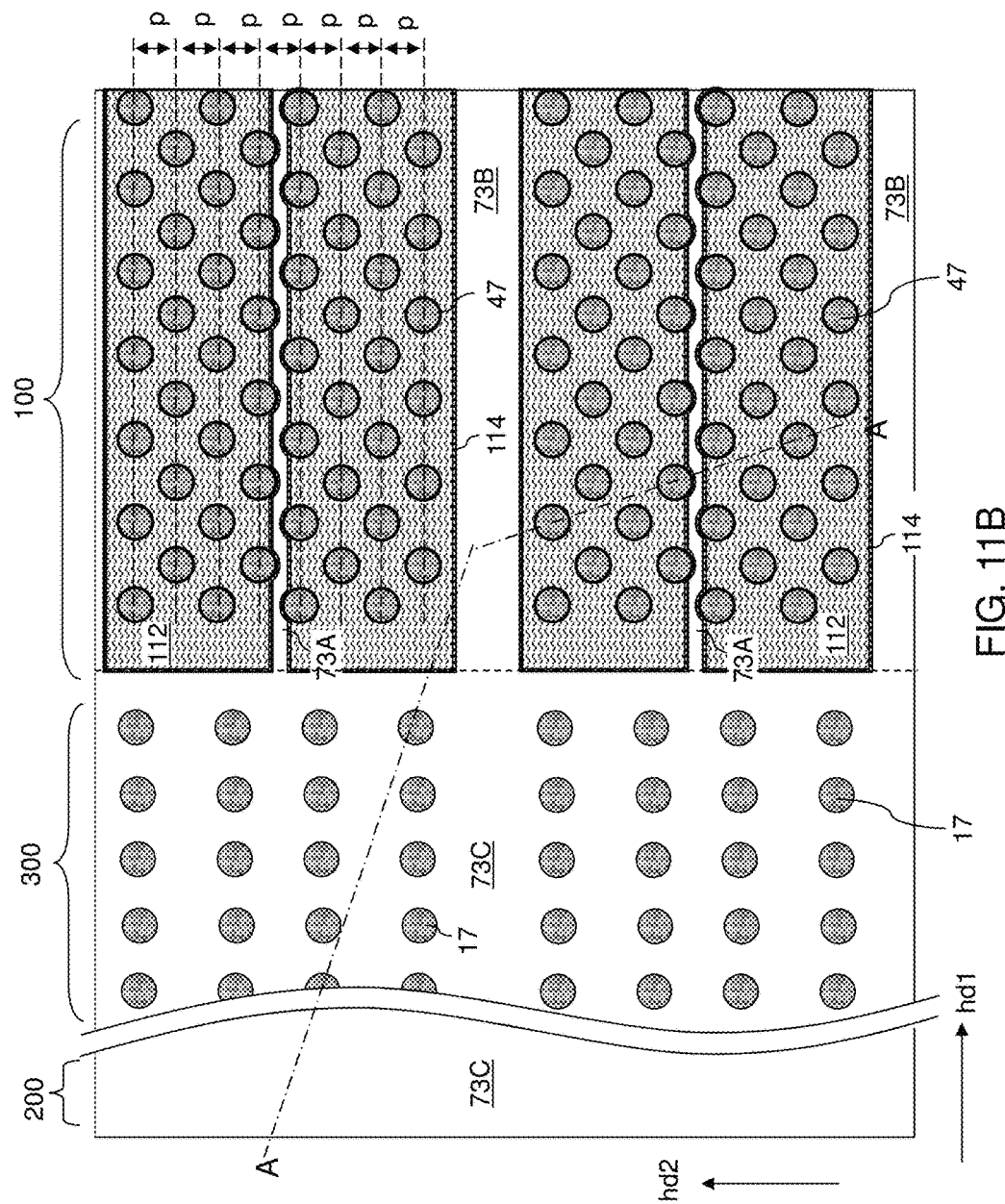
FIG. 11B is a top-down view of the first exemplary structure of FIG. 11A. The vertical plane A-A' is the plane of the cross-section for FIG. 11A.

Referring to FIGS. 11A and 11B, an insulating fill material is deposited within empty volumes underlying the horizontal plane including the top surfaces of the semiconductor matrices 112. The insulating fill material includes a planarizable insulating material such as deposited silicon oxide material or a self-planarizing material such as spin-on glass. Portions of the insulating fill material overlying the horizontal plane including the top surfaces of the semiconductor matrices 112 can be removed by a planarization process, which can employ chemical mechanical planarization and/or a recess etch. The remaining continuous portion of the insulating fill material constitutes an insulating fill material layer (73A, 73B, 73C).

In one embodiment, the insulating fill material layer (73A, 73B, 73C) can include a drain select level isolation structure 73A located between neighboring rows of sacrificial memory opening fill structures (47, 117) within a respective group of sacrificial memory opening fill structures (47, 117) in the memory array region 100, insulating fill material strip portions 73B located between neighboring groups of sacrificial memory opening fill structures (47, 117) in the memory array region 100, and a drain select level field dielectric portion 73C located in the contact region 300 and the peripheral device region 200, overlying the retro-stepped dielectric material portion 65, and adjoined to the drain select level isolation portions 73A and the insulating fill material strip portions 73B.

In one embodiment, each drain select level isolation structure 73A generally extends (i.e., has a maximum lateral extent) along the first horizontal direction hd1, and includes a pair of sidewalls containing a respective laterally alternating sequence of planar vertical sidewall portions and concave vertical sidewall portions that contact convex vertical sidewalls of the combination of the semiconductor matrices 112 and the doped semiconductor liners 114. As used herein, a "planar vertical" surface refers to a surface that is contained within a two-dimensional Euclidean vertical plane. As used herein, a "convex vertical" surface refers to a vertically extending surface that is concave at any height. As used herein, a "concave vertical" surface refers to a vertically extending surface that is convex at any height.

In one embodiment, each of the insulating fill material strip portions 73B can include a pair of straight lengthwise sidewalls that laterally extend along the first horizontal direction hd1. In one embodiment, the drain select level field dielectric portion 73C can be adjoined to the drain select level isolation portions 73A, and can contact sidewalls of the doped semiconductor liners 114 that generally extend along the second horizontal direction hd1. In one embodiment, the sidewalls of the doped semiconductor liners 114 can be straight sidewalls that extend along the second horizontal direction hd2.

The insulating fill material layer (73A, 73B, 73C) can be formed around the semiconductor matrices 112 and the doped semiconductor liners 114 to laterally enclose, and completely encircle, each combination of a semiconductor matrix 112 and a doped semiconductor liner 114. Each drain select level isolation structure 73A can be a portion of the insulating fill material layer (73A, 73B, 73C) that fills a respective one of the laterally meandering cavities and which electrically separates adjacent drain select gate electrodes. In one embodiment, the entirety of the insulating fill material layer (73A, 73B, 73C) can have a homogeneous dielectric composition throughout. In one embodiment, the entirety of the insulating fill material layer (73A, 73B, 73C) can consist essentially of a silicon oxide material including hydrogen atoms at an atomic concentration in a range from 1 parts per million to 1,000 parts per million.

Figure 12:
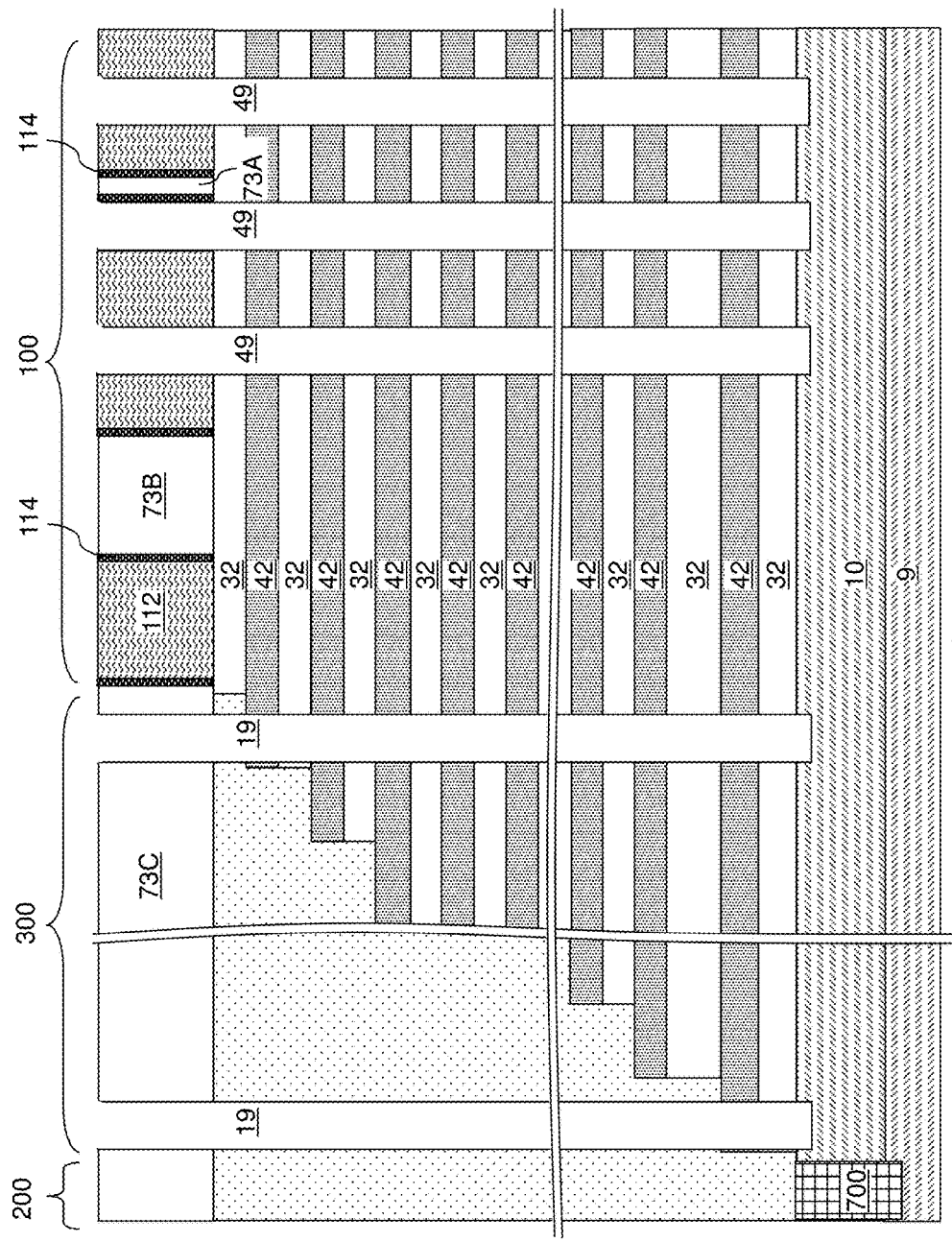
FIG. 12 is a schematic vertical cross-sectional view of the first exemplary structure after removal of the sacrificial memory opening fill structures and sacrificial support opening fill structures according to an embodiment of the present disclosure.

Referring to FIG. 12, the sacrificial memory opening fill structures (47, 117) and the sacrificial support opening fill structures (17, 117) can be removed selective to the insulating fill material layer (73A, 73B, 73C), the semiconductor matrices 112, the doped semiconductor liners 114, the alternating stack (32, 42), and the retro-stepped dielectric material portion 65. For example, if the semiconductor matrices 112 and the doped semiconductor liners 114 include boron-doped silicon, and if the sacrificial memory opening fill material potions 47 and the sacrificial support opening fill material portions 17 include undoped silicon, a wet etch employing trimethyl(2-hydroxyethyl)ammonium hydroxide (TMY) can be employed to etch the sacrificial memory opening fill material potions 47 and the sacrificial support opening fill material portions 17. The sacrificial liners 117, if present, can be removed by an isotropic etch process such as a wet etch process employing dilute hydrofluoric acid. Each volume of the memory openings 49 becomes a cavity, which is herein referred to as a memory cavity. Each volume of the support openings 19 becomes a cavity, which is herein referred to as a support cavity.

FIGS. 13A-13I illustrate structural changes in a memory opening 49, which is one of the memory openings 49 in the first exemplary structure of FIG. 12. The same structural change occurs simultaneously in each of the other memory openings 49 and in each support opening 19.

Referring to FIG. 13A, a memory opening 49 in the first exemplary structure of FIG. 12 is illustrated. The memory opening 49 extends through a layer including the combination of the drain select isolation structures 73A portion of the insulating fill material layer (73A, 73B, 73C), the semiconductor matrices 112, the doped semiconductor liners 114 and through the alternating stack (32, 42), and optionally into an upper portion of the semiconductor material layer 10. At this processing step, each support opening 19 can extend through the drain select field dielectric portion 73C of the insulating fill material layer (73A, 73B, 73C), the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Figure 13B:
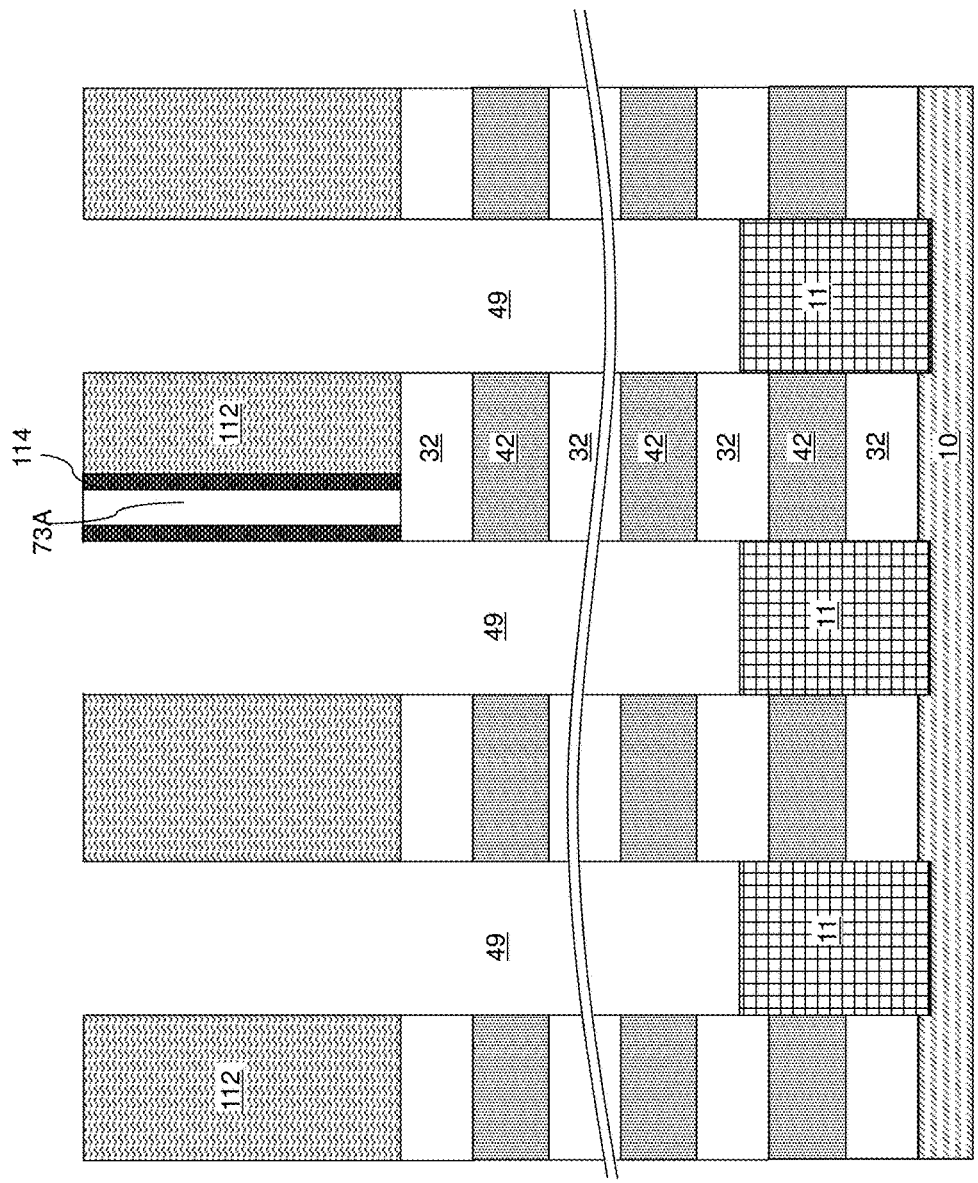

Referring to FIG. 13B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 13C:
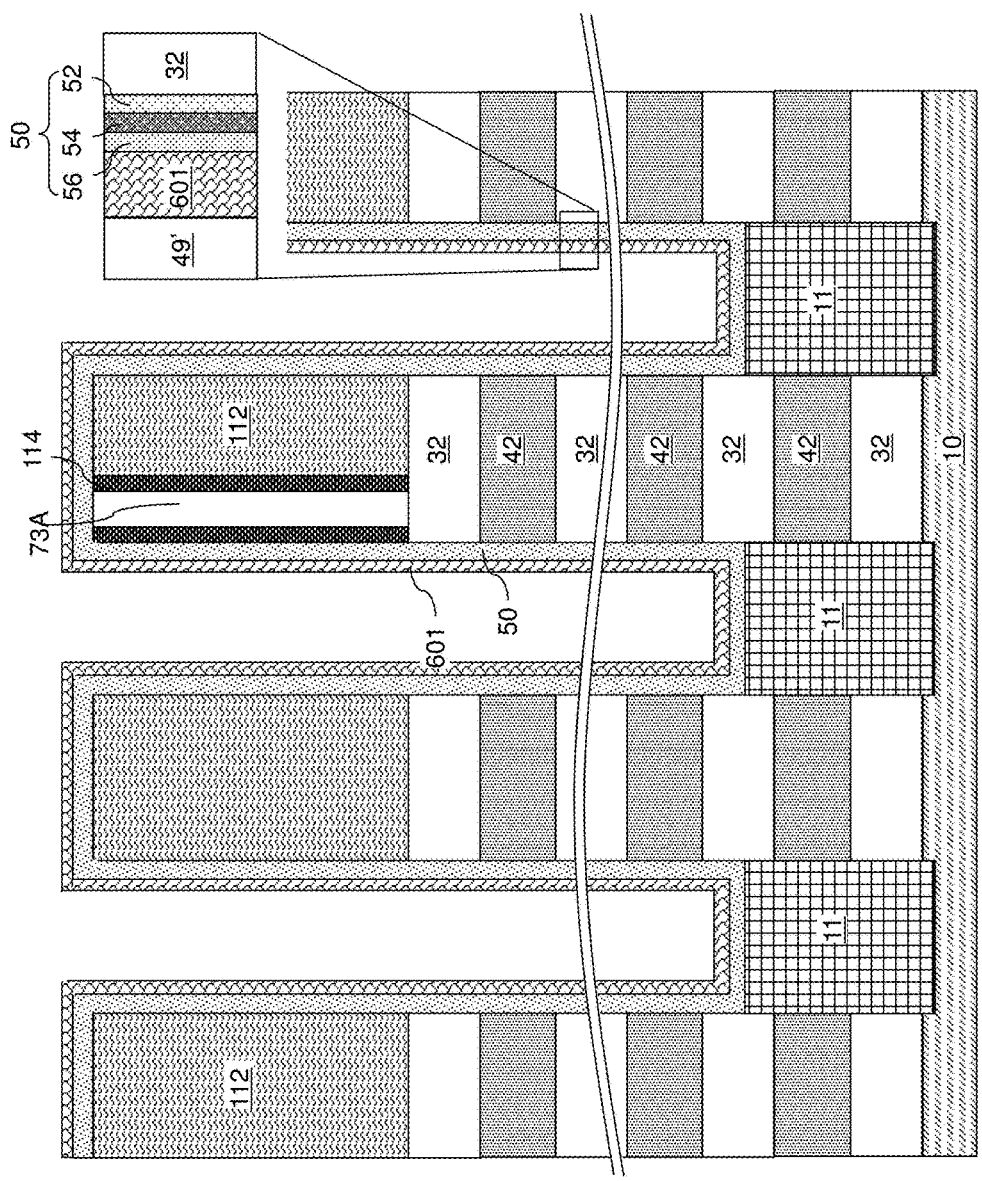

Referring to FIG. 13C, a memory film 50 and an optional first semiconductor channel layer 601 can be sequentially deposited in the memory openings 49. Each memory film 50 can include a stack of layers including a blocking dielectric layer 52, a charge storage layer 54, and a tunneling dielectric layer 56.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof.

In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 13D:
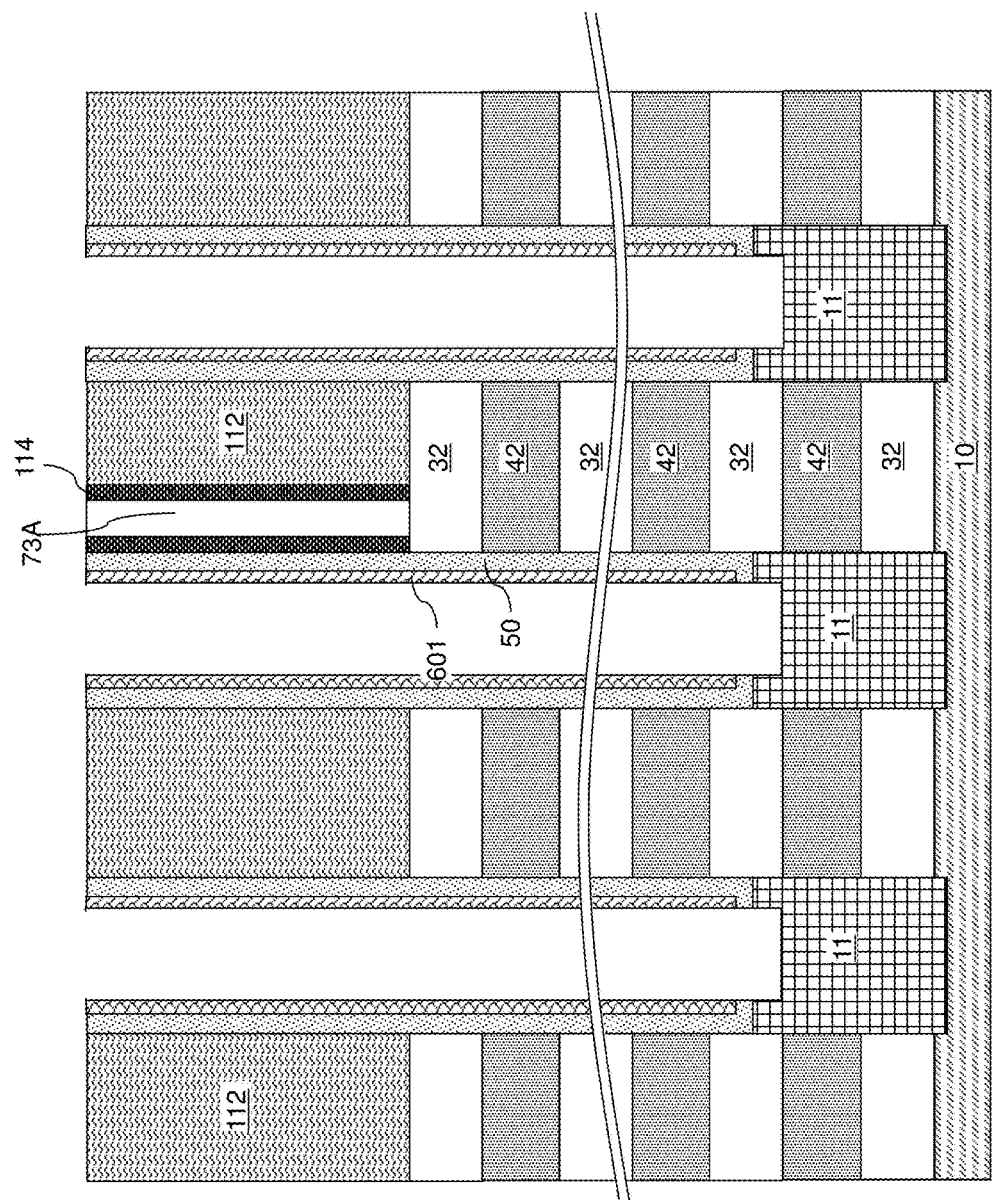

Referring to FIG. 13D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the alternating stack (32, 42) can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 13E:
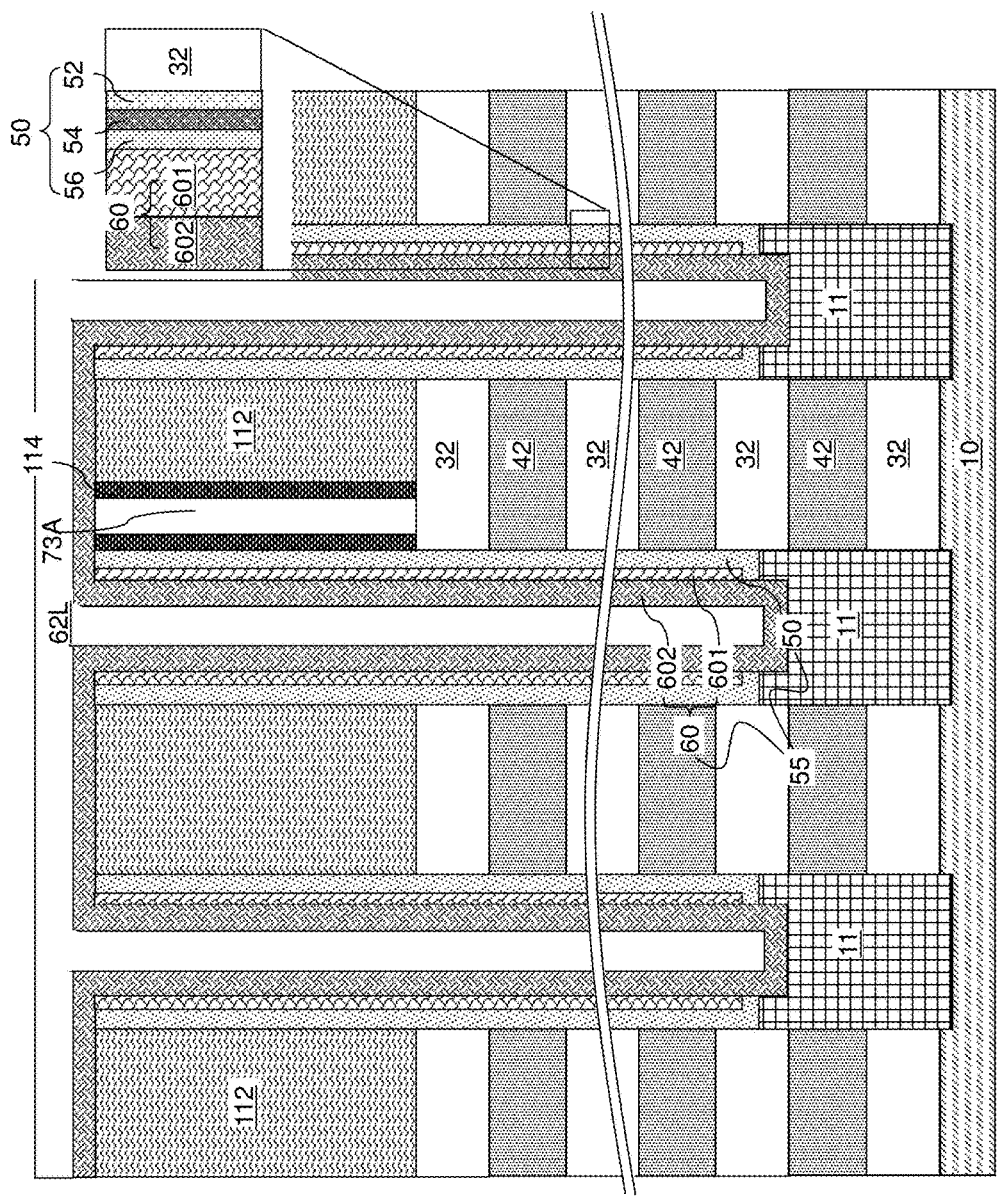

Referring to FIG. 13E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

In case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 13F:
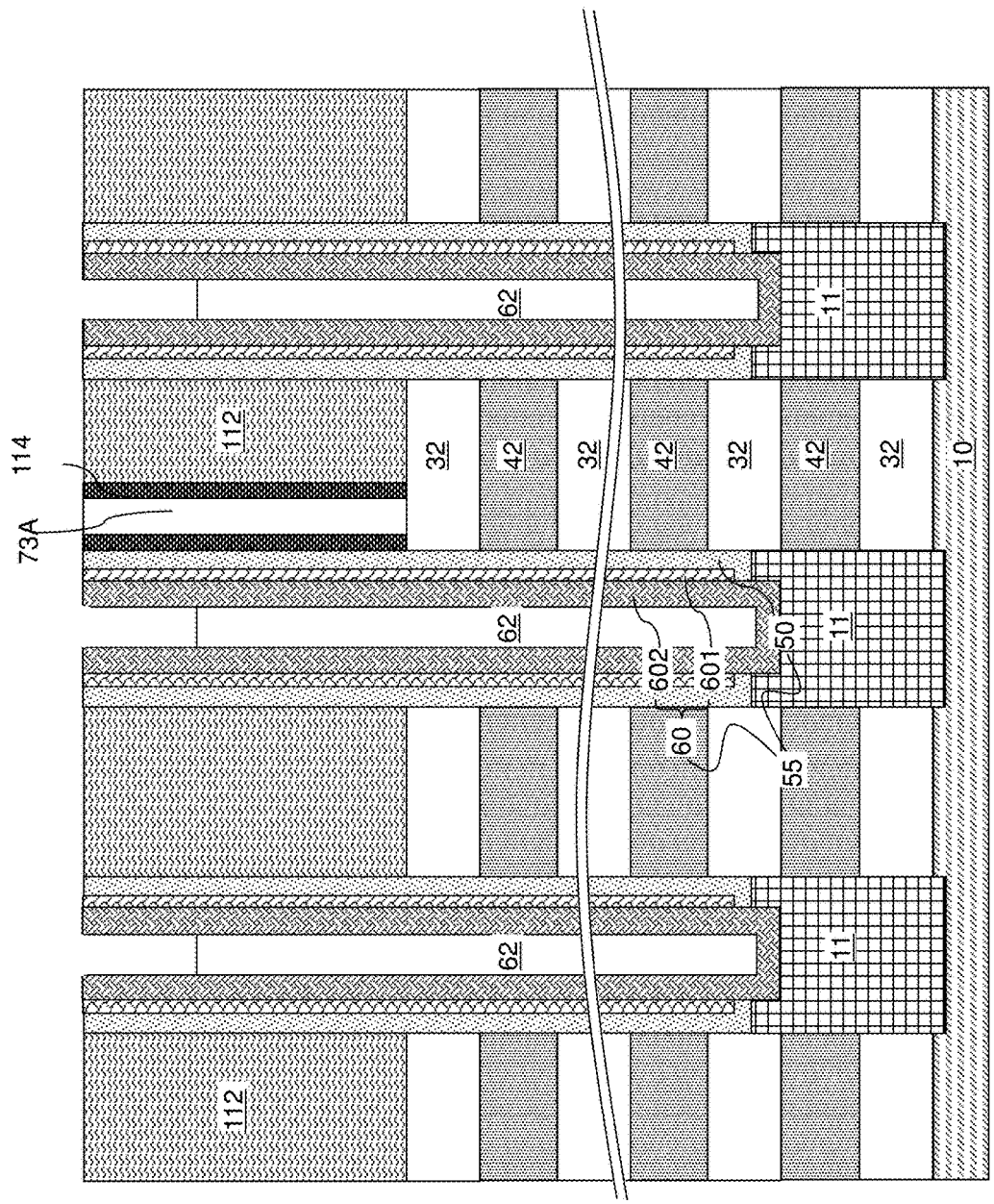

Referring to FIG. 13F, the horizontal portion of the dielectric core layer 62L can be removed, for example, by a recess etch from above the top surface of the alternating stack (32, 42). The remaining portions of the dielectric core layer 62L can be recessed below the horizontal plane including the top surfaces of the insulating fill material layer (73A, 73B, 73C), the semiconductor matrices 112, and the doped semiconductor liners 114 to form vertical recesses. Each remaining portion of the dielectric core layer 62L constitutes a dielectric core 62. The top surfaces of the dielectric 62 core can be between the top surfaces and the bottom surfaces of the combination of the combination of the insulating fill material layer (73A, 73B, 73C), the semiconductor matrices 112, and the doped semiconductor liners 114. Further, the horizontal portion of the second semiconductor channel layer 602 located above the top surface of the insulating fill material layer (73A, 73B, 73C), the semiconductor matrices 112, and the doped semiconductor liners 114 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60.

Figure 13G:
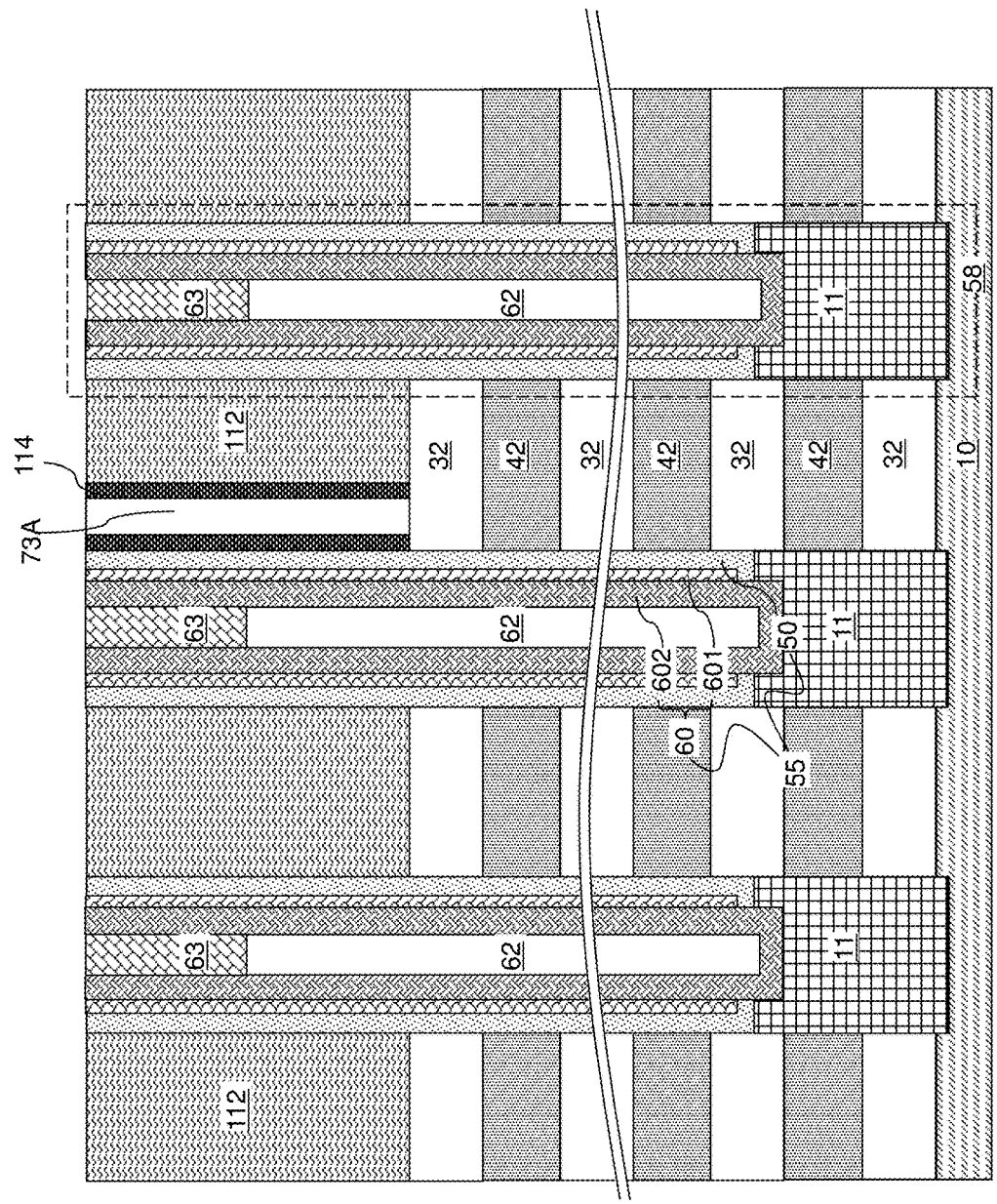

Referring to FIG. 13G, drain regions 63 can be formed in each vertical recess overlying a respective dielectric core 62. A doped semiconductor material can be deposited within each vertical recess above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/\text{cm}^3$ to $2.0 \times 10^{21}/\text{cm}^3$, although lesser and greater dopant concentrations can also be employed. The doped semiconductor material can be, for example, doped polysilicon. Excess portions of the deposited semiconductor material can be removed from above the top surface of the alternating stack (32, 42), for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure. Thus, each sacrificial memory opening fill structure (47, 117) is replaced with a memory opening fill structure 58, which includes a memory stack structure 55. Each of the memory stack structures 55 comprises a memory film 50 and a vertical semiconductor channel 60 contacting an inner sidewall of the memory film 50.

Figure 13H:
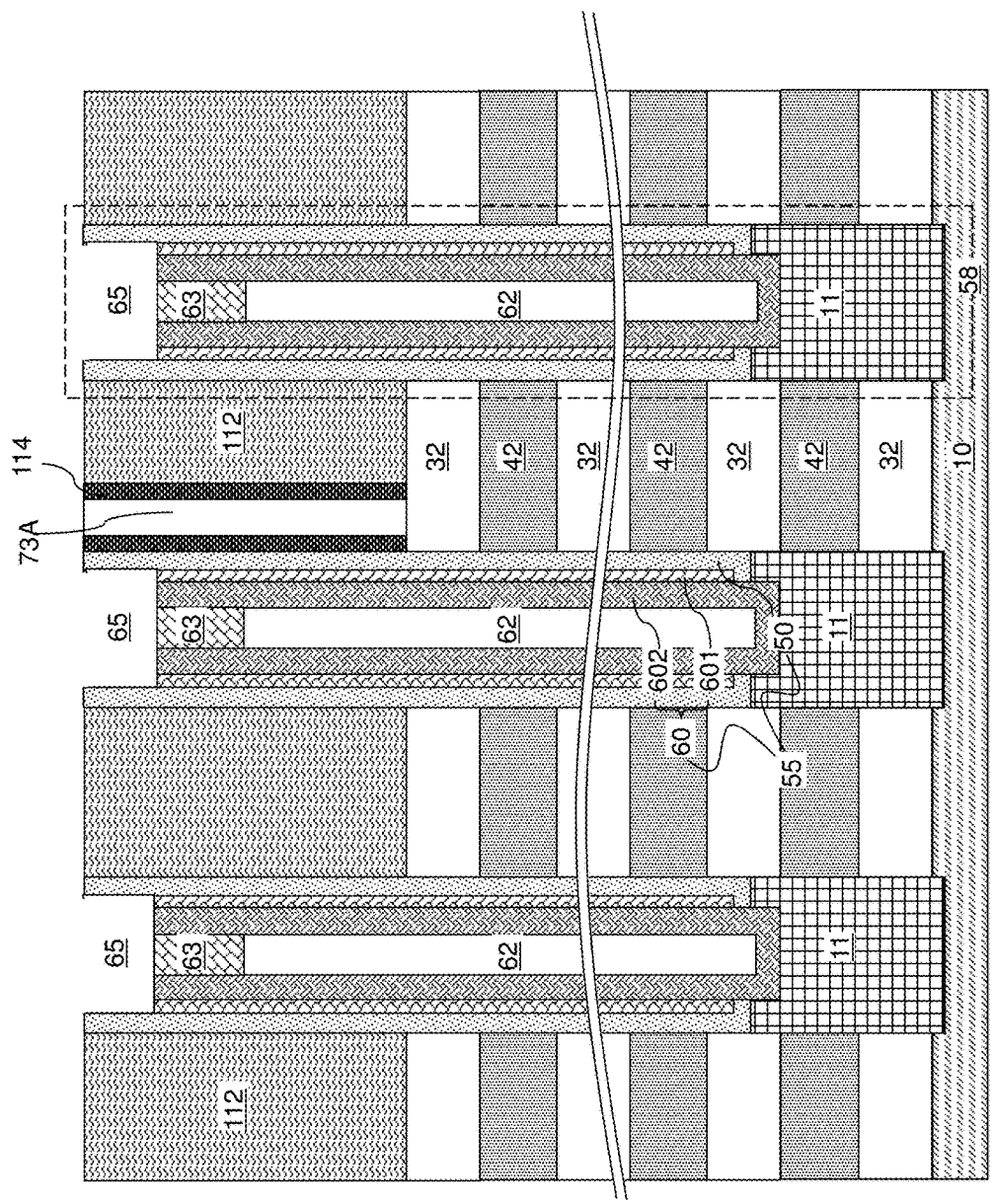

Referring to FIG. 13H, recess regions 65 can be formed by partially vertically recessing the memory opening fill structure 58 containing the memory stack structures 55. Specifically, the vertical semiconductor channels 60 and the drain regions 63 can be vertically recessed below the horizontal plane including the top surface of the dielectric fill material layer (73A, 73B, 73C). The recess depth can be in a range from 10% to 90%, such as from 20% to 80%, of the height of the drain regions 63 as formed at the processing steps of FIG. 13G.

Figure 13I:
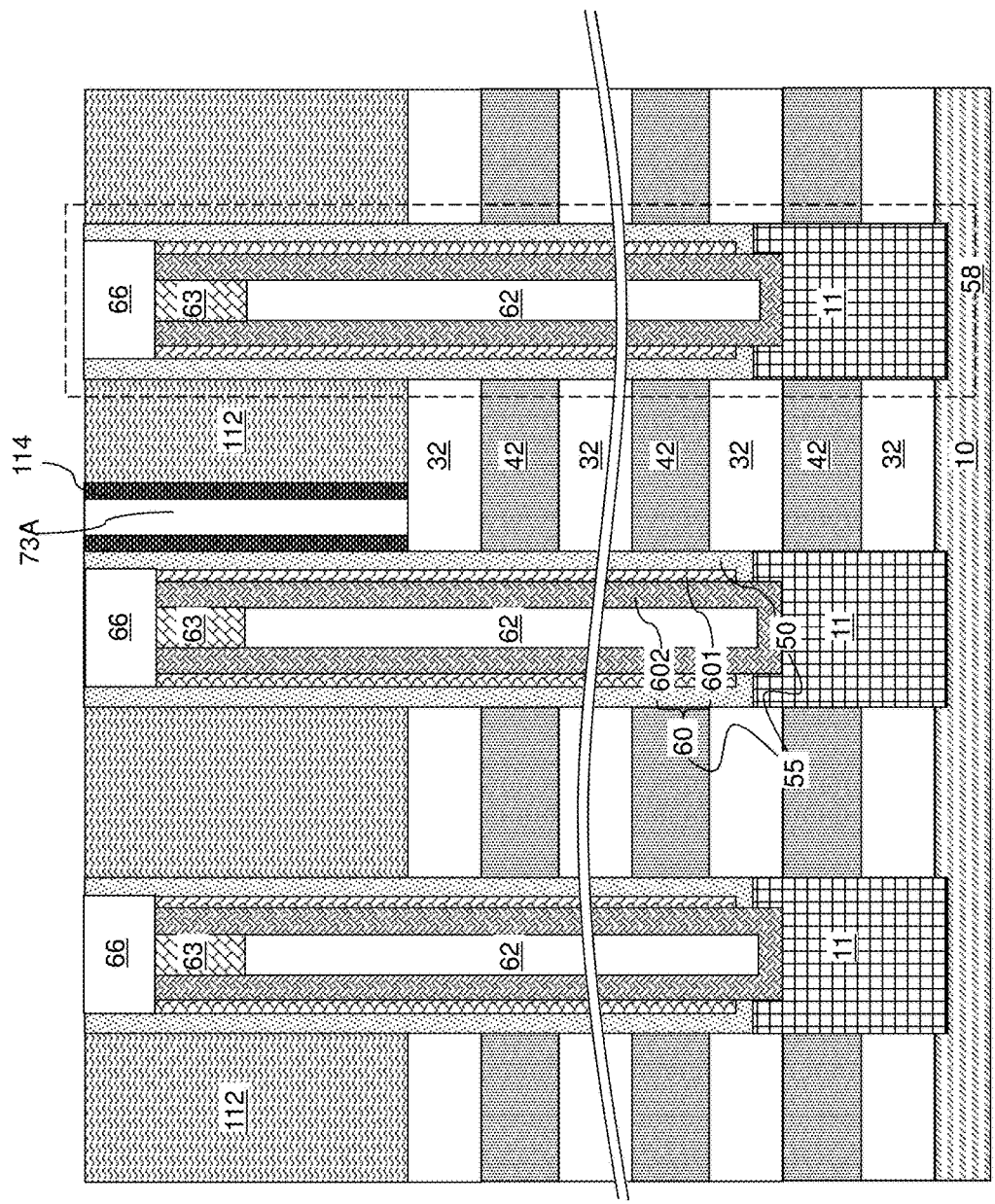

Referring to FIG. 13I, dielectric pillar structures 66 can be formed in the recess regions 65 by depositing a dielectric material such as silicon oxide. Excess portions of the dielectric material can be removed from above the top surface of the dielectric fill material layer (73A, 73B, 73C) by a planarization process such as chemical mechanical planarization and/or a recess etch.

Figure 14:
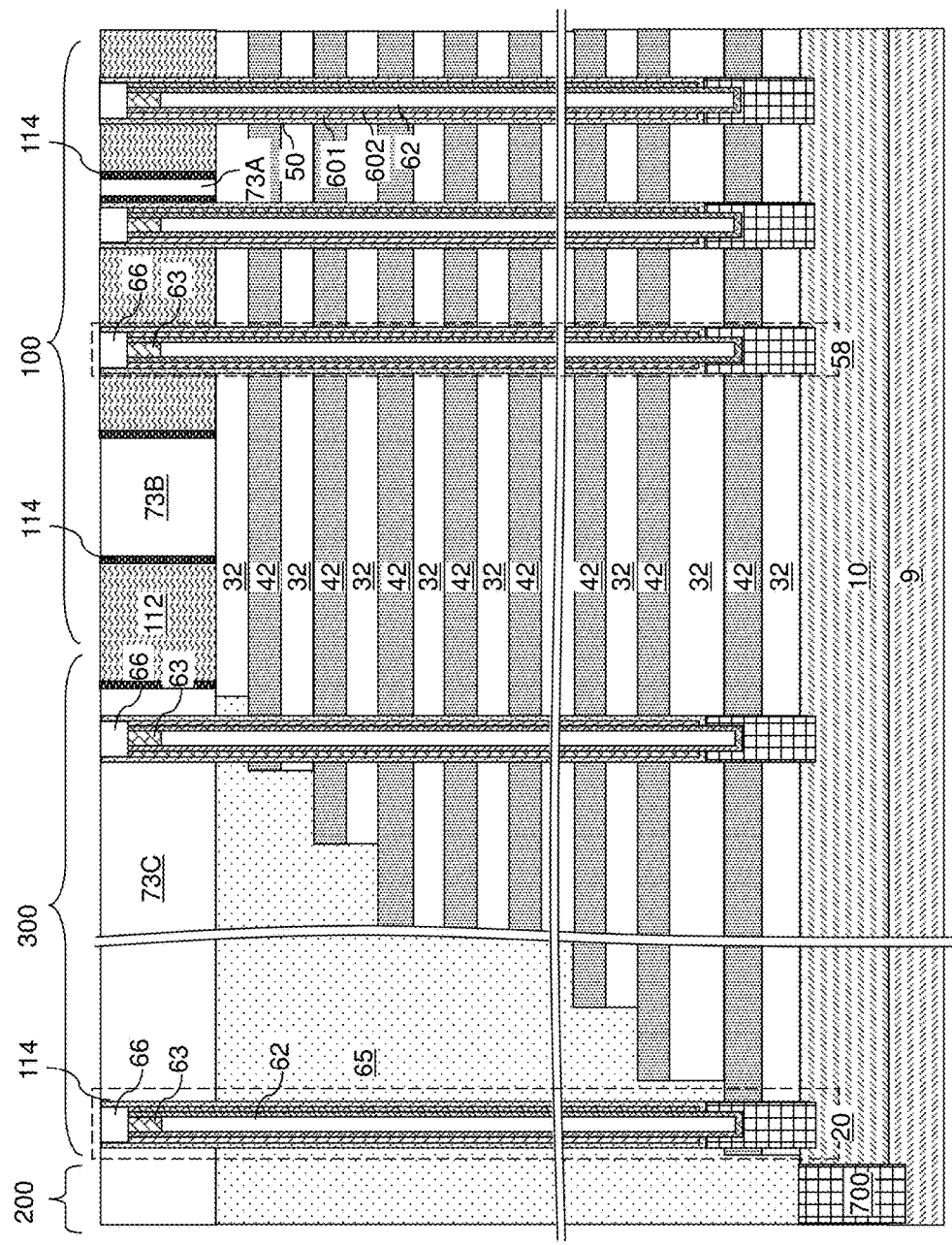
FIG. 14 is a schematic vertical cross-sectional view of the first exemplary structure after formation of memory opening fill structures and support opening fill structures according to an embodiment of the present disclosure.

Referring to FIG. 14, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIG. 12. An instance of the support pillar structure 20 can be formed within each support opening 19 of the structure of FIG. 12.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Drain select gate electrodes can be subsequently formed at least by vertically recessing the semiconductor matrices 112 and the doped semiconductor liners 114 by a recess etch process. Drain select gate electrodes to be subsequently formed include the materials of the remaining portions of the semiconductor matrices 112 and the doped semiconductor liners 114 after the recess etch.

Figure 15:
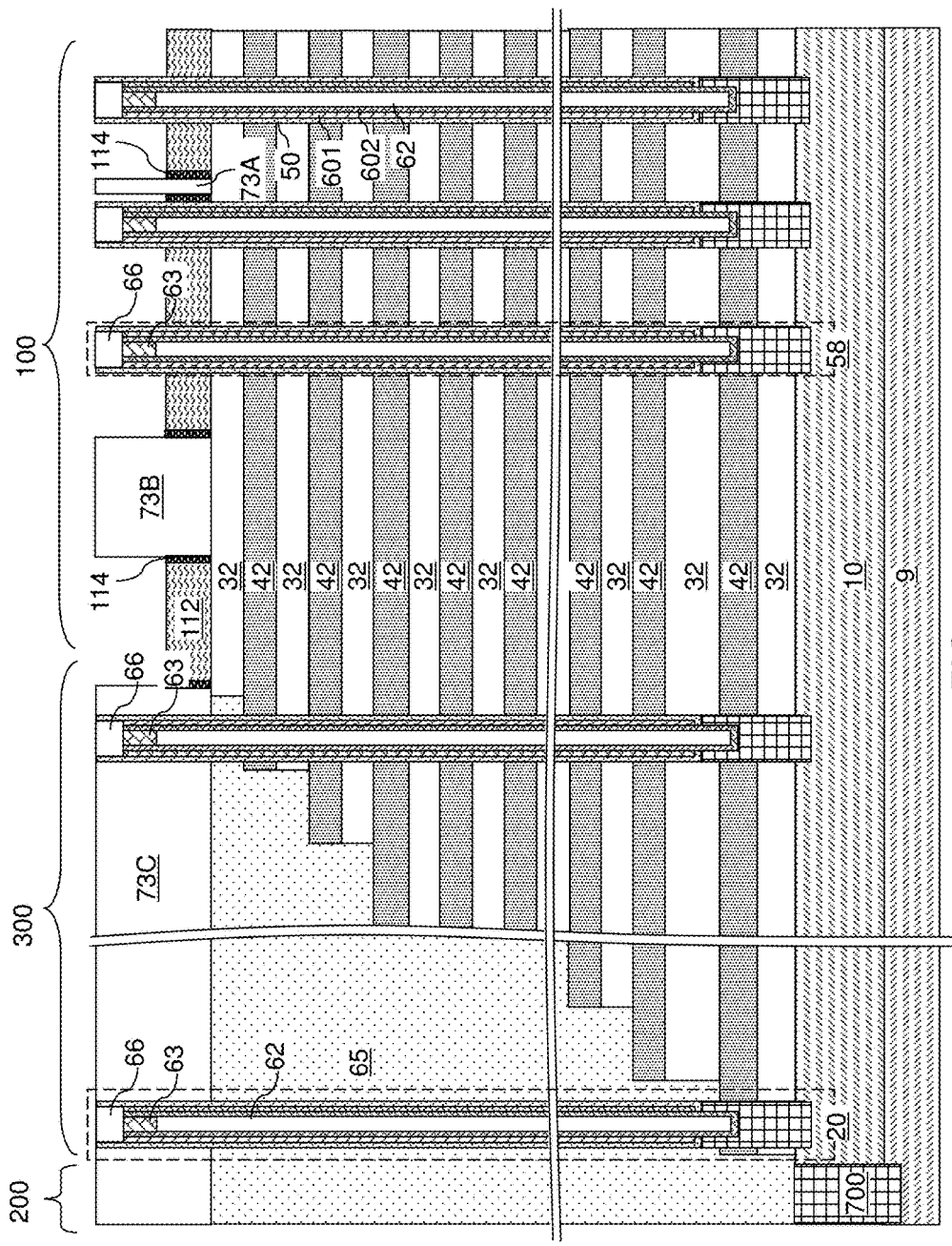
FIG. 15 is a schematic vertical cross-sectional view of the first exemplary structure after vertically recessing the semiconductor matrices and the doped semiconductor liners according to an embodiment of the present disclosure.

Referring to FIG. 15, the semiconductor matrices 112 and the doped semiconductor liners 114 can be vertically recessed with selective to the dielectric pillar structures 66 and the dielectric fill material layer (73A, 73B, 73C). For example, if the semiconductor matrices 112 and the doped semiconductor liners 114 include doped semiconductor materials and if the dielectric pillar structures 66 and the dielectric fill material layer (73A, 73B, 73C) include silicon oxide, the semiconductor matrices 112 and the doped semiconductor liners 114 can be vertically recessed by an anisotropic etch process that etches semiconductor materials selective to silicon oxide. Alternatively, an isotropic etch process such a wet etch process employing a KOH solution may be employed to vertically recess the semiconductor matrices 112 and the doped semiconductor liners 114. The thickness of the semiconductor matrices 112 and the doped semiconductor liners 114 after the recess etch can be in a range from 10% to 80%, such as from 20% to 60%, of the thickness of the semiconductor matrices 112 and the doped semiconductor liners 114 prior to the recess etch, and may be in a range from 20 nm to 240 nm such as from 60 nm to 120 nm, although lesser and greater thicknesses can also be employed. The bottom surfaces of the drain regions 63 can be above the horizontal plane including the top surfaces of the semiconductor matrices 112 and the doped semiconductor liners 114 after the recess etch.

Figure 16:
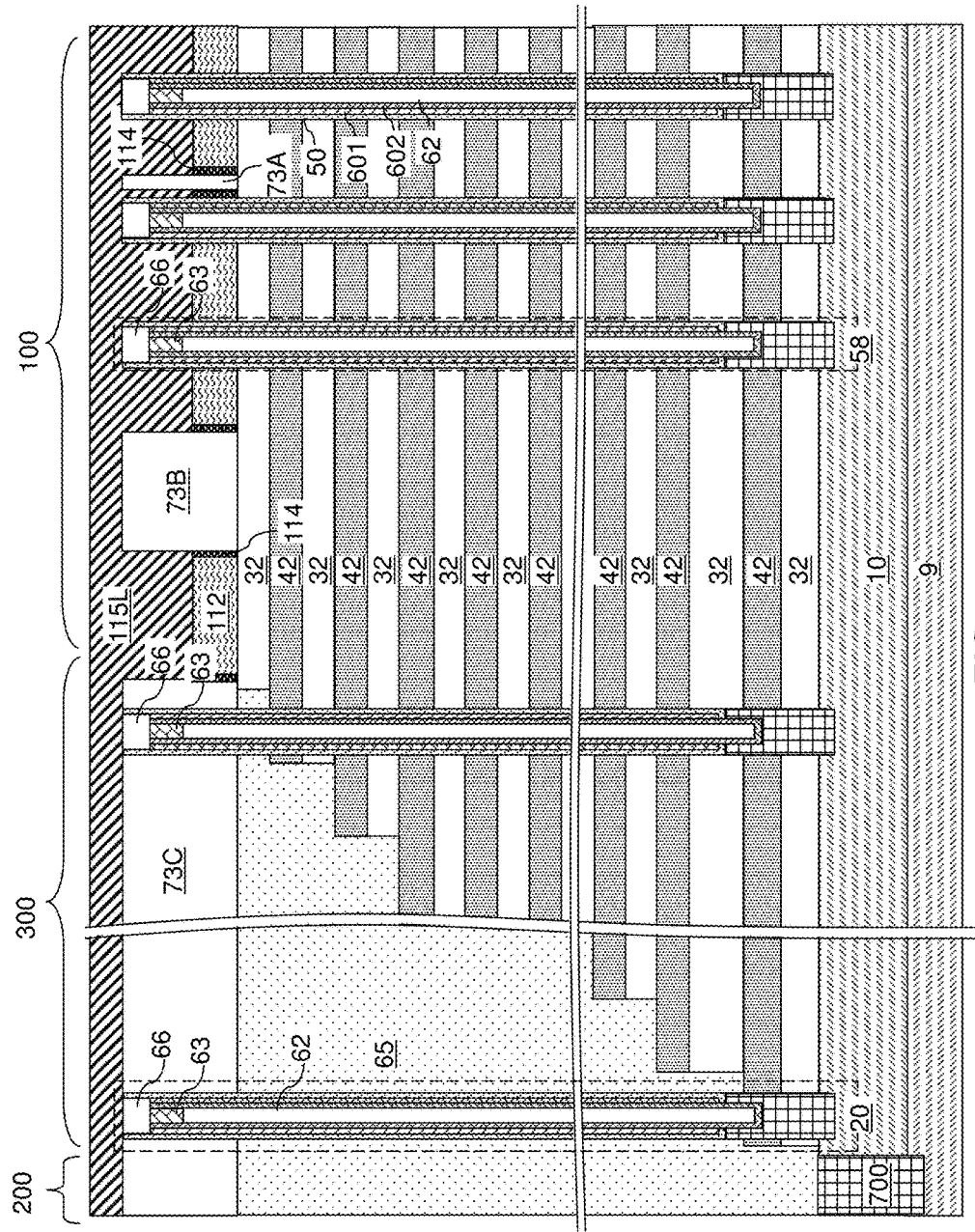
FIG. 16 is a schematic vertical cross-sectional view of the first exemplary structure after deposition of a metal layer according to an embodiment of the present disclosure.

Referring to FIG. 16, a metal layer 115L can be deposited on top surfaces of the remaining portions of the semiconductor matrices and the doped semiconductor liners 114 after the recess etch process. The metal layer 115L includes at least one metal that forms a metal silicide upon reaction with silicon. For example, the metal layer 115L can include, and/or can consist essentially of, at least one elemental metal selected from titanium, cobalt, tungsten, nickel, platinum, and molybdenum. The metal layer 115L can have a thickness in a range from 20 nm to 240 nm, such as from 60 nm to 120 nm, although lesser and greater thicknesses can also be employed. The metal layer 115L can be deposited by a non-conformal deposition process such as physical vapor deposition (PVD), or by a conformal deposition process such as chemical vapor deposition (CVD).

Figure 17A:
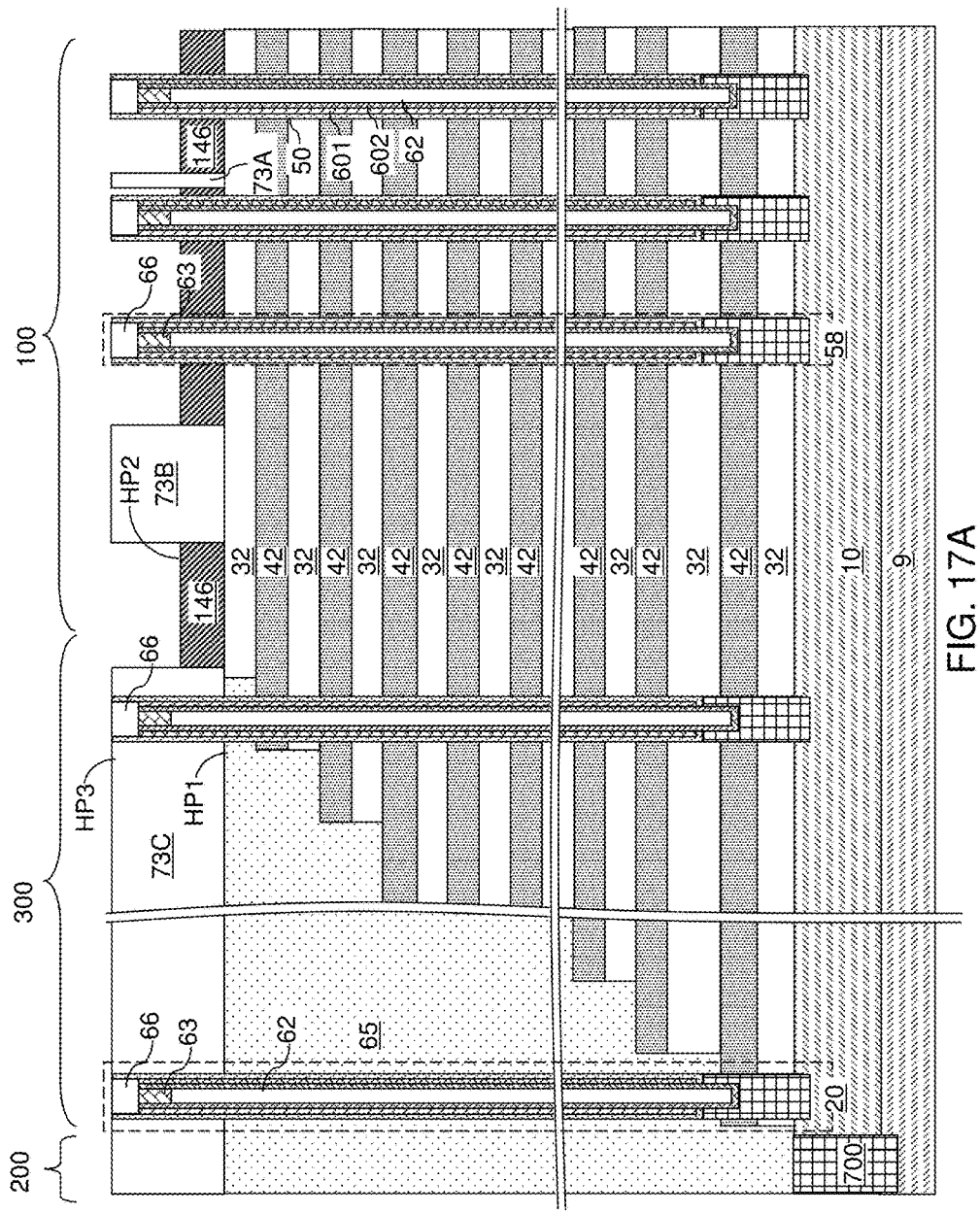
FIG. 17A is a schematic vertical cross-sectional view of the first exemplary structure after formation of drain select gate electrodes including a metal silicide material according to an embodiment of the present disclosure.
Figure 17B:
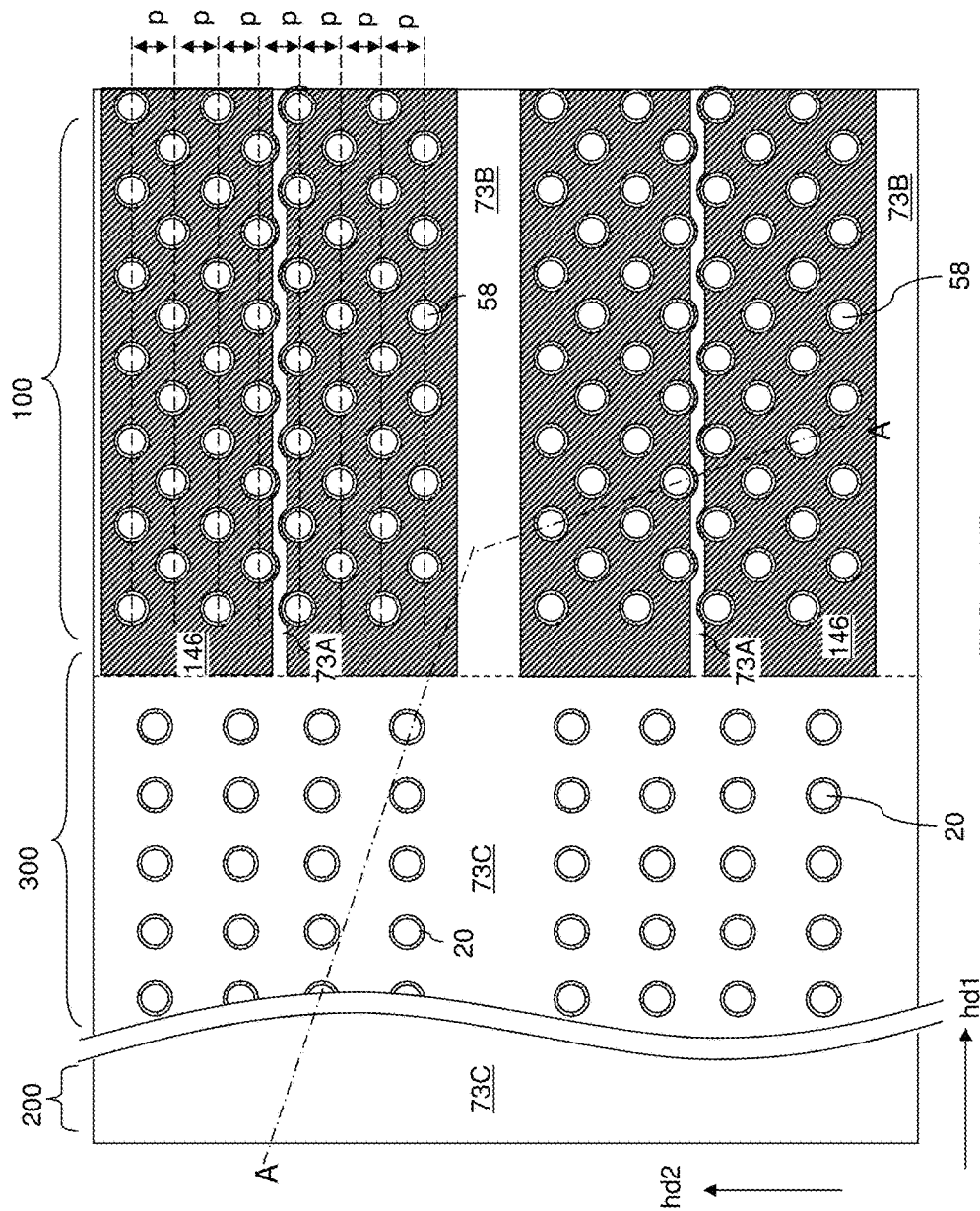
FIG. 17B is a top-down view of the first exemplary structure of FIG. 17A. The vertical plane A-A' is the plane of the cross-section for FIG. 17A.

Referring to FIGS. 17A and 17B, an anneal process is performed at an elevated temperature to induce reaction between the metal in the metal layer 115L and the remaining portions of the semiconductor matrices 112 and the doped semiconductor liners 114. A silicidation process occurs during the anneal process to form a metal silicide material, which forms metal silicide material portions in each area of a contiguous combination of a semiconductor matrix 112 and a doped semiconductor liner 114. Each continuous portion of the metal silicide material functions a gate electrode located at a drain select level, and is herein referred to as a drain select gate electrode 146.

In one embodiment, the metal silicide material comprises metal atoms, silicon atoms, and electrical dopant atoms selected from p-type dopant atoms and n-type dopant atoms, and an atomic concentration of the electrical dopant atoms is in a range from 0.05% to 2% within the metal silicide material. In one embodiment, the metal silicide material can include boron atoms in a range from 0.05% to 2% within the metal silicide material.

Each drain select gate electrode 146 includes materials present within remaining portions of the semiconductor matrices 112 and the doped semiconductor liners 114 after the recess etch process at the processing steps of FIG. 15. Portions of the drain select gate electrodes 146 include concave inner vertical sidewalls that contact a respective memory opening fill structure 58.

As shown in FIG. 17B, each drain select level isolation structure 73A has a laterally alternating sequence of planar vertical sidewall portions and concave vertical sidewall portions. Concave vertical sidewall portions of each drain select level isolation structure 73A can contact convex vertical sidewalls of memory opening fill structures 58 containing the memory stack structures 55. Planar vertical sidewall portions of each drain select level isolation structure 73A can contact planar vertical sidewalls of a pair of drain select gate electrodes 146. Each memory film 50 can include a lateral stack of a blocking dielectric layer 52, a charge storage layer 54, and a tunneling dielectric layer 56. The drain select gate electrodes 146 can be formed on outer sidewalls of the blocking dielectric layers 52 of the memory films 50.

As shown in FIG. 17A, the bottom surfaces of the drain select gate electrodes 146 can be located within a first horizontal plane HP1 that includes the interface between the dielectric fill material layer (73A, 73B, 73C) and the topmost surface of the alternating stack (32, 42) (which can be the top surface of the topmost insulating layer 32) and/or the interface between the dielectric fill material layer (73A, 73B, 73C) and the retro-stepped dielectric material portion 65. The top surfaces of the drain select gate electrodes 146 can be located within a second horizontal plane HP2 that is located above the first horizontal plane HP1 and below a third horizontal plane HP3 including the top surfaces of the dielectric fill material layer (73A, 73B, 73C) and the dielectric pillar structures 66.

Figure 18:
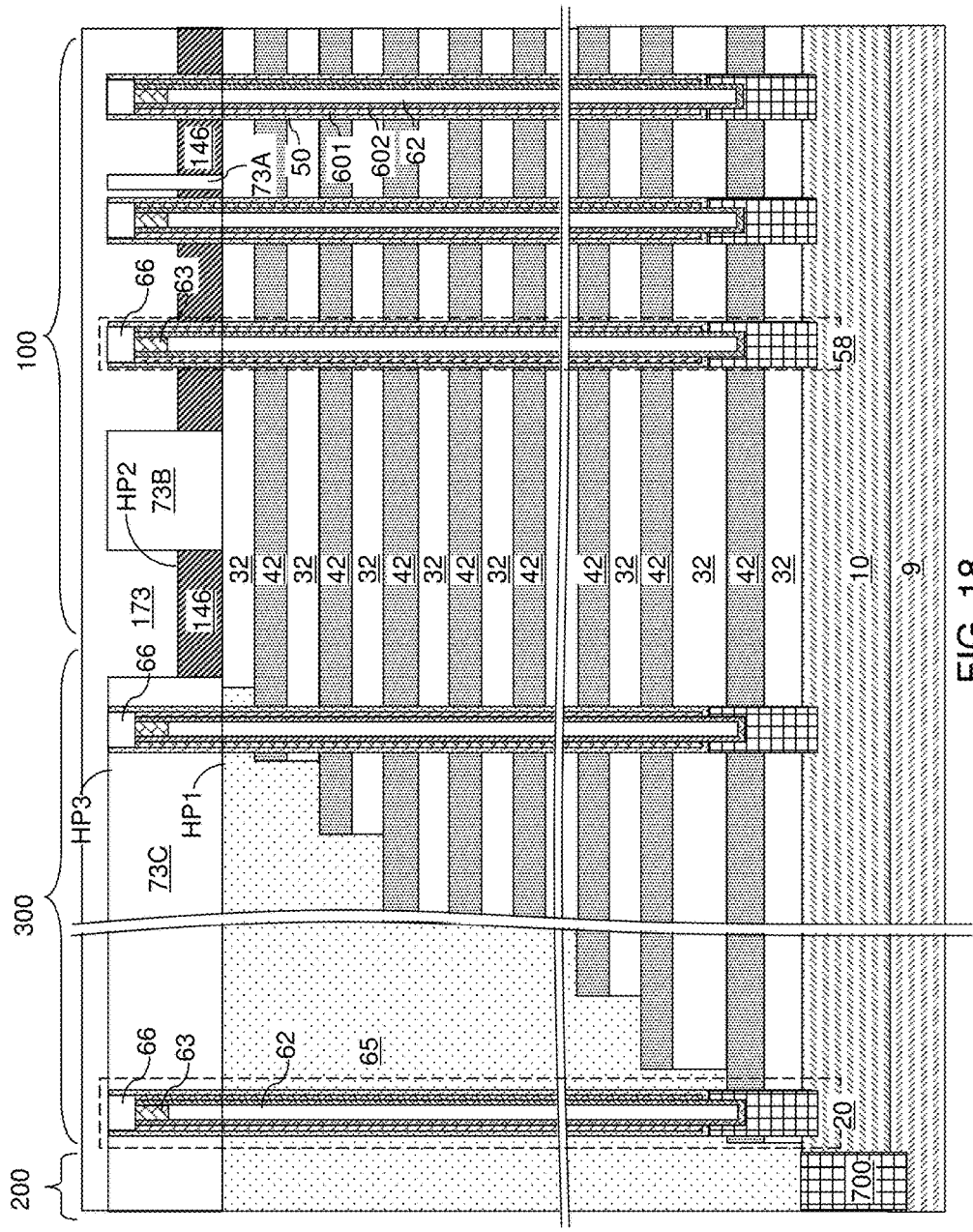
FIG. 18 is a schematic vertical cross-sectional view of the first exemplary structure after formation of a contact level dielectric layer according to an embodiment of the present disclosure.

Referring to FIG. 18, a contact level dielectric layer 173 can be formed over the drain select gate electrodes 146 and the dielectric fill material layer (73A, 73B, 73C). The contact level dielectric layer 173 includes a dielectric material such as silicon oxide, and can be formed with, or can be planarized to provide, a planar top surface. The thickness of the contact level dielectric layer 173 above the top surface of the dielectric fill material layer (73A, 73B, 73C) can be in a range from 50 nm to 600 nm, such as from 100 nm to 300 nm, although lesser and greater thicknesses can also be employed.

Figure 19A:
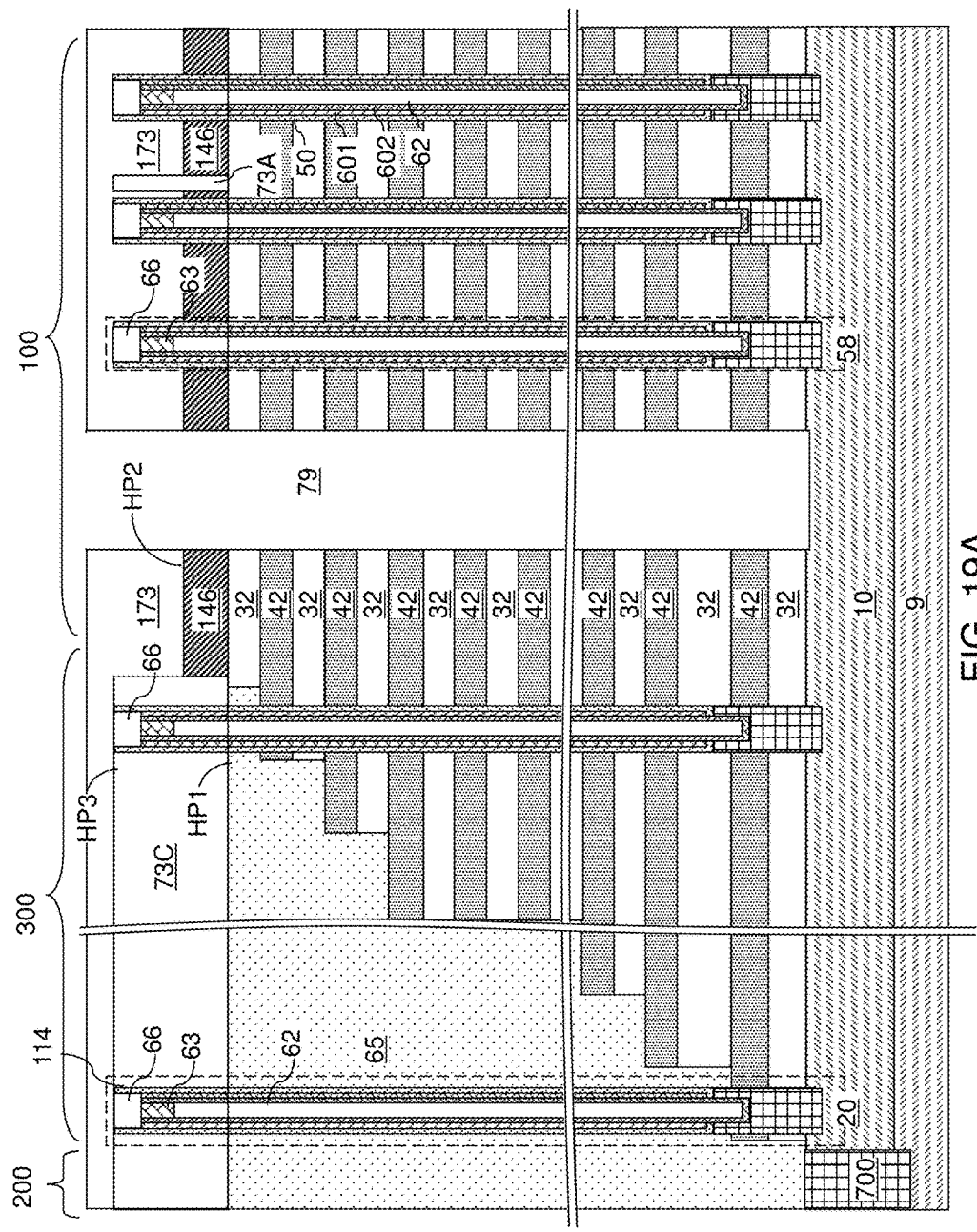
FIG. 19A is a schematic vertical cross-sectional view of the first exemplary structure after formation of a backside trench according to an embodiment of the present disclosure.
Figure 19B:
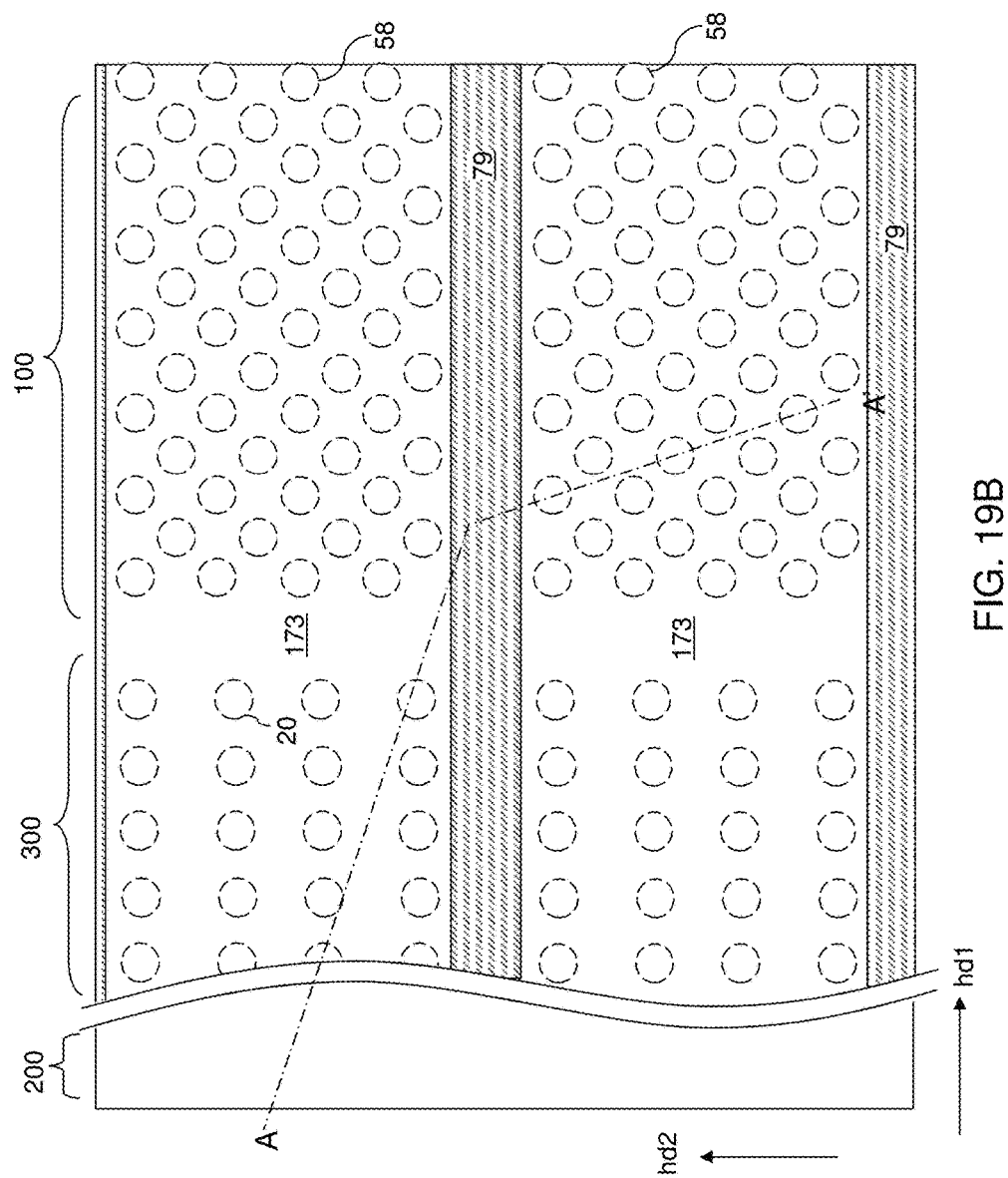
FIG. 19B is a partial see-through top-down view of the first exemplary structure of FIG. 19A. The vertical plane A-A' is the plane of the schematic vertical cross-sectional view of FIG. 19A.

Referring to FIGS. 19A and 19B, a photoresist layer (not shown) can be applied over the contact level dielectric layer 173, and can be lithographically patterned to form openings in areas between groups of memory opening fill structures 58 that are arranged as rows having a uniform inter-row pitch p. The areas of the openings in the photoresist layer can include the areas of the insulating fill material strip portions 73B. The pattern in the photoresist layer can be transferred through the contact level dielectric layer 173, the insulating fill material layer (73A, 73B, 73C), the alternating stack (32, 42) and/or the retro-stepped dielectric material portion 65 employing an anisotropic etch to form backside trenches 79, which vertically extend from the top surface of the contact level dielectric layer 173 at least to the top surface of the substrate (9, 10), and laterally extend through the memory array region 100 and the contact region 300.

In one embodiment, the backside trenches 79 can laterally extend along the first horizontal direction hd1 and can be laterally spaced apart among one another along the second horizontal direction hd2 that is perpendicular to the first horizontal direction. The memory stack structures 55 (included in the memory opening fill structures 58) can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of a backside trench 79 and a drain select level isolation structure 73A, or between a neighboring pair of drain select level isolation structures 73A. In one embodiment, the backside trenches 79 can include a source contact opening in which a source contact via structure can be subsequently formed. The photoresist layer can be removed, for example, by ashing.

Figure 20:
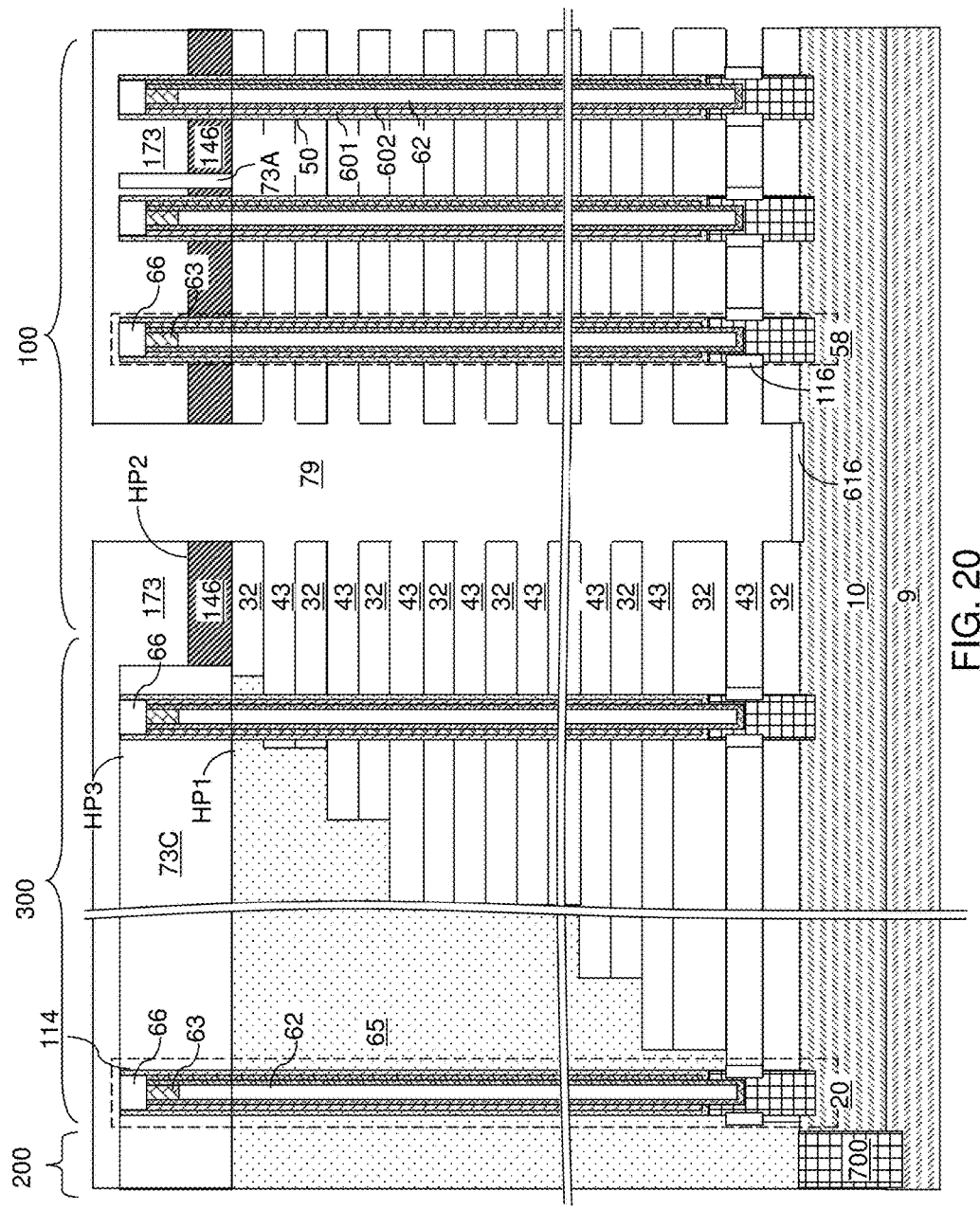
FIG. 20 is a schematic vertical cross-sectional view of the first exemplary structure after formation of backside recesses according to an embodiment of the present disclosure.

Referring to FIGS. 20 and 21A, an etchant that selectively etches the second material of the sacrificial material layers 42 with respect to the first material of the insulating layers 32 can be introduced into the backside trenches 79, for example, employing an etch process. FIG. 21A illustrates a region of the first exemplary structure of FIG. 20. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 21B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 21C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 21D, a metal fill material is deposited in the plurality of backside recesses 43, on the sidewalls of the at least one the backside trench 79, and over the top surface of the contact level dielectric layer 173 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 173. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 173.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 22:
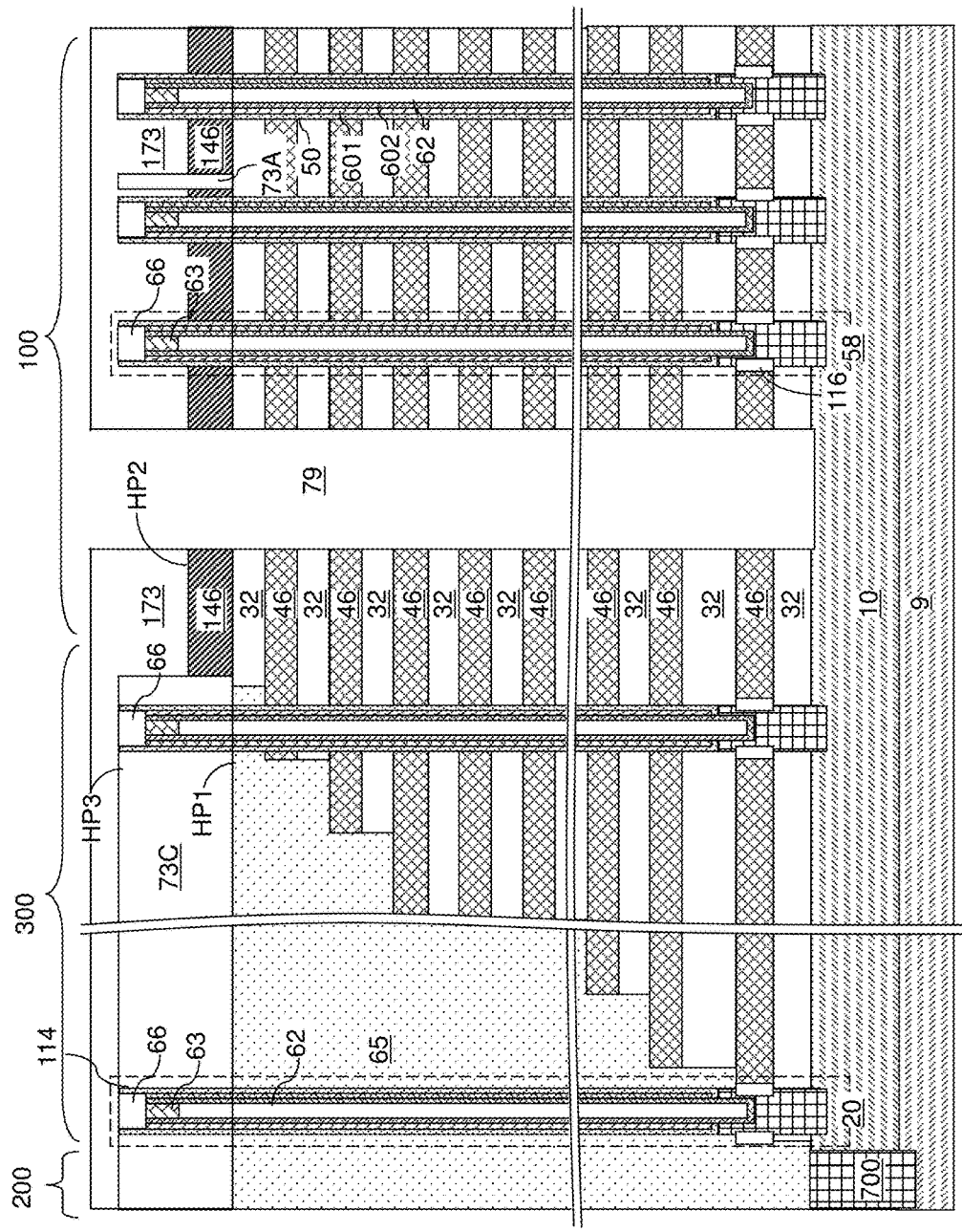
FIG. 22 is a schematic vertical cross-sectional view of the first exemplary structure after removal of a deposited conductive material from within the backside trenches according to an embodiment of the present disclosure.

Referring to FIG. 22, the deposited metallic material of the continuous electrically conductive material layer 46L is etched back from the sidewalls of each backside trench 79 and from above the contact level dielectric layer 173, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 23A:
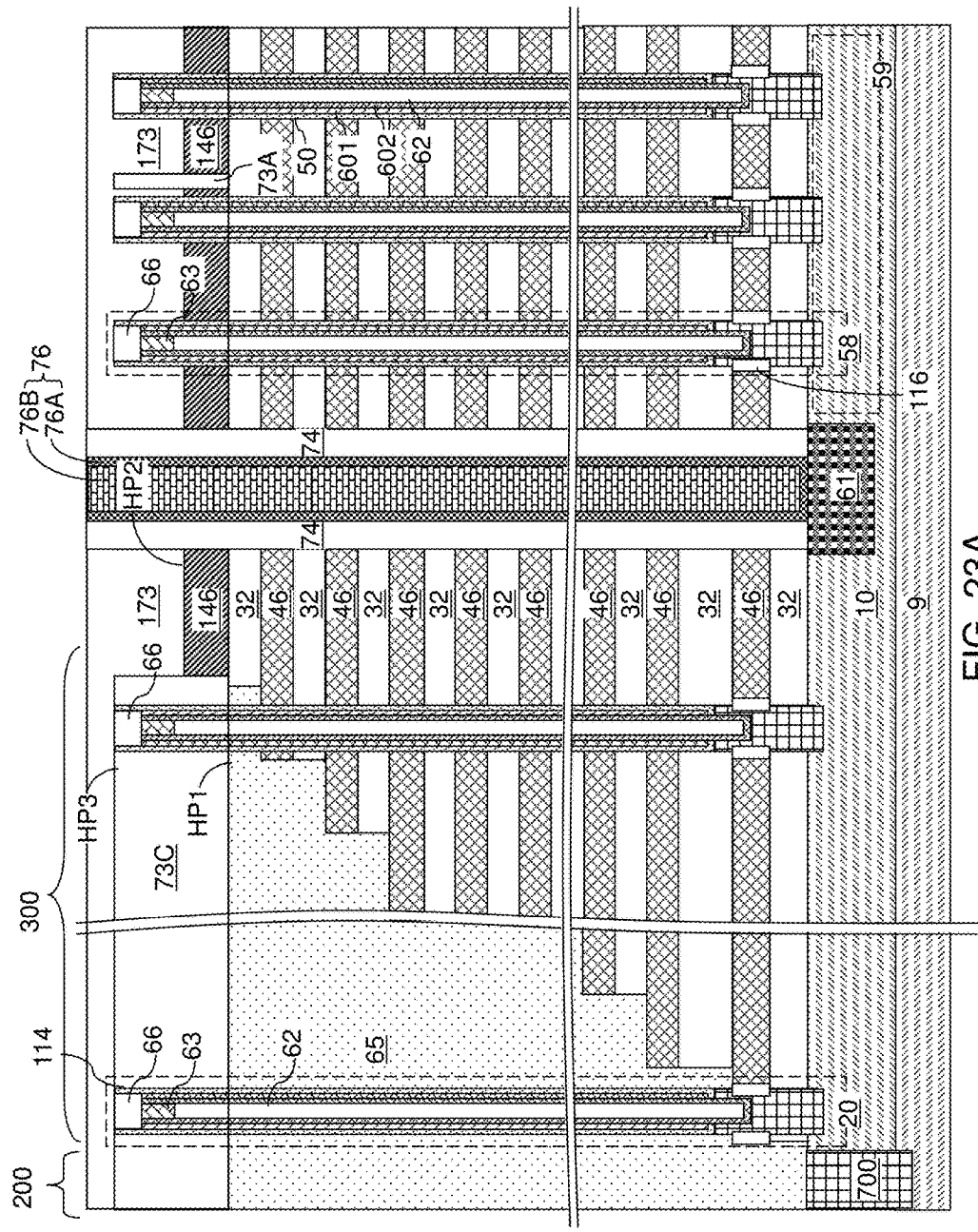
FIG. 23A is a schematic vertical cross-sectional view of the first exemplary structure after formation of an insulating spacer and a backside contact structure according to an embodiment of the present disclosure.
Figure 23B:
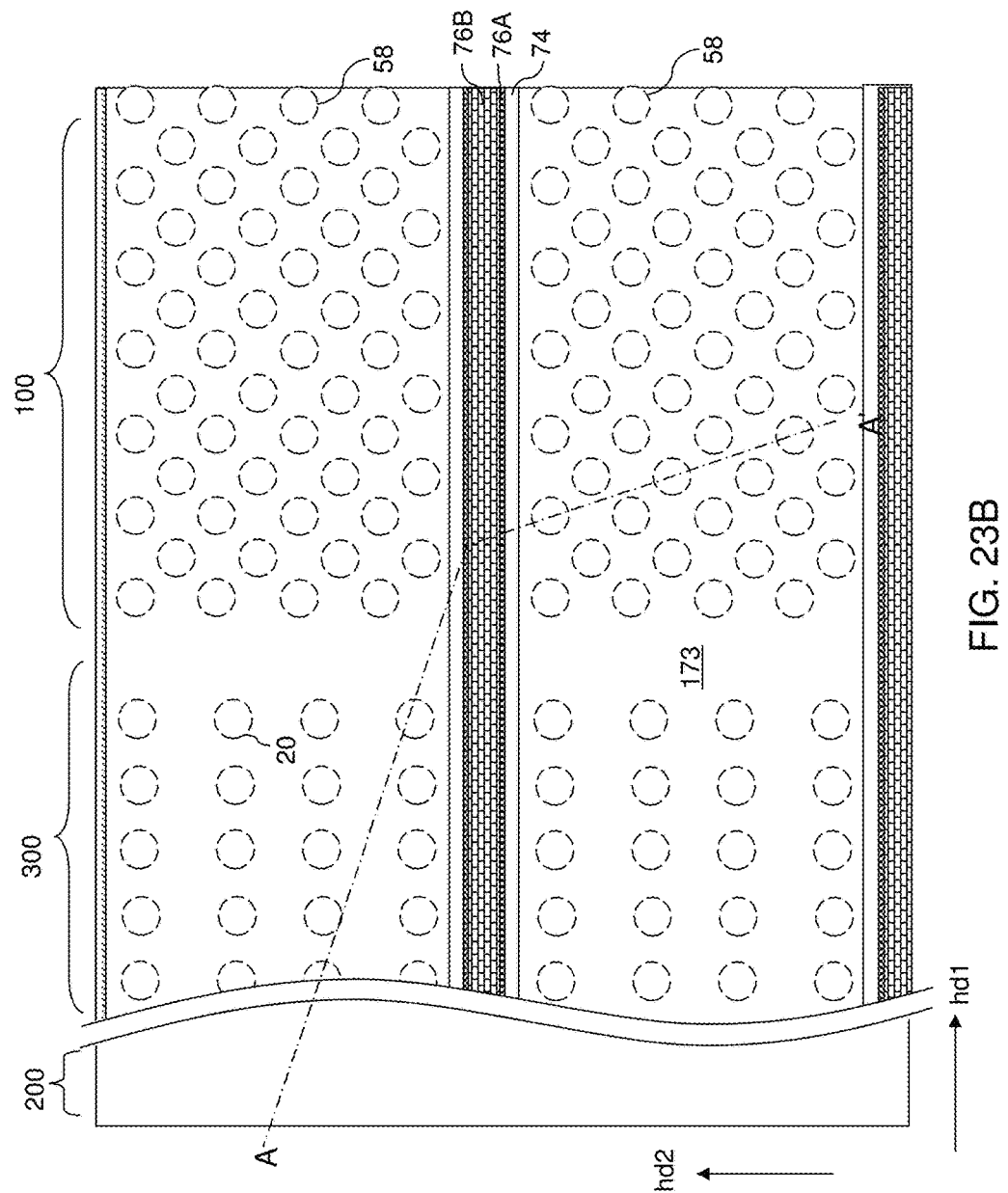
FIG. 23B is a magnified view of a region of the first exemplary structure of FIG. 23A.

Referring to FIGS. 23A and 23B, an insulating material layer can be formed in the at least one backside trench 79 and over the contact level dielectric layer 173 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present in the backside trenches 79, the insulating material layer can be formed directly on surfaces of the backside blocking dielectric layer 44 and directly on the sidewalls of the electrically conductive layers 46. If a backside blocking dielectric layer 44 is not present (by omission or formation or by removal employing an etch process), the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 173 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 173 overlying the alternating stack (32, 46) as a stopping layer. If chemical mechanical planarization (CMP) process is employed, the contact level dielectric layer 173 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 24A:
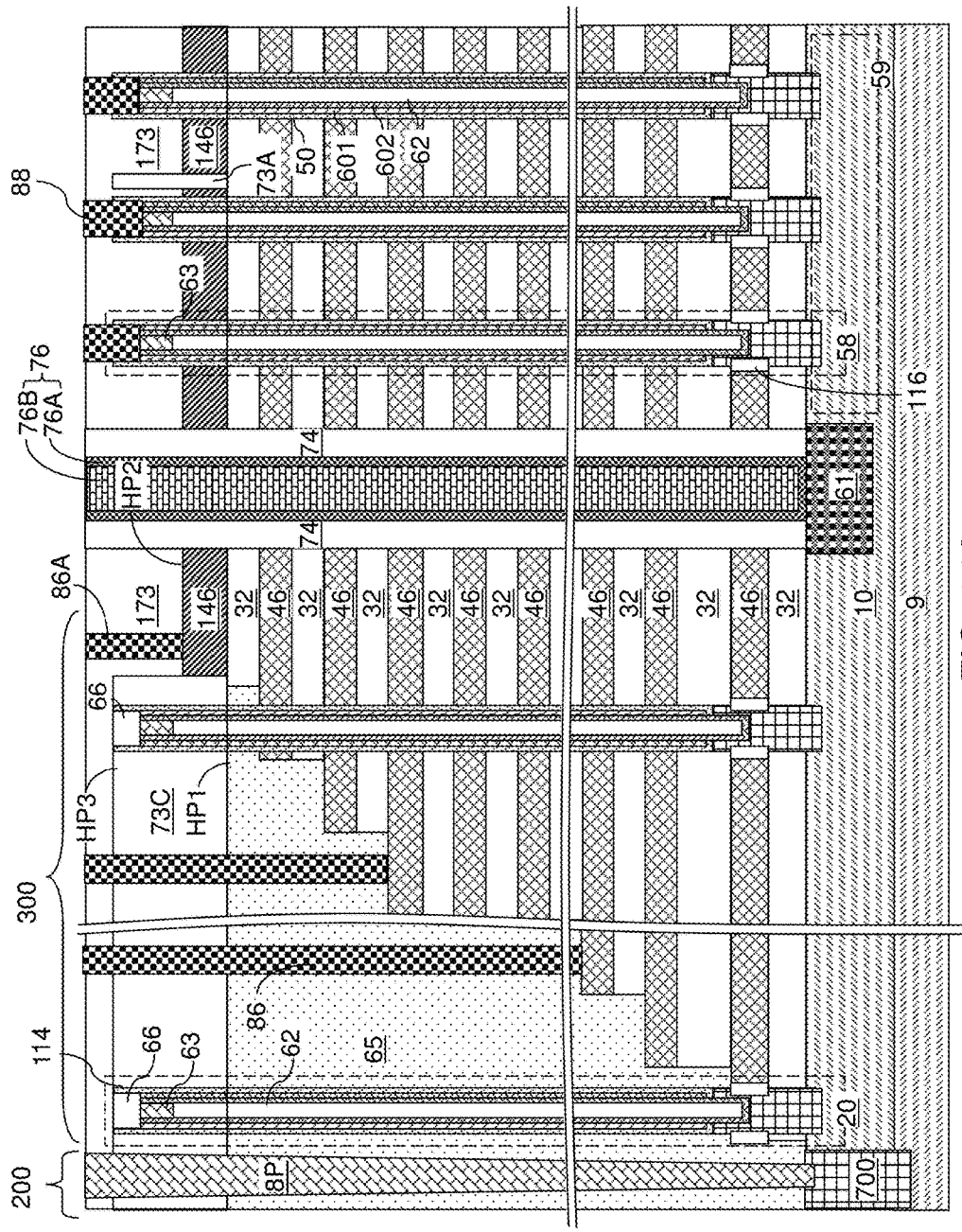
FIG. 24A is a schematic vertical cross-sectional view of the first exemplary structure after formation of additional contact via structures according to an embodiment of the present disclosure.
Figure 24B:
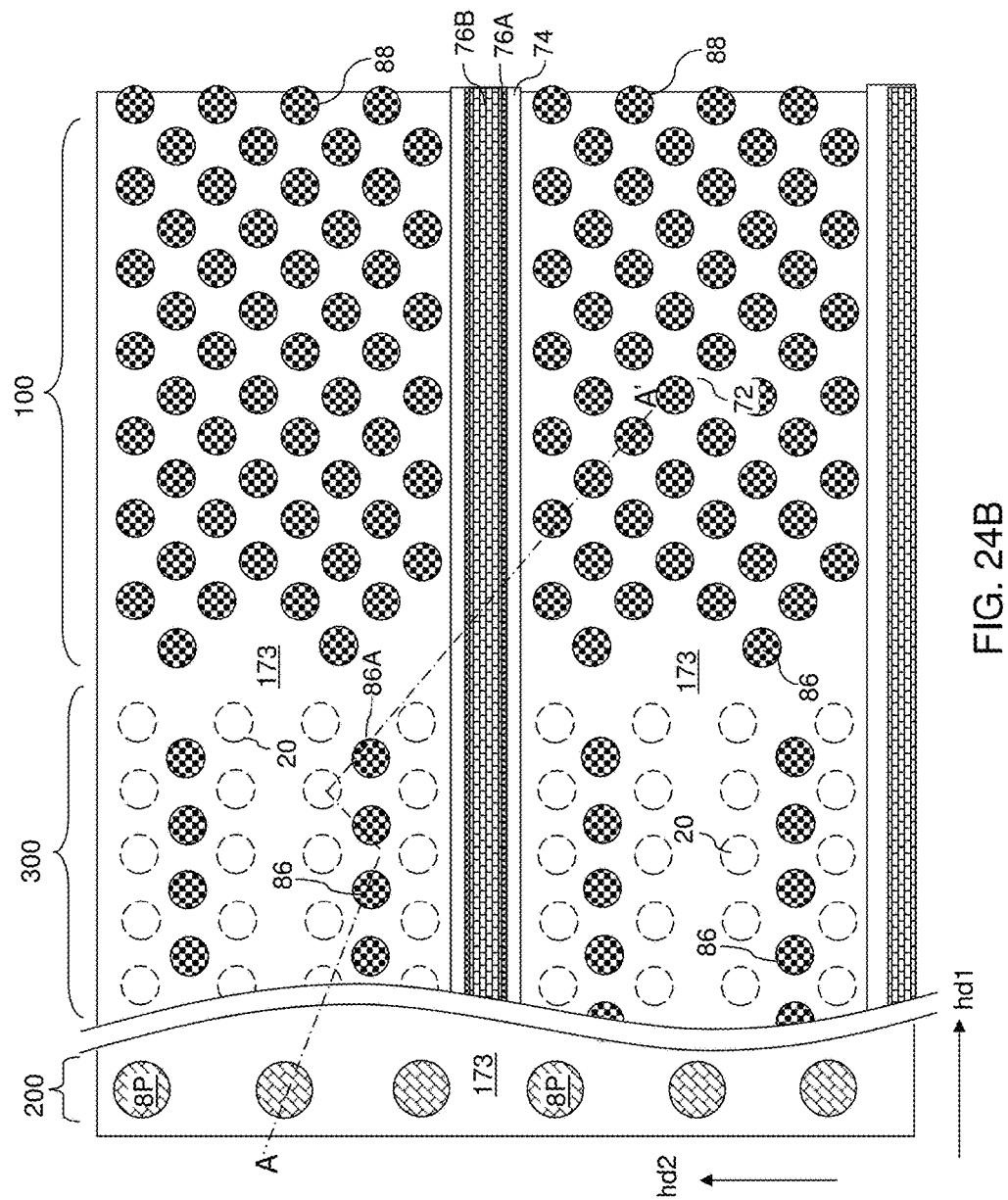
FIG. 24B is a top-down view of the first exemplary structure of FIG. 24A. The vertical plane A-A' is the plane of the schematic vertical cross-sectional view of FIG. 24A.

Referring to FIGS. 24A and 24B, additional contact via structures (88, 86, 86A, 8P) can be formed through the contact level dielectric layer 173, and optionally through the retro-stepped dielectric material portion 65. For example, drain contact via structures 88 can be formed through the contact level dielectric layer 173 on each drain region 63. Word line contact via structures 86 can be formed on the electrically conductive layers 46 through the contact level dielectric layer 173, and through the retro-stepped dielectric material portion 65. Select gate contact via structures 86A (e.g., drain select contact via structures) can be formed on the drain select gate electrodes 146 through the contact level dielectric layer 173. Peripheral device contact via structures 8P can be formed through the retro-stepped dielectric material portion 65 directly on respective nodes of the peripheral devices.

Figure 25:
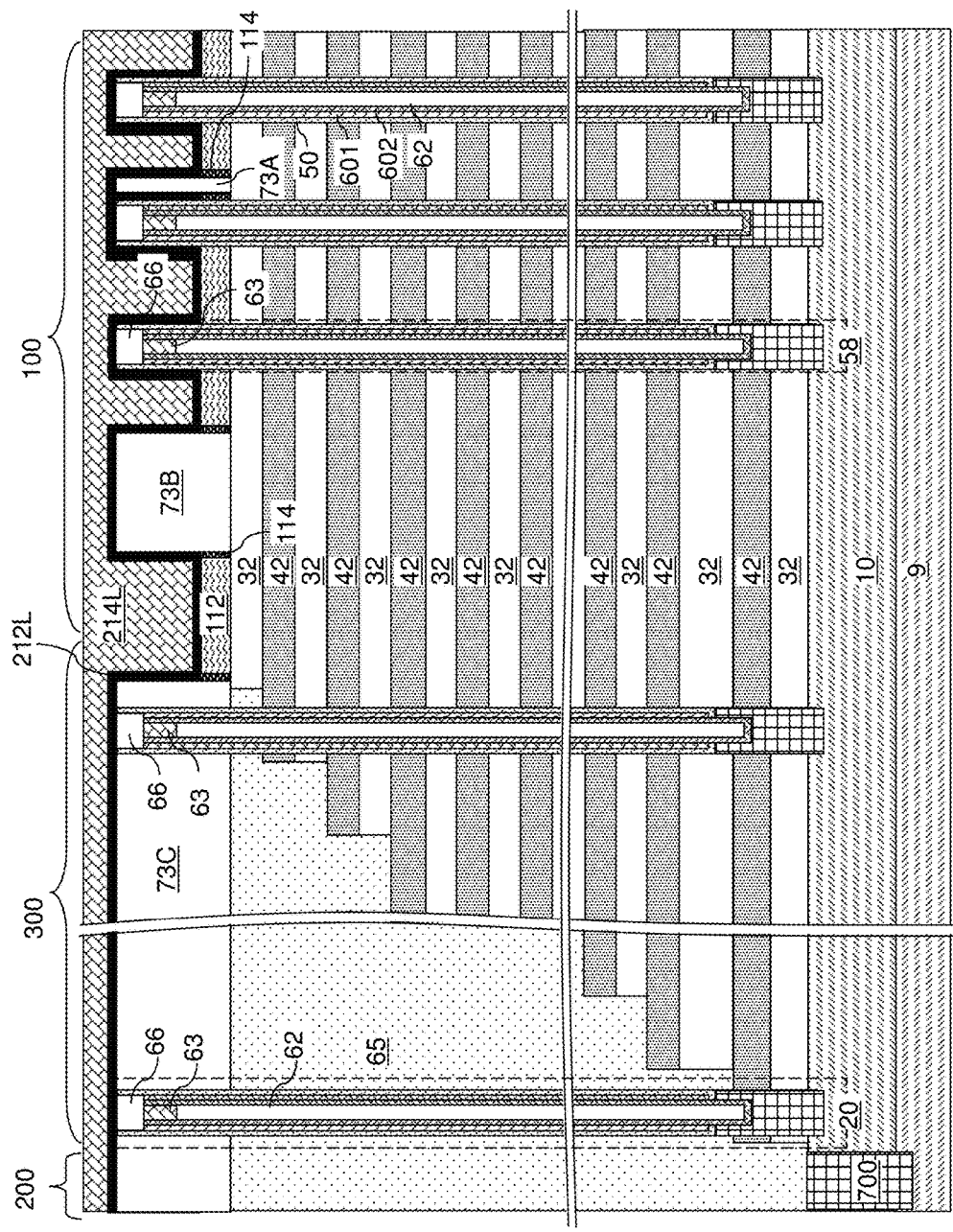
FIG. 25 is a schematic vertical cross-sectional view of a second exemplary structure after deposition of a metallic nitride liner layer and a metal fill material layer according to an embodiment of the present disclosure.

Referring to FIG. 25, a second exemplary structure according to an embodiment of the present disclosure can be derived from the first exemplary structure of FIG. 15 by depositing at least one metallic material that does not form a metal silicide on the recessed portions of the semiconductor matrices 112 and the doped semiconductor liners 114. In one embodiment, the at least one metallic material can include a metallic nitride liner layer 212L and a metal fill material layer 214L.

The metallic nitride liner layer 212L includes an electrically conductive metallic material that can function as a diffusion barrier layer and/or adhesion promotion layer for a metallic fill material to be subsequently deposited. The metallic nitride liner layer 212L can include a conductive metallic nitride material such as TiN, TaN, WN, or a stack thereof, or can include a conductive metallic carbide material such as TiC, TaC, WC, or a stack thereof. The metallic nitride liner layer 212L can be deposited by a non-conformal deposition process such as physical vapor deposition (PVD), or a conformal deposition process such as chemical vapor deposition (CVD) or atomic layer deposition (ALD). The thickness of horizontal portions of the metallic nitride liner layer 212L can be in a range from 2 nm to 8 nm, such as from 3 nm to 6 nm, although lesser and greater thicknesses can also be employed. In one embodiment, the metallic nitride liner layer 212L can consist essentially of a conductive metal nitride such as TiN.

The metal fill material layer 214L can be deposited by a non-conformal deposition process such as physical vapor deposition or a conformal deposition method, which can be, for example, chemical vapor deposition (CVD), atomic layer deposition (ALD), electroless plating, electroplating, or a combination thereof. In one embodiment, the metal fill material layer 214L can consist essentially of at least one elemental metal. The at least one elemental metal of the metal fill material layer 214L can be selected, for example, from copper, tungsten, cobalt, ruthenium, titanium, tantalum, and aluminum. In one embodiment, the metal fill material layer 214L can consist essentially of a single elemental metal. The metal fill material layer 214L is spaced from the semiconductor matrices 112, the doped semiconductor liners 114, and the insulating fill material layer (73A, 73B, 73C) by the metallic nitride liner layer 212L.

Figure 26:
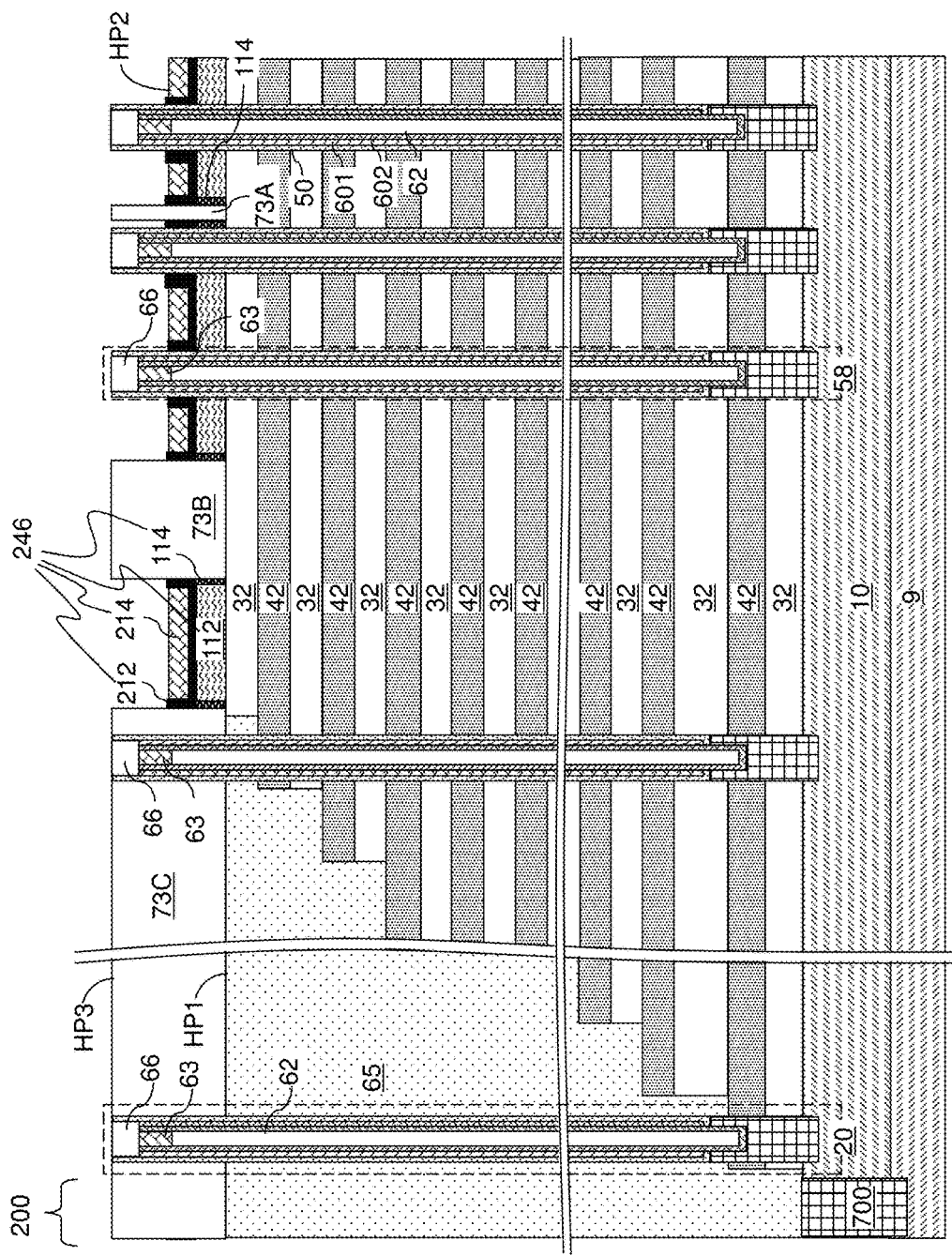
FIG. 26 is a schematic vertical cross-sectional view of the second exemplary structure after formation of metallic select gate electrode portions according to an embodiment of the present disclosure.

Referring to FIG. 26, the at least one metallic material, such as the combination of the metal fill material layer 214L and the metallic nitride liner layer 212L, can be recessed by a recess etch process. An isotropic or anisotropic recess etch process can be employed to recess the at least one metallic material to, or below, a horizontal plane including the top surfaces of the drain regions 63. In one embodiment, the at least one metallic material can be recessed to, or below, a horizontal plane including the bottom surfaces of the drain regions 63.

Each remaining portion of the metal fill material layer 214L constitutes a metal fill electrode portion 214, and each remaining portion of the metallic nitride liner layer 212L constitutes a metallic liner electrode portion 212. Each contiguous set of a metal fill electrode portion 214 and a metallic nitride liner layer 212 constitutes a metallic portion of a drain select gate electrode 246, which is herein referred to a metallic select gate electrode portion (212, 214). Each metallic select gate electrode portion (212, 214) can have the same areas as an underlying contiguous combination of a semiconductor matrix 112 and a doped semiconductor liner 114. Each drain select gate electrode 246 includes a metallic select gate electrode portion (212, 214), a semiconductor matrix 112, and a doped semiconductor liner 114. In one embodiment, the second horizontal plane HP2 including the top surfaces of the drain select gate electrodes 246 can be located at, or below, the bottom surfaces of the drain regions 63.

Thus, the drain select gate electrodes 246 include materials present within remaining portions of the semiconductor matrices 112 and the doped semiconductor liners 114 after the recess etch process at the processing steps of FIG. 15. The planar vertical sidewall portions and concave vertical sidewall portions of each drain select level isolation structure 73A contact vertical sidewalls of the drain select gate electrodes 246. Each of the memory films 50 comprises a lateral stack of a blocking dielectric layer 52, a charge storage layer 54, and a tunneling dielectric layer 56, and the drain select gate electrodes 246 are formed on outer sidewalls of the blocking dielectric layers 52 of the memory films 50. As in the first exemplary structure, concave portions of the drain select gate electrodes 246 contact the convex vertical sidewalls of the memory stack structures 55 (which can be convex vertical sidewalls of the blocking dielectric layers 52).

Figure 27:
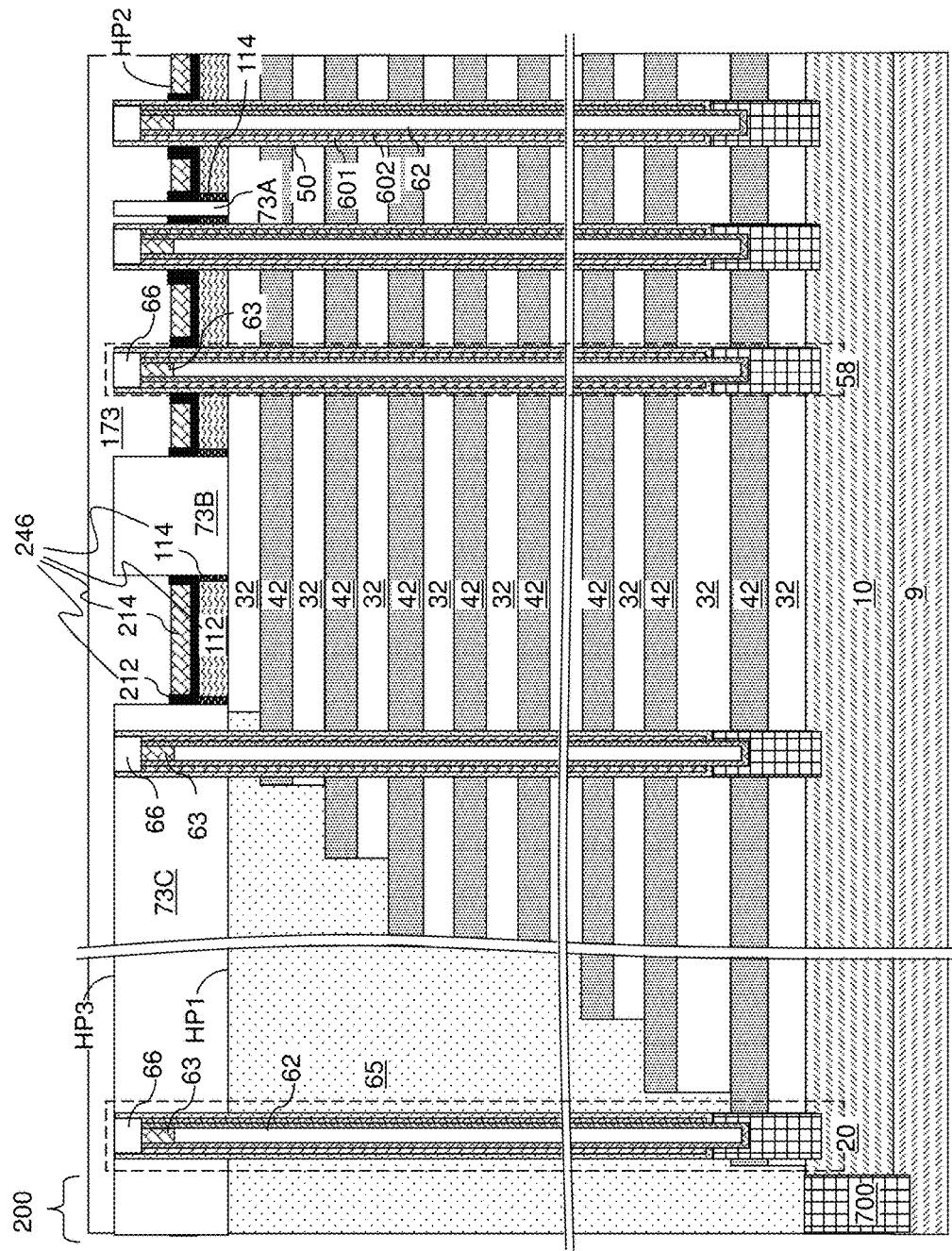
FIG. 27 is a schematic vertical cross-sectional view of the second exemplary structure after formation of a contact level dielectric layer according to an embodiment of the present disclosure.

Referring to FIG. 27, the processing steps of FIG. 18 can be performed to form a contact level dielectric layer 173.

Figure 28:
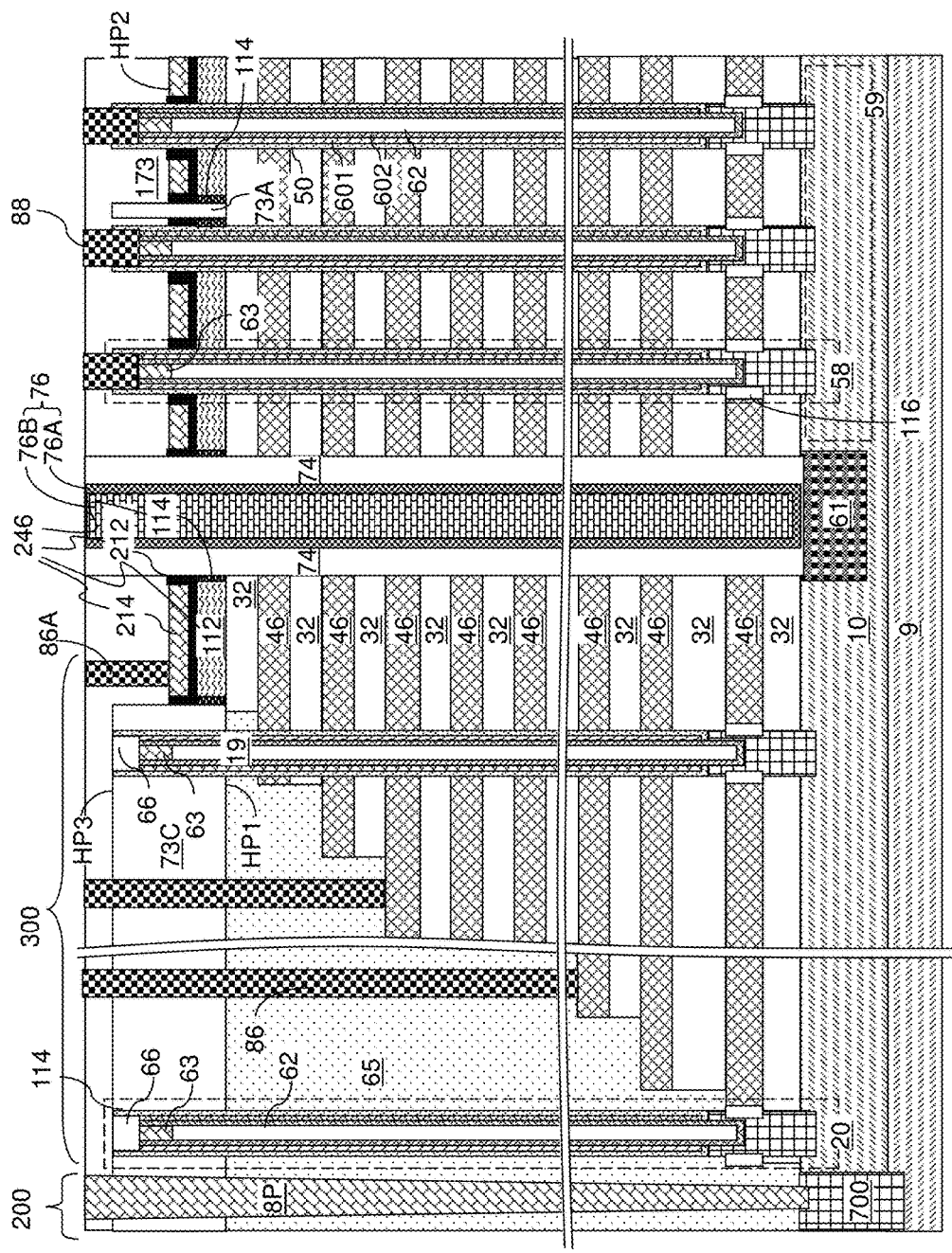
FIG. 28 is a schematic vertical cross-sectional view of the second exemplary structure after formation of additional contact via structures according to an embodiment of the present disclosure.

Referring to FIG. 28, the processing steps of FIGS. 19A and 19B, 20, 21A-21D, 22, 23A and 23B, and 24A and 24B can be performed to form electrically conductive layers 46, insulating spacers 74, source regions 61, backside contact via structures 76, and additional contact via structures (88, 86, 86A, 8P).

Figure 29:
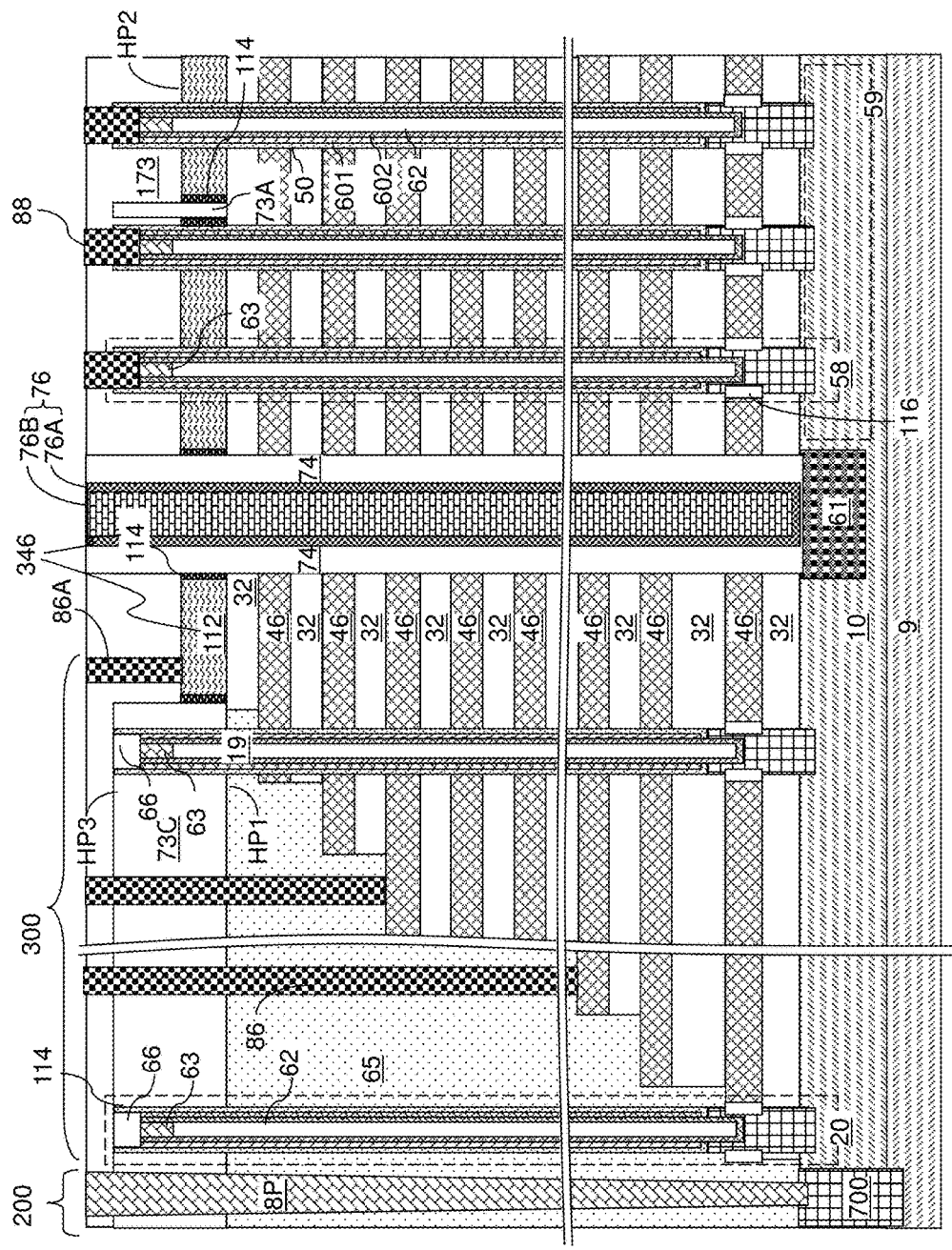
FIG. 29 is a schematic vertical cross-sectional view of a third exemplary structure after formation of additional contact via structures according to an embodiment of the present disclosure.

Referring to FIG. 29, a third exemplary structure according to an embodiment of the present disclosure can be derived from the first exemplary structure of FIG. 15 by omitting the subsequent processing steps of FIGS. 16, 17A, and 17B and performing the processing steps of FIGS. 18, 19A and 19B, 20, 21A-21D, 22, 23A and 23B, and 24A and 24B. In this case, the drain select gate electrodes 346 can consist essentially of materials present within remaining portions of the semiconductor matrices 112 and the doped semiconductor liners 114 after the recess etch process of FIG. 15. The planar vertical sidewall portions and concave vertical sidewall portions of each drain select level isolation structure 73A contact vertical sidewalls of the drain select gate electrodes (112, 114) and memory opening fill structures 58, respectively. Each of the memory films 50 comprises a lateral stack of a blocking dielectric layer 52, a charge storage layer 54, and a tunneling dielectric layer 56, and the drain select gate electrodes 346 are formed on outer sidewalls of the blocking dielectric layers 52 of the memory films 50. As in the first exemplary structure, concave portions of the drain select gate electrodes 346 contact the convex vertical sidewalls of the memory stack structures 55 (which can be convex vertical sidewalls of the blocking dielectric layers 52).

Referring to all of the drawings and according to various embodiments of the present disclosure, a three-dimensional memory device is provided, which comprises: an alternating stack of insulating layers 32 and electrically conductive layers 46 located over a substrate (9, 10); an insulating fill material layer (73A, 73C) and drain select gate electrodes {146, 246, 346} located over the alternating stack (32, 46); and a group of memory stack structures 55 extending through the alternating stack (32, 46) and arranged as rows of memory stack structures 55, wherein each of the memory stack structures 55 comprises a memory film 50 and a vertical semiconductor channel 60 contacting an inner sidewall of the memory film 50. Each drain select gate electrode {146, 246, 346} is laterally surrounded by the insulating fill material layer (73A, 73C). The insulating fill material layer (73A, 73C) includes: a drain select level isolation structure 73A located between neighboring rows of memory stack structures 55 within the group of memory stack structures 55, generally extending along a first horizontal direction hd1, and including a pair of sidewalls containing a respective laterally alternating sequence of planar vertical sidewall portions and concave vertical sidewall portions that contact convex vertical sidewalls of the memory stack structures 55; and a drain select level field portion 73C adjoined to the drain select level isolation portion 73A and contacting sidewalls of the drain select gate electrodes {146, 246, 346} that generally extend along a second horizontal direction hd2 that is perpendicular to the first horizontal direction hd1.

In one embodiment, the insulating fill material layer (73A, 73C) has a homogeneous dielectric composition throughout. In one embodiment, the group of memory stack structures 55 is arranged as multiple rows of memory stack structures 55 such that the rows are spaced apart along the second horizontal direction hd2 with a uniform inter-row pitch p for an entirety of the group of memory stack structures 55.

In one embodiment, bottom surfaces of the drain select gate electrodes {146, 246, 346} and a bottom surface of the insulating fill material layer (73A, 73C) are located within a first horizontal plane HP1, top surfaces of the drain select gate electrodes {146, 246, 346} are located within a second horizontal plane HP2 overlying the first horizontal plane HP1, and a top surface of the insulating fill material layer (73A, 73C) are located within a third horizontal plane HP3 overlying the second horizontal plane HP2.

In one embodiment, the select gate electrodes 146 comprise a metal silicide material; each of the memory films 50 comprises a lateral stack of a blocking dielectric layer 52, a charge storage layer 54, and a tunneling dielectric layer 56; and the metal silicide material contacts an outer sidewall of each blocking dielectric layer 52. In one embodiment, the metal silicide material comprises metal atoms, silicon atoms, and electrical dopant atoms selected from p-type dopant atoms and n-type dopant atoms, and an atomic concentration of the electrical dopant atoms is in a range from 0.05% to 2% within the metal silicide material.

In one embodiment, each of the select gate electrodes 246 comprise a vertical stack of a semiconductor material select gate electrode portion (112, 114) and a metallic select gate electrode portion (212, 214); each of the memory films 50 comprises a lateral stack of a blocking dielectric layer 52, a charge storage layer 54, and a tunneling dielectric layer 56; and an outer sidewall of each blocking dielectric layer 52 contacts a respective one of the semiconductor material select gate electrode portions (112, 114) and a respective one of the metallic select gate electrode portions (212, 214). Each metallic select gate electrode portion (212, 214) can comprise: a metallic liner 212 comprising a conductive metallic nitride material and contact an underlying semiconductor material select gate electrode portion (112, 114); and a metal fill material portion 214 consisting essentially of at least one elemental metal and overlying, and laterally enclosed by, the metallic liner 212.

In one embodiment, each of the select gate electrodes {246, 346} comprises a semiconductor material select gate electrode portion containing a doped semiconductor matrix 112 and a doped semiconductor liner 114; and the doped semiconductor matrix 112 and the doped semiconductor liner 114 have a doping of a same conductivity type.

In one embodiment, each memory stack structure 55 that is laterally spaced from the drain select level isolation structure 73A by a distance less than the uniform inter-row pitch p, contacts the doped semiconductor liner 114; and each memory stack structure 55 that is laterally spaced from the drain select level isolation structure 73A by a distance greater than the uniform inter-row pitch p, does not contact the doped semiconductor liner 114.

In one embodiment, the drain select level isolation structure 73A contacts the doped semiconductor liner 114 and does not contact the doped semiconductor matrix 112; and the insulating fill material layer (73A, 73C) is laterally spaced from a combination of the memory stack structures 55 and the doped semiconductor matrix 112 by the doped semiconductor liner 114.

Each of the exemplary structures can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
an insulating fill material layer and drain select gate electrodes located over the alternating stack; and
a group of memory stack structures extending through the alternating stack and arranged as rows of memory stack structures, wherein each of the memory stack structures comprises a memory film and a vertical semiconductor channel contacting an inner sidewall of the memory film,
wherein each drain select gate electrode is laterally surrounded by the insulating fill material layer; and
wherein the insulating fill material layer comprises:
a drain select level isolation structure located between neighboring rows of memory stack structures within the group of memory stack structures, extending along a first horizontal direction, and including a pair of sidewalls containing a respective laterally alternating sequence of planar vertical sidewall portions and concave vertical sidewall portions that contact convex vertical sidewalls of the memory stack structures; and
a drain select level field dielectric portion adjoined to the drain select level isolation portion and contacting sidewalls of the drain select gate electrodes that extend along a second horizontal direction that is perpendicular to the first horizontal direction; wherein:
the insulating fill material layer has a homogeneous dielectric composition throughout;
the group of memory stack structures is arranged as multiple rows of memory stack structures such that the rows are spaced apart along the second horizontal direction with a uniform inter-row pitch for an entirety of the group of memory stack structures;
each of the select gate electrodes comprises a semiconductor material select gate electrode portion containing a doped semiconductor matrix and a doped semiconductor liner; and
the doped semiconductor matrix and the doped semiconductor liner have a doping of a same conductivity type.

2. The three-dimensional memory device of claim 1, wherein bottom surfaces of the drain select gate electrodes and a bottom surface of the insulating fill material layer are located within a first horizontal plane, top surfaces of the drain select gate electrodes are located within a second horizontal plane overlying the first horizontal plane, and a top surface of the insulating fill material layer are located within a third horizontal plane overlying the second horizontal plane.

3. The three-dimensional memory device of claim 1, wherein:
the select gate electrodes comprise a metal silicide material;
each of the memory films comprises a lateral stack of a blocking dielectric layer, a charge storage layer, and a tunneling dielectric layer; and
the metal silicide material contacts an outer sidewall of each blocking dielectric layer.

4. The three-dimensional memory device of claim 3, wherein the metal silicide material comprises metal atoms, silicon atoms, and electrical dopant atoms selected from p-type dopant atoms and n-type dopant atoms, and an atomic concentration of the electrical dopant atoms is in a range from 0.05% to 2% within the metal silicide material.

5. The three-dimensional memory device of claim 1, wherein:
each of the select gate electrodes comprise a vertical stack of a semiconductor material select gate electrode portion and a metallic select gate electrode portion;
each of the memory films comprises a lateral stack of a blocking dielectric layer, a charge storage layer, and a tunneling dielectric layer; and
an outer sidewall of each blocking dielectric layer contacts a respective one of the semiconductor material select gate electrode portions and a respective one of the metallic select gate electrode portions.

6. The three-dimensional memory device of claim 5, wherein each metallic select gate electrode portion comprises:
a metallic liner comprising a conductive metallic nitride material and contact an underlying semiconductor material select gate electrode portion; and
a metal fill material portion consisting essentially of at least one elemental metal and overlying, and laterally enclosed by, the metallic liner.

7. The three-dimensional memory device of claim 1, wherein:
each memory stack structure that is laterally spaced from the drain select level isolation structure by a distance less than the uniform inter-row pitch, contacts the doped semiconductor liner; and
each memory stack structure that is laterally spaced from the drain select level isolation structure by a distance greater than the uniform inter-row pitch, does not contact the doped semiconductor liner.

8. The three-dimensional memory device of claim 1, wherein:
the drain select level isolation structure contacts the doped semiconductor liner and does not contact the doped semiconductor matrix; and
the insulating fill material layer is laterally spaced from a combination of the memory stack structures and the doped semiconductor matrix by the doped semiconductor liner.

9. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *